(12) United States Patent
Kodama et al.

(10) Patent No.: US 6,492,091 B2
(45) Date of Patent: Dec. 10, 2002

(54) POSITIVE PHOTOSENSITIVE COMPOSITION

(75) Inventors: Kunihiko Kodama, Shizuoka (JP); Toshiaki Aoai, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/921,691

(22) Filed: Aug. 6, 2001

(65) Prior Publication Data
US 2002/0051933 A1 May 2, 2002

(30) Foreign Application Priority Data
Aug. 8, 2000 (JP) ........................................ 2000-240059

(51) Int. Cl.⁷ ............................................. G03C 1/492
(52) U.S. Cl. .................... 430/270.1; 430/910; 430/914; 430/921
(58) Field of Search ............................. 430/270.1, 910, 430/921, 914

(56) References Cited

U.S. PATENT DOCUMENTS

| | | |
|---|---|---|
| 5,738,972 A | 4/1998 | Padmanaban et al. |
| 5,786,131 A | 7/1998 | Allen et al. |
| 5,866,299 A | 2/1999 | Szmanda et al. |
| 6,136,500 A * | 10/2000 | Kobayashi et al. ...... 430/270.1 |
| 6,280,900 B1 | 8/2001 | Chiba et al. |
| 2001/0033993 A1 | 10/2001 | Kanna et al. |

FOREIGN PATENT DOCUMENTS

| | | | |
|---|---|---|---|
| EP | 0 735 422 A1 | 10/1996 | |
| EP | 0 756 203 A1 | 1/1997 | |
| EP | 0 898 201 A1 | 2/1999 | |
| EP | 0 989 459 A1 | 3/2000 | |
| EP | 0 989 460 A1 | 3/2000 | |
| EP | 1 033 624 A1 | 9/2000 | |
| EP | 1 111 465 A1 | 6/2001 | |
| JP | 9-43837 | 2/1997 | ............ G03F/7/004 |
| JP | 11-125907 | 5/1999 | ............ G03F/7/039 |

OTHER PUBLICATIONS

European Search Report dated Nov. 20, 2001.

* cited by examiner

*Primary Examiner*—Rosemary Ashton
(74) *Attorney, Agent, or Firm*—Sughrue Mion, PLLC

(57) ABSTRACT

A positive photosensitive composition comprises: (A) a compound generating an acid upon irradiation with one of an actinic ray and radiation; (B) a resin containing a monocyclic or polycyclic alicyclic hydrocarbon structure and increasing the solubility to an alkali developer by the action of an acid; and (C) an onium salt of carboxylic acid.

20 Claims, No Drawings

POSITIVE PHOTOSENSITIVE COMPOSITION

FIELD OF THE INVENTION

The present invention relates to a positive photosensitive composition for use in the production process of a semiconductor such as IC, in the production of a circuit board such as liquid crystal and thermal head, and in other photofabrication processes.

BACKGROUND OF THE INVENTION

When a conventional resist comprising a novolak resin and a naphthoquinonediazide compound is used for the pattern formation by photolithography with a deep ultraviolet ray or excimer laser beam, the novolak resin and naphthoquinonediazide compound exhibit strong absorption in the deep ultraviolet region and the light scarcely reaches the bottom of resist, as a result, the resist has low sensitivity and only a tapered pattern can be obtained.

One of the techniques for solving this problem is the use of chemical amplification-type resist composition described in U.S. Pat. No. 4,491,628 and European Patent 249,139. The chemical amplification-type positive resist composition is a pattern formation material: an acid is generated in an area irradiated with radiation such as a deep ultraviolet ray and owing to a reaction using the acid as a catalyst, solubility in a developing solution is differentiated between the area irradiated with the radiation and the non-irradiated area, thereby forming a pattern on a substrate.

Examples of the chemical amplification-type resist composition include combinations of a compound capable of generating an acid by photolysis with an acetal or O,N-acetal compound (as described in JP-A-48-89003 (the term "JP-A" as used herein means an"unexamined published Japanese patent application"), with an ortho ester or amide acetal compound (as described in JP-A-51-120714), with a polymer having an acetal or ketal group on the main chain thereof (as described in JP-A-53-133429), with an enol ether compound (as described in JP-A-55-12995), with an N-acyliminocarbonic acid compound (as described in JP-A-55-126236), with a polymer having an ortho ester group on the main chain (as described in JP-A-56-17345), with a tertiary alkyl ester compound (as described in JP-A-60-3625), with a silyl ester compound (as described in JP-A-60-10247) or with a silyl ether compound (as described in JP-A-60-37549 and JP-A-60-121446). These combinations in principle have a quantum yield exceeding 1 and therefore exhibit high photosensitivity.

A system which decomposes by heating in the presence of an acid and becomes alkali-soluble is also known and examples thereof include combinations of a compound capable of generating an acid upon exposure with an ester having a tertiary or secondary carbon atom (e.g., tert-butyl or 2-cyclohexenyl) or carbonic acid ester compound as described, for example, in JP-A-59-45439, JP-A-60-3625, JP-A-62-229242, JP-A-63-27829, JP-A-63-36240, JP-A-63-250642, JP-A-5-181279, *Polym. Eng. Sce.*, Vol. 23, page 1012 (1983), *ACS. Sym.*, Vol. 242, page 11 (1984), *Semiconductor World*, November, 1987, page 91, *Macromolecules*, Vol. 21, page 1475 (1988), and *SPIE*, Vol. 920, page 42 (1988), with an acetal compound as described, for example, in JP-A-4-219757, JP-A-5-249682 and JP-A-6-65332, or with a tert-butyl ether compound as described, for example, in JP-A-4-211258 and JP-A-6-65333.

Such systems use as the main component a resin having a basic skeleton of poly(hydroxystyrene) which has a small absorption in the region of wave length: 248 nm. When a KrF excimer laser is employed as a light source for exposure, they exhibit high sensitivity and high resolution and are capable of forming a good pattern. Thus, they are good systems as compared with conventional naphthoquinonediazide/novolak resin systems.

However, when the light source has a still shorter wavelength, for example, when the light source for exposure used is an ArF excimer laser (193 nm), the above-described chemical amplification type resist systems are yet deficient because the compound having an aromatic group substantially has a large absorption in the region of wave length: 193 nm. As a polymer having a small absorption in the 193 nm region, the use of poly(meth)acrylate is described in *J. Vac. Sci. Technol.*, B9, 3357 (1991). However, this polymer has a problem in that the resistance against dry etching which is commonly performed in the production process of semiconductors is low as compared with conventional phenol resins having aromatic groups.

In *Proc. of SPIE*, 1672, 66 (1922), it is reported that polymers having alicyclic hydrocarbon groups exhibit the dry etching resistance on the same level as that of the compounds having aromatic groups and at the same time, have small absorption in the 193 nm region. The use of these polymers has been aggressively investigated in recent years. Specific examples of such polymers include the polymers described, for example, in JP-A-4-39665, JP-A-5-80515, JP-A-5-265212, JP-A-5-297591, JP-A-5-346668, JP-A-6-289615, JP-A-6-324494, JP-A-7-49568, JP-A-7-185046, JP-A-7-191463, JP-A-7-199467, JP-A-7-234511 and JP-A-7-252324.

Further, the use of a photo-acid generator together with a base which is decomposable to a neutral compound upon irradiation of radiation is described in JP-A-9-43837. Also, the use of a compound having a boiling point of not less than 150° C. which generates a carboxylic acid together with a compound which generates an acid other than a carboxylic acid is described in JP-A-11-125907.

However, these techniques still have a problem to be dissolved in p itch dependency. Since various patterns are included in devices according to recent tendency, various characteristics are demanded for resists. One of such characteristics is the pitch dependency. In a device there are a portion wherein lines are closely present, a portion of a pattern having a broader space compared with line and a portion of an isolated line. Therefore, to resolve various line patterns with good reproducibility is important. However, it is not necessarily easy to well reproduce various lines due to optical factors and a method for resolving such a problem by selecting a resist is uncertain at present.

Moreover, further improvement is strongly desired as to exposure margin. The exposure margin used herein means a phenomenon of changing linewidth of pattern obtained as the change of exposure amount.

SUMMARY OF THE INVENTION

Therefore, an object of the present invention is to solve the above-described problems of technique for improving essential performance of microphotofabrication using a deep ultraviolet ray, particularly an ArF excimer laser beam.

Another object of the present invention is to provide a positive photosensitive composition which is excellent in the pitch dependency and exposure margin.

Other objects of the present invention will become apparent from the following description.

The objects of the present invention are accomplished by the following positive photosensitive compositions.

(1) A positive photosensitive composition comprising:
(A) a compound generating an acid upon irradiation with one of an actinic ray and radiation;
(B) a resin containing a monocyclic or polycyclic alicyclic hydrocarbon structure and increasing the solubility to an alkali developer by the action of an acid; and
(C) an onium salt of carboxylic acid.

(2) The positive photosensitive composition as described in the item (1), which further comprises (D) a dissolution-inhibiting compound: having a molecular weight of 3,000 or less; having a group capable of being decomposed by an acid; and increasing the solubility to an alkali developer by the action of an acid.

(3) The positive photosensitive composition as described in the item (1), wherein the resin (B) further contains a lactone structure.

(4) The positive photosensitive composition as described in the item (1), wherein the resin (B) further contains a repeating unit represented by formula (IV'):

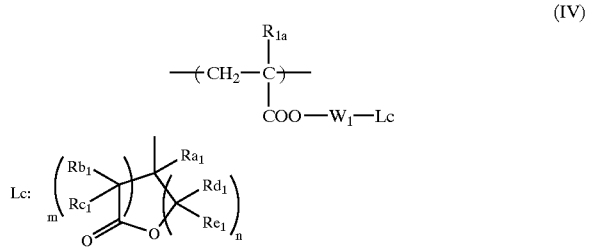

(IV)

wherein $R_{1a}$ represents a hydrogen atom or a methyl group; $W_1$ represents a single bond, an alkylene group, an ether group, a thioether group, a carbonyl group, an ester group or a combination thereof; $R_{a1}$, $R_{b1}$, $R_{c1}$, $R_{d1}$ and $R_{e1}$, which are the same or different, each represents a hydrogen atom or an alkyl group having from 1 to 4 carbon atoms; and m and n, which are the same or different, each represents an integer of from 0 to 3, provided that the sum total of m and n is from 2 to 6.

(5) The positive photosensitive composition as described in the item (1), wherein the resin (B) further contains a repeating unit having a group represented by one of formulae (V-1) to (V-4):

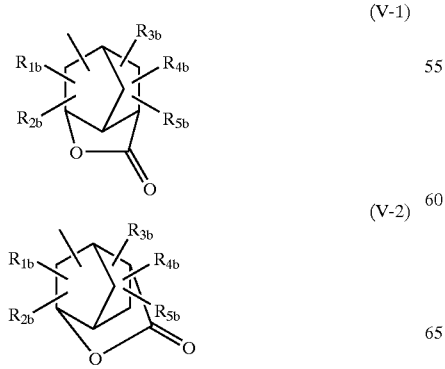

(V-1)

(V-2)

(V-3)

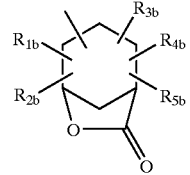

(V-4)

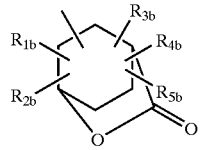

wherein $R_{1b}$ to $R_{5b}$ each independently represents a hydrogen atom, an alkyl group which may have a substituent, a cycloalkyl group which may have a substituent or an alkenyl group which may have a substituent, and two of $R_{1b}$ to $R_{5b}$ may be combined with each other to form a ring.

(6) The positive photosensitive composition as described in the item (5), wherein the resin (B) contains the repeating unit having a group represented by one of formulae (V-1) to (V-4) in an amount of from 10 to 70 mol % based on the whole repeating units.

(7) The positive photosensitive composition as described in the item (5), wherein the resin (B) contains the repeating unit having a group represented by one of formulae (V-1) to (V-4) in an amount of from 30 to 60 mol % based on the whole repeating units.

(8) The positive photosensitive composition as described in the item (1), wherein the resin (B) further contains a repeating unit having a group represented by formula (VII):

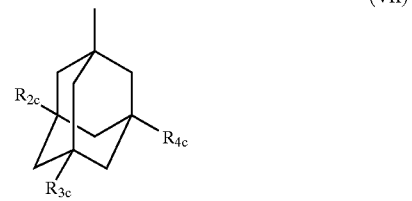

(VII)

wherein $R_{2c}$ to $R_{4c}$ each independently represents a hydrogen atom or a hydroxy group, and at least one of $R_{2c}$ to $R_{4c}$ represents a hydroxy group.

(9) The positive photosensitive composition as described in the item (8), wherein the resin (B) contains the repeating unit having a group represented by formula (VII) in an amount of from 5 to 35 mol % based on the whole repeating units.

(10) The positive photosensitive composition as described in the item (8), wherein the resin (B) contains the repeating unit having a group represented by formula (VII) in an amount of from 5 to 30 mol % based on the whole repeating units.

(11) The positive photosensitive composition as described in the item (1), wherein the onium salt of carboxylic acid (C) is at least one of a sulfonium salt of carboxylic acid and an iodonium salt of carboxylic acid.

(12) The positive photosensitive composition as described in the item (1), wherein a carboxylate residue of the onium salt of carboxylic acid (C) contains neither an aromatic group nor a C=C double bond.

(13) The positive photosensitive composition as described in the item (1), wherein a carboxylate residue of the onium salt of carboxylic acid (C) is a straight-chain, branched or cyclic alkylcarboxylic acid anion which is substituted by at least one fluorine atom.

(14) The positive photosensitive composition as described in the item (1), which is for exposure using a deep ultraviolet ray having a wavelength of 220 nm or less.

(15) The positive photosensitive composition as described in the item (1), which further comprises (F) a nitrogen-containing basic compound.

(16) The positive photosensitive composition as described in the item (1), which further comprises (G) a surfactant containing at least one of a fluorine atom and silicon atom.

(17) The positive photosensitive composition as described as the item (1), which comprises the onium salt of carboxylic acid (C) in amount of from 0.1 to 20% by weight based on the solid content of the composition.

(18) A positive photosensitive composition comprising:
(A) a compound generating an acid upon irradiation with one of an actinic ray and radiation;
(C) an onium salt of carboxylic acid;
(D) a dissolution-inhibiting compound: having a molecular weight of 3,000 or less; having a group capable of being decomposed by an acid; and increasing the solubility to an alkali developer by the action of an acid; and
(E) a resin being insoluble in water but soluble in an alkali developer and containing a monocyclic or polycyclic alicyclic hydrocarbon structure.

(19) The positive photosensitive composition as described in the item (18), wherein the onium salt of carboxylic acid (C) is at least one of a sulfonium salt of carboxylic acid and an iodonium salt of carboxylic acid.

(20) The positive photosensitive composition as described in the item (18), wherein a carboxylate residue of the onium salt of carboxylic acid (C) contains neither an aromatic group nor a C=C double bond.

DETAILED DESCRIPTION OF THE INVENTION

Now, the positive photosensitive composition according to the present invention will be described in more detail below.

(A) Photo-acid Generator

Now, the compound (A) which generates an acid upon irradiation with an actinic ray or radiation (photo-acid generator) will be described in detail below.

The photo acid generator for use in the present invention is a compound which generates an acid upon irradiation with an actinic ray or radiation.

The compound which decomposes upon irradiation with an active ray or radiation to generate an acid for use in the present invention may be appropriately selected from photoinitiators for photo-cation polymerization, photoinitiators for photo-radical polymerization, photo-achromatizing agents for dyes, photo-discoloring agents, known compounds which generate an acid by light used in a microresist or the like (an ultraviolet ray or deep ultraviolet ray of from 400 to 200 nm, particularly preferably, a g-line, h-line, i-line or KrF excimer laser beam), an ArF excimer laser beam, an electron beam, an X ray, a molecular beam or an ion beam, and mixtures of these compounds.

Other examples of the compound generating an acid upon irradiation with an actinic ray or radiation for use in the present invention include onium salts, for example, diazonium salts described in S. I. Schlesinger, *Photoqr. Sci. Eng.*, 18, 387 (1974) and T. S. Bal et al., *Polymer*, 21, 423 (1980), ammonium salts described in U.S. Pat. Nos. 4,069,055, 4,069,056 and Re 27,992 and JP-A-3-140140, phosphonium salts described in D. C. Necker et al., *Macromolecules*, 17, 2468 (1984), C. S. Wen et al., *The, Proc. Conf. Rad. Curing ASIA*, p. 478, Tokyo, October (1988) and U.S. Pat. Nos. 4,069,055 and 4,069,056, iodonium salts described in J. V. Crivello et al., *Macromolecules*, 10(6), 1307 (1977), *Chem. & Eng. News*, November 28, p. 31 (1988), European Patent 104,143, 339,049 and 410,201, JP-A-2-150848 and JP-A-2-296514, sulfonium salts described in J. V. Crivello et al., *Polymer J.* 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci., Polymer Chem. Ed.*, 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,833,827, German Patents 2,904,626, 3,604,580 and 3,604,581, JP-A-7-28237 and JP-A-8-27102, selenonium salts described in J. V. Crivello et al., *Macromolecules*, 10(6), 1307 (1977), and J. V. Crivello et al., *J. Polymer Sci., Polymer Chem. Ed.*, 17, 1047 (1979), and arsonium salts described in C. S. Wen et al., *Teh, Proc. Conf. Rad. Curing ASIA*, p. 478, Tokyo, October (1988), organic halogeno-compounds described in U.S. Pat. No. 3,905,815, JP-B-46-4605 (the term"JP-B" as used herein means an"examined Japanese patent publication"), JP-A-48-36281, JP-A-55-32070, JP-A-60-239736, JP-A-61-169835, JP-A-61-169837, JP-A-62-58241, JP-A-62-212401, P-A-63-70243 and JP-A-63-298339, organometals/organic halides described in K. Meier et al., *J. Rad. Curing*, 13(4), 26 (1986), T. P. Gill et al., *Inorg. Chem.*, 19, 3007 (1980), D. Astruc,*Acc. Chem. Res.*, 19(12), 377 (1896) and JP-A-2-161445, photo-acid generators having an o-nitrobenzyl type protective group described in S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130(6), F. M. Houlihan et al.,*Macromolecules*, 21, 2001 (1988), European Patents 290,750, 046,083, 156,535, 271,851 and 388,343, U.S. Pat. Nos. 3,901,710 and 4,181,531, JP-A-60-198538 and JP-A-53-133022, compounds generating a sulfonic acid upon photolysis, which are represented by iminosulfonates and the like described in M. Tunooka et al., *Polymer Preprints Japan*, 35(8), G. Berner et al., *J. Rad. Curing*, 13(4), W. J. Mijs et al., *Coating Technol.*, 55(697), 45 (1983) Akzo, H. Adachi et al., *Polymer Preprints, Japan*, 37(3), European Patents 199,672, 084,515, 044,115, 618,564 and 101,122, U.S. Pat. Nos 4,371,605 and 4,431,774, JP-A-64-18143, JP-A-2-245756 and JP-A-3-140109, disulfone compounds described in JP-A-61-166544 and JP-A-2-71270, and diazoketosulfone and diazodisulfone compounds described in JP-A-3-103854, JP-A-3-103856 and JP-A-4-210960.

Furthermore, polymer compounds having introduced the above-described groups or compounds generating an acid upon exposure to light into the main chain or side chain thereof may also be used and examples thereof include compounds described in M. E. Woodhouse et al., *J. Am. Chem. Soc.*, 104, 5586 (1982), S. P. Pappas et al., *J. Imaging Sci.*, 30(5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

For example, onium salts such as diazonium salts, ammonium salts, phosphonium salts, iodonium salts, sulfonium salts, selenonium salts and arsonium salts, organic halogeno-compounds, organo-metals/organic halides, photo-acid generators having an o-nitrobenzyl type protective group, compounds generating a sulfonic acid upon photolysis, which are represented by iminosulfonates, disulfone compounds, diazoketosulfone compounds and diazodisulfone compounds are used.

Further, polymer compounds having introduced the above-described groups or compounds generating an acid upon exposure to light into the main chain or side chain thereof may also be used.

Further, compounds which generate an acid upon exposure to light described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 may be used.

Among the above-described compounds which decompose upon irradiation with an actinic ray or radiation to generate an acid, those which can be particularly effectively used are described below.

(1) Oxazole derivative substituted with trihalomethyl group represented by formula (PAG1) shown below or s-triazine derivative substituted with trihalomethyl group represented by formula (PAG2) shown below:

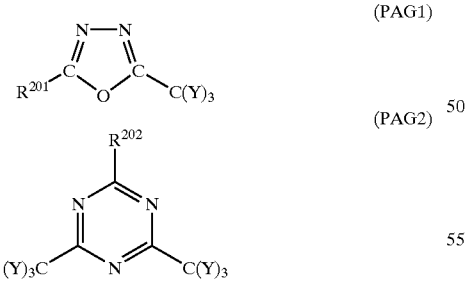

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or $-C(Y)_3$, and Y represents a chlorine atom or a bromine atom.

(2) Iodonium salt represented by formula (PAG3) shown below or sulfonium salt represented by formula (PAG4) shown below:

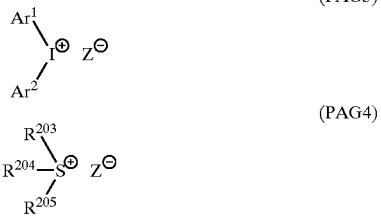

wherein $Ar^1$ and $Ar^2$, which may be the same or different, each represents a substituted or unsubstituted aryl group. Preferred examples of the substituent include an alkyl group, a haloalkyl group, a cycloalkyl group, an aryl group, an alkoxy group, a nitro group, a carboxy group, an alkoxycarbonyl group, a hydroxy group, a mercapto group and a halogen atom.

$R^{203}$, $R^{204}$ and $R^{205}$, which may be the same or different, each represents a substituted or unsubstituted alkyl group or a substituted or unsubstituted aryl group, preferably an aryl group having from 6 to 14 carbon atoms, an alkyl group having from 1 to 8 carbon atoms, or a substituted derivative thereof. Preferred examples of the substituent include, for the aryl group, an alkoxy group having from 1 to 8 carbon atoms, an alkyl group having from 1 to 8 carbon atoms, a nitro group, a carboxy group, a hydroxy group and a halogen atom, and for the alkyl group, an alkoxy group having from 1 to 8 carbon atoms, a carboxy group and an alkoxycarbonyl group.

$Z^-$ represents a counter anion and examples thereof include $BF_4^-$, $AsF_6^-$, $PF_6^-$, $SbF_6^-$, $SiF_6^{2-}$, $ClO_4^-$, an alkane sulfonic acid anion which may be substituted, a perfluoroalkane sulfonic acid anion, a benzene sulfonic acid anion which may be substituted, a naphthalene sulfonic acid anion, anthraquinone sulfonic acid anion and a camphol sulfonic acid anion, however, the present invention should not be construed as being limited thereto. Preferred examples of the anion include an alkane sulfonic acid anion, a perfluoroalkane sulfonic acid anion, an alkyl-substituted benzene sulfonic acid anion and pentafluorobenzene sulfonic acid anion.

Two of $R^{203}$, $R^{204}$ and $R^{205}$ or $Ar^1$ and $Ar^2$ may be combined through a single bond or a substituent.

Specific examples thereof include the following compounds, however, the present invention should not be construed as being limited thereto.

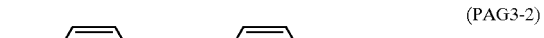

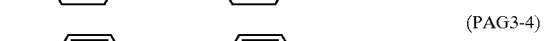

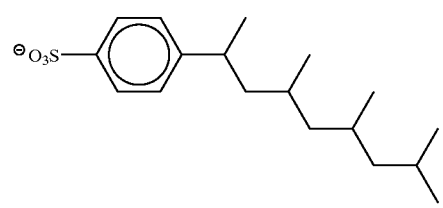
(PAG3-5)
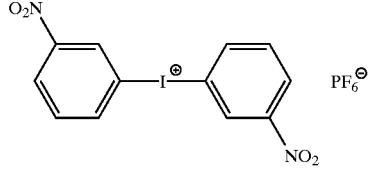
(PAG3-6)
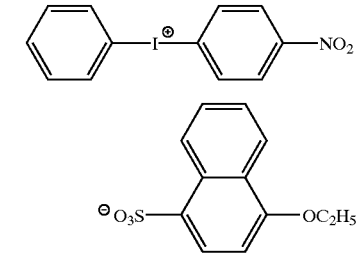
(PAG3-7)
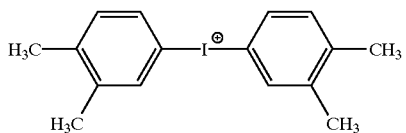
(PAG3-8)
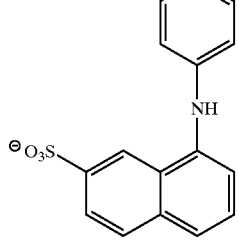
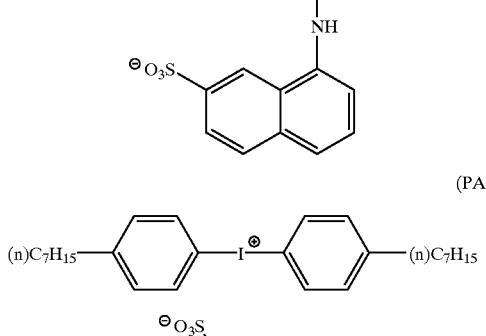
(PAG3-9)
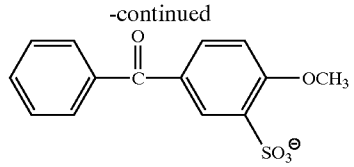
(PAG3-10)
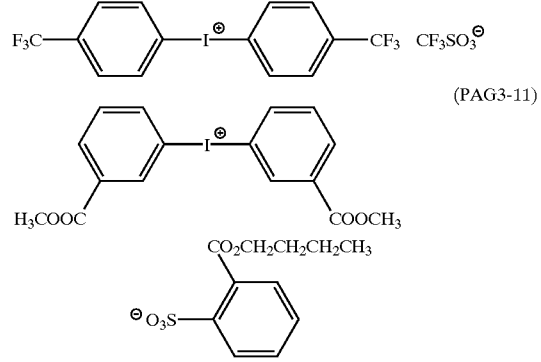
(PAG3-11)
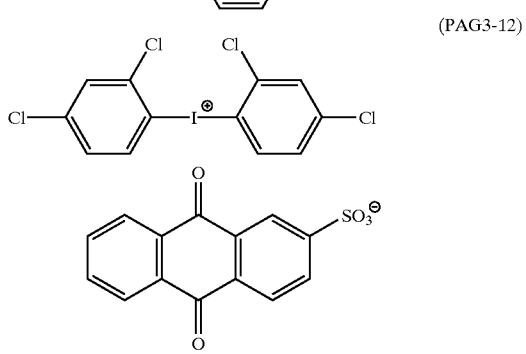
(PAG3-12)
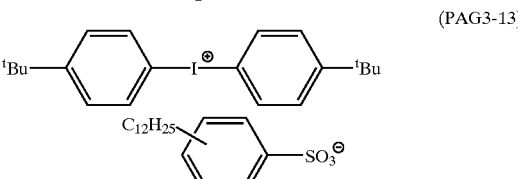
(PAG3-13)
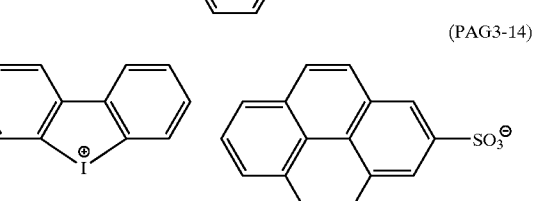
(PAG3-14)
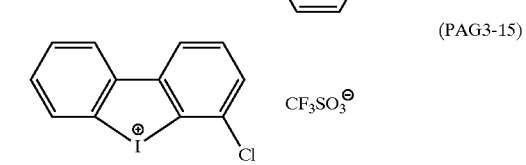
(PAG3-15)
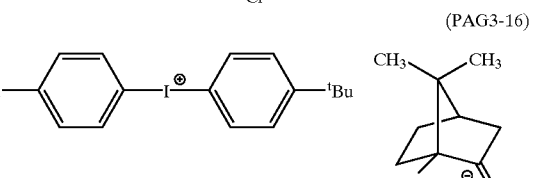
(PAG3-16)
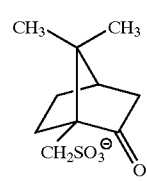

(PAG3-17)
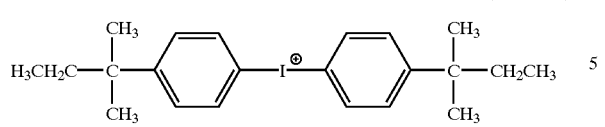
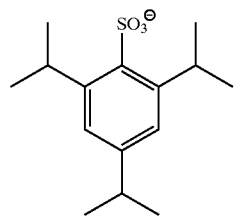
(PAG3-18)
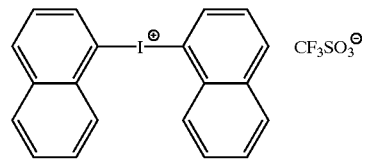
(PAG3-19)
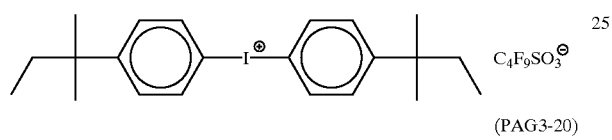
(PAG3-20)
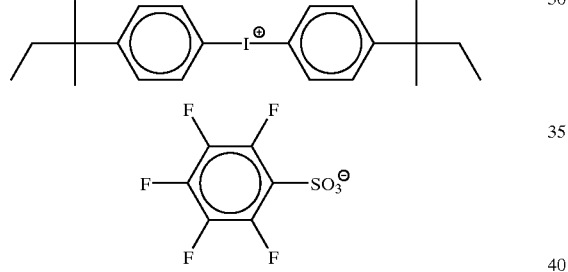
(PAG3-21)
(PAG4-1)
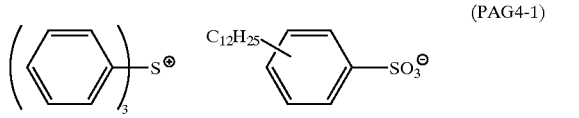
(PAG4-2)
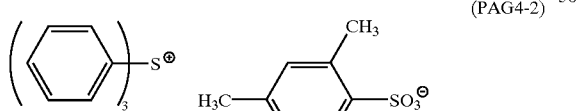
(PAG4-3)
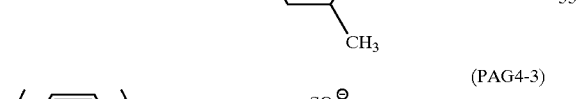
(PAG4-4)
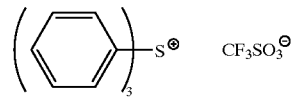
(PAG4-5)
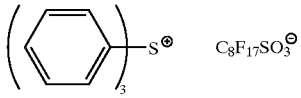
(PAG4-6)
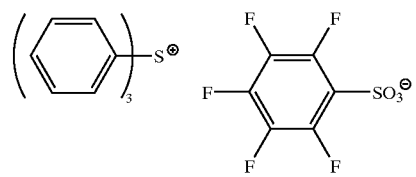
(PAG4-7)
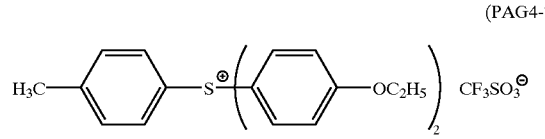
(PAG4-8)
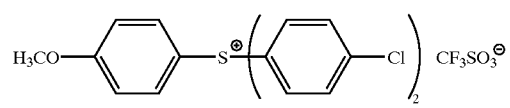
(PAG4-9)
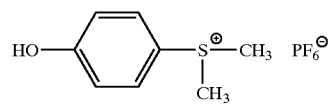
(PAG4-10)
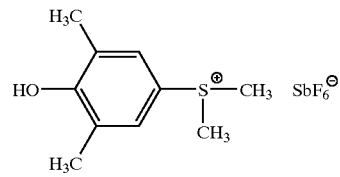
(PAG4-11)
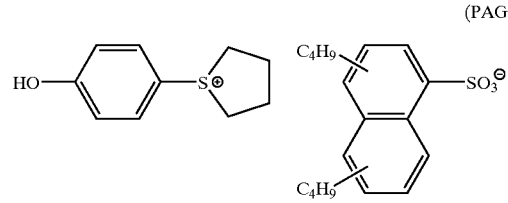
(PAG4-12)
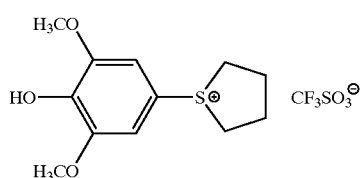
(PAG4-13)
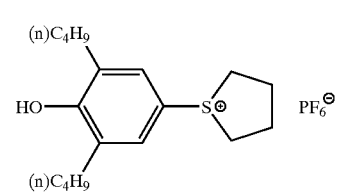

-continued (PAG4-14)

(PAG4-15)

(PAG4-16)

(PAG4-17)

(PAG4-18)

(PAG4-19)

(PAG4-20)

(PAG4-21)

(PAG4-22)

-continued (PAG4-23)

(PAG4-24)

(PAG4-25)

(PAG4-26)

(PAG4-27)

(PAG4-28)

(PAG4-29)

-continued

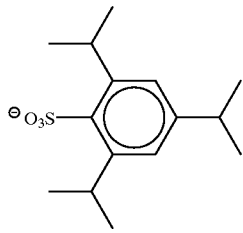
(PAG4-30)

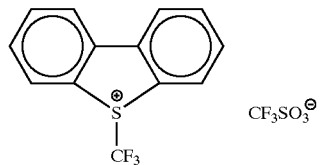
(PAG4-31)

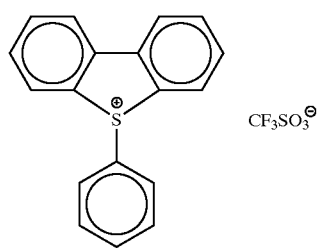
(PAG4-32)

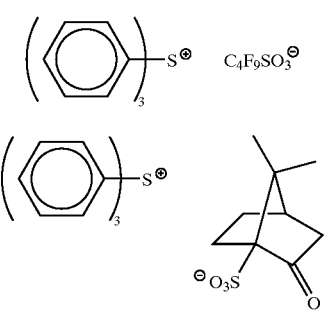
(PAG4-33)

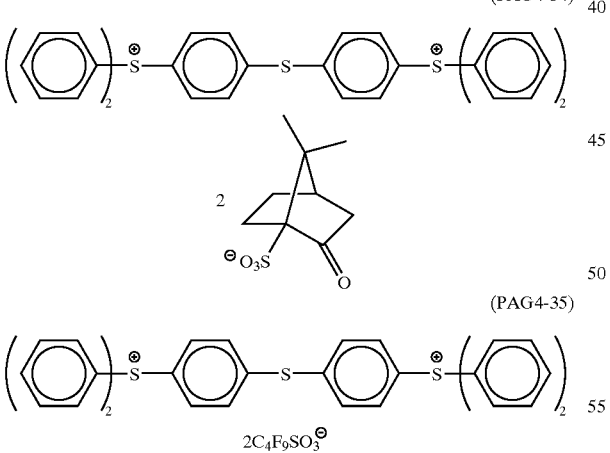
(PAG4-34)

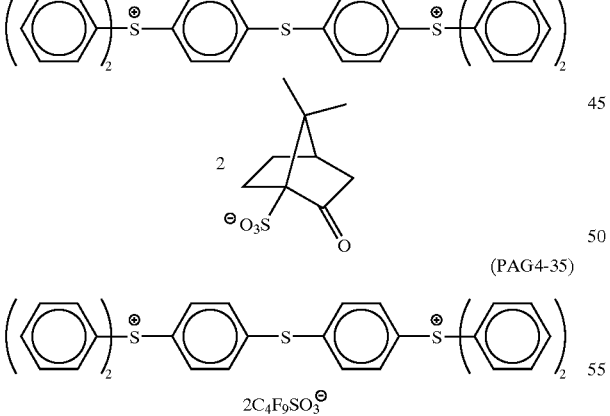
(PAG4-35)

The onium salts represented by formulae (PAG3) and (PAG4) are known and can be synthesized by the methods described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473 and JP-A-53-101331.

(3) Disulfone derivative represented by formula (PAG5) shown below or iminosulfonate derivative represented by formula (PAG6) shown below:

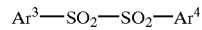
(PAG5)

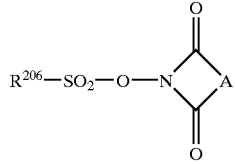
(PAG6)

wherein $Ar^3$ and $Ar^4$, which may be the same or different, each represents a substituted or unsubstituted aryl group, $R^{206}$ represents a substituted or unsubstituted alkyl group or a substituted or unsubstituted aryl group, and A represents a substituted or unsubstituted alkylene group, a substituted or unsubstituted alkenylene group or a substituted or unsubstituted arylene group.

Specific examples thereof include the following compounds, however, the present invention should not be construed as being limited thereto.

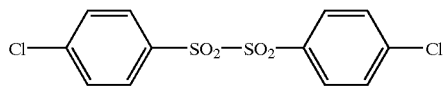
(PAG5-1)

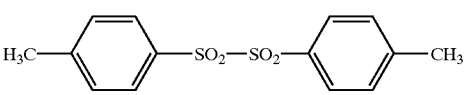
(PAG5-2)

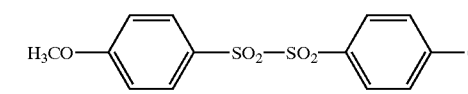
(PAG5-3)

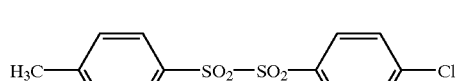
(PAG5-4)

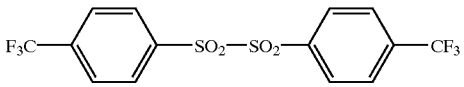
(PAG5-5)

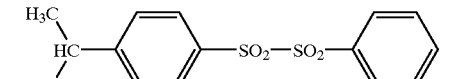
(PAG5-6)

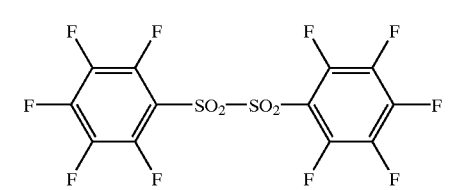
(PAG5-7)

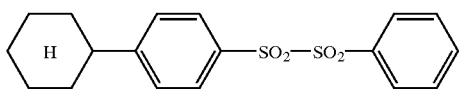
(PAG5-8)

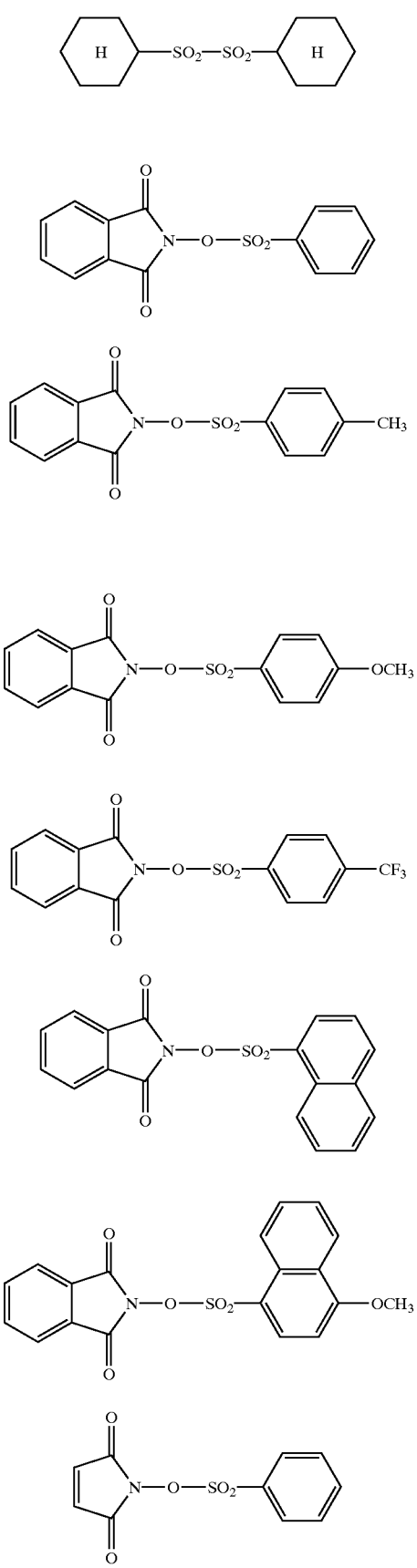
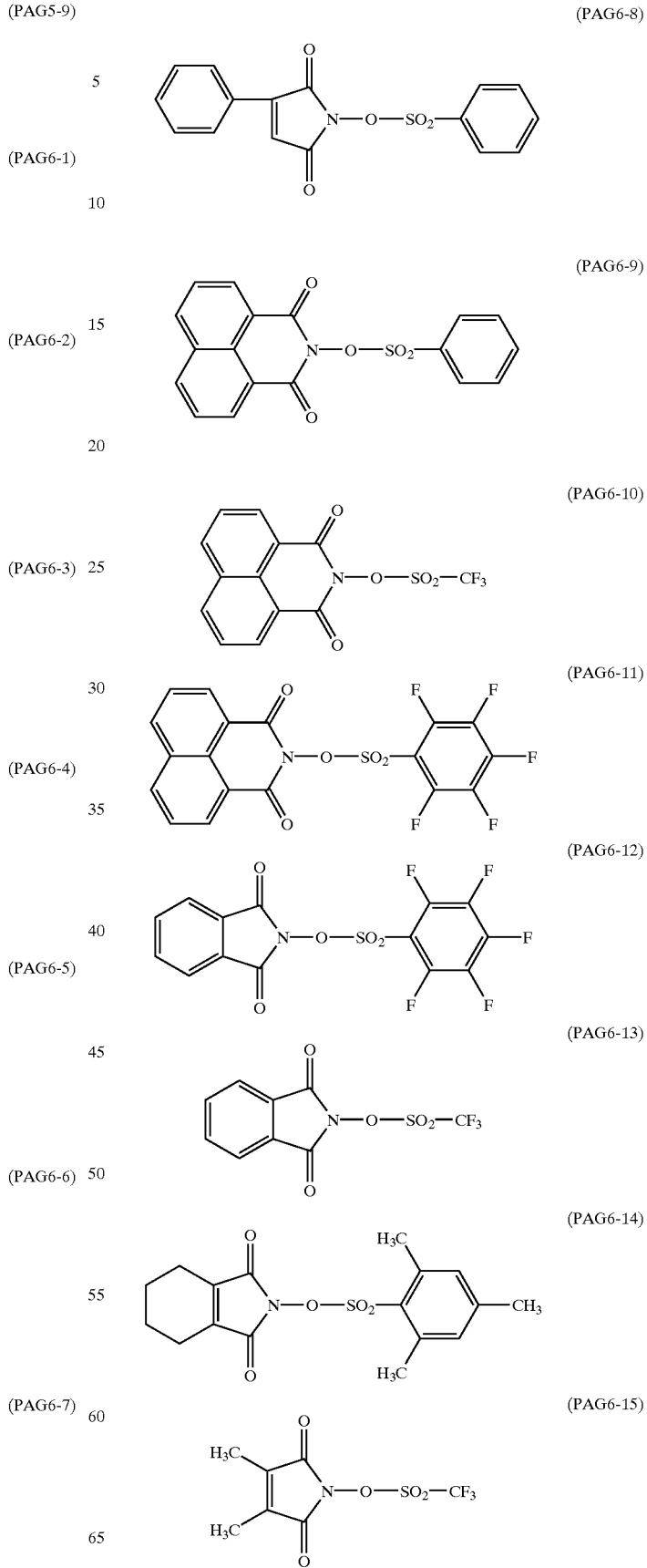

(PAG6-16)

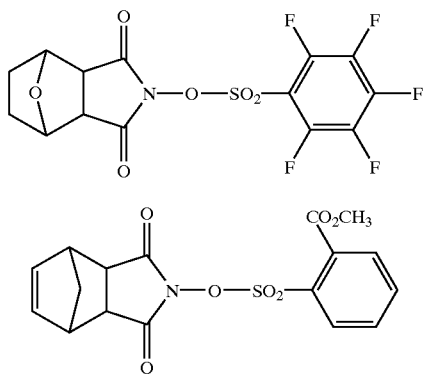

(PAG6-17)

(PAG7-1)

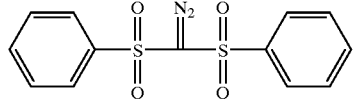

(PAG7-2)

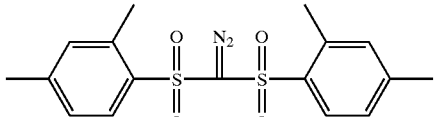

(PAG7-3)

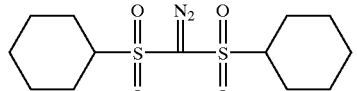

(PAG7-4)

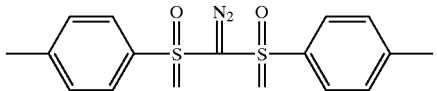

(PAG7-5)

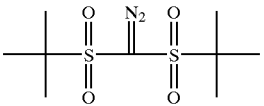

(4) Diazodisulfone derivative represented by formula (PAG7) shown below:

(PAG7)

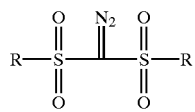

wherein R represents a straight-chain, branched or cyclic alkyl group or a substituted or unsubstituted aryl group.

Specific examples thereof include the following compounds, however, the present invention should not be construed as being limited thereto.

Among the above-mentioned photo-acid generators, compounds that can be particularly preferably used are shown below.

(z1)

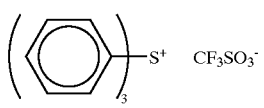

(z2)

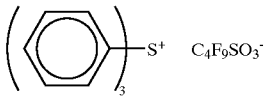

(z3)

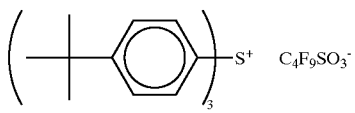

(z4)

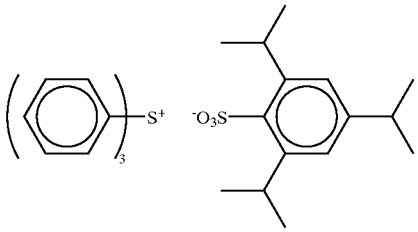

(z5)

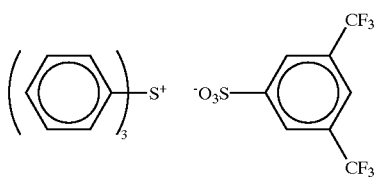

(z6)

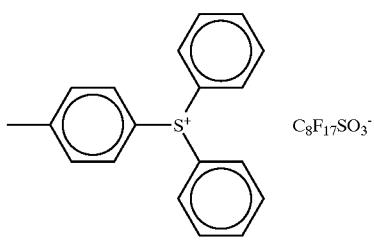

(z8)

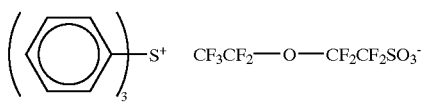

-continued
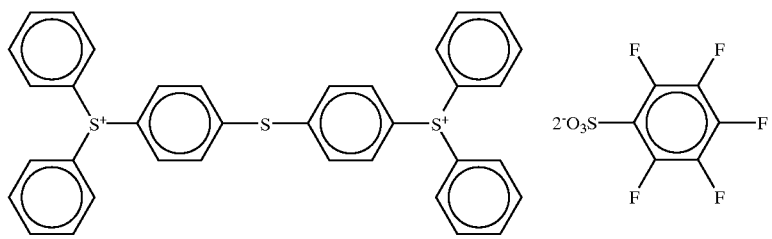
(z9)
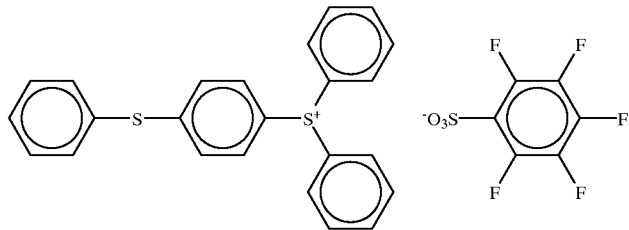
(z10)
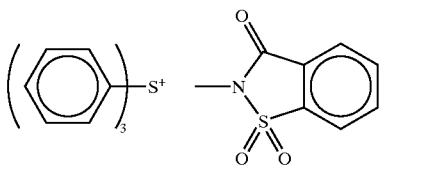
(z11)
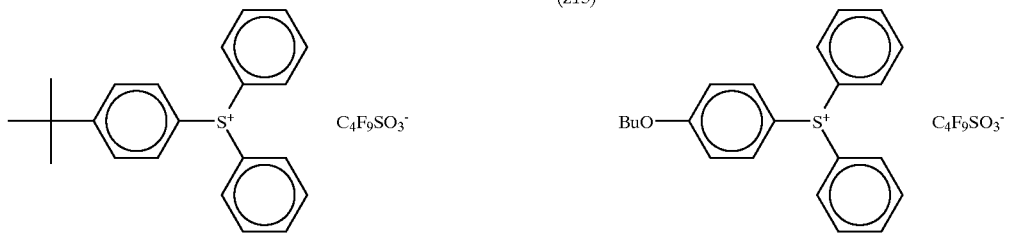
(z12)
(z13) (z14)
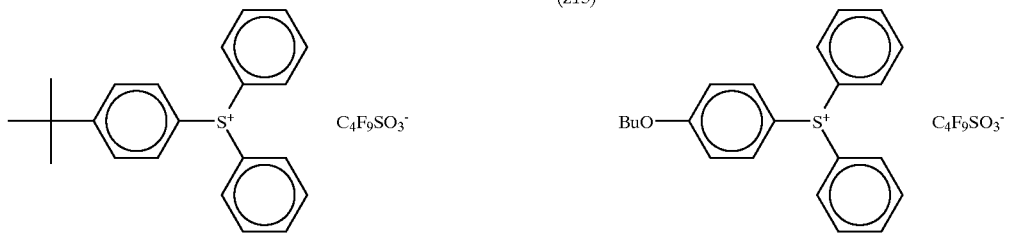
(z15) (z16)
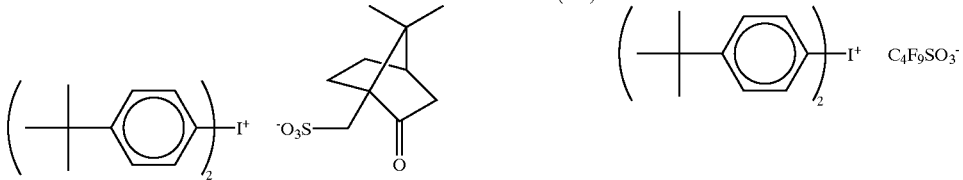
(z17) (z19)
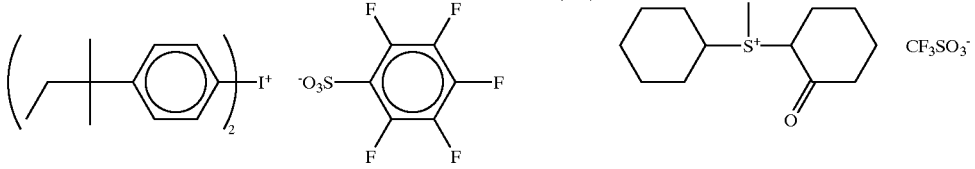
(z20) (z21)
(z22) (z23)

-continued
(z24) 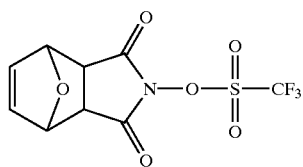
(z25) 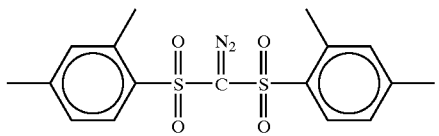
(z26) 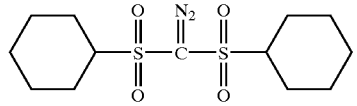
(z27) 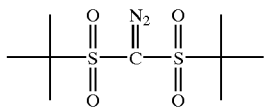
(z28) 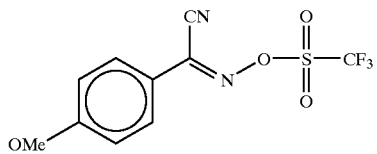
(z29) 
(z30) 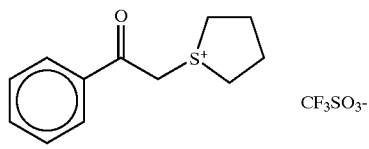
(z31) 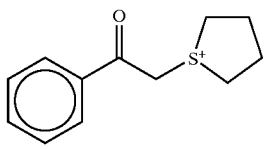
(z32) 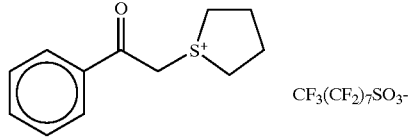
(z33) 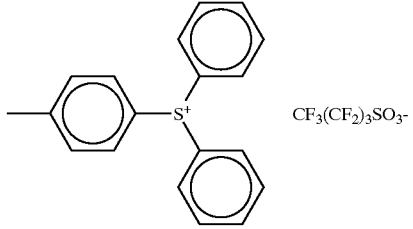
(z34) 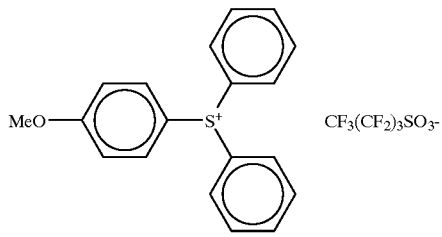
(z35) 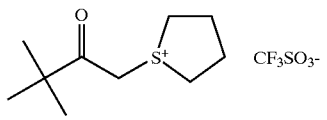
(z36) 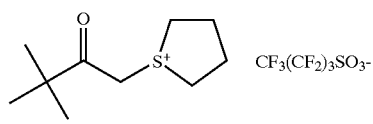
(z37) 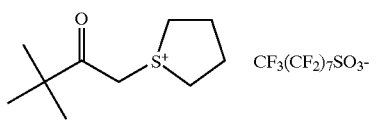
(z38) 
(z39) 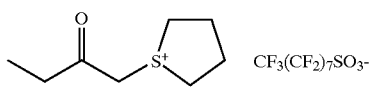

-continued

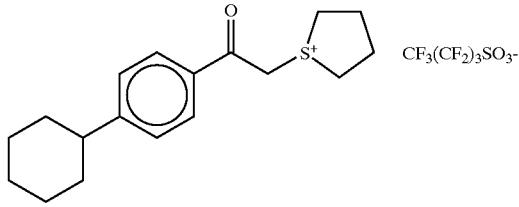
(z40)

The compounds represented by formula (PAG3), (PAG4) or (PAG7) described above are particularly preferred in view of the sensitivity and resolution according to the present invention.

An amount of the compound which decomposes upon irradiation with an actinic ray or radiation to generate an acid to be used is ordinarily from 0.001 to 40% by weight, preferably from 0.01 to 20% by weight, more preferably from 0.01 to 5% by weight, based on the whole components (excluding a solvent) of the positive photosensitive composition of the present invention. If the amount added of the compound which decomposes upon irradiation with an actinic ray or radiation to generate an acid is less than 0.001% by weight, the sensitivity decreases. On the other hand, if the amount added exceeds 40% by weight, the resist exhibits too much light absorption, resulting in causing disadvantageous effects such as deterioration of profile or narrow process (particularly bake) margin.

(B) a Resin Containing a Monocyclic or Polycyclic Alicyclic Hydrocarbon Structure and Increasing the Solubility to an Alkali Developer by the Action of Acid.

The resin which is decomposed by the action of an acid to increase solubility in an alkali developer (hereinafter also referred to as an acid-decomposable resin sometimes) used in the present invention has a group which is decomposed by the action of an acid and a monocyclic or polycyclic alicyclic hydrocarbon structure.

Examples of the group which is decomposed by the action of an acid (hereinafter also referred to as an acid-decomposable group) include a group which is hydrolyzed by the action of an acid to form an acid and a group which releases a carbon cation by the action of an acid to form an acid. Preferred examples thereof include groups represented by formulae (x) and (y) shown below, acid-decomposable groups containing lactone structure and acid-decomposable groups containing alicyclic structure. Such acid-decomposable groups serve to impart excellent storage stability.

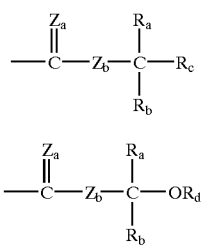
(x)

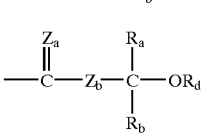
(y)

wherein $R_a$, $R_b$ and $R_c$, which may be the same or different, each represents a hydrogen atom, an alkyl group which may be substituted, a cycloalkyl group which may be substituted or alkenyl group which may be substituted, provided that at least one of $R_a$, $R_b$ and $R_c$ in formula (x) is not a hydrogen atom; $R_d$ represents an alkyl group which may be substituted, cycloalkyl group which may be substituted, or alkenyl group which may be substituted; or two of $R_a$, $R_b$ and $R_c$ in formula (x) or two of $R_a$, $R_b$ and $R_d$ in formula (y) may be bonded to each other to form a three-membered to eight-membered cyclic structure comprising carbon atoms which may contain one or more heteroatoms; and $Z_a$ and $Z_b$, which may be the same or different, each represents an oxygen atom or a sulfur atom.

Specific examples of the cyclic structure include cyclopropyl, cyclopentyl, cyclohexyl, cycloheptyl, 1-cyclohexenyl, 2-tetrahydrofuryl and 2-tetrahydropyranyl.

The alkyl group represented by $R_a$, $R_b$, $R_c$ or $R_d$ preferably includes an alkyl group having from 1 to 8 carbon atoms (e.g., methyl, ethyl, propyl, n-butyl, sec-butyl, hexyl, 2-ethylhexyl or octyl) which may be substituted.

The cycloalkyl group represented by $R_a$, $R_b$, $R_c$ or $R_d$ preferably includes a cycloalkyl group having from 3 to 8 carbon atoms (e.g., cyclopropyl, cyclopentyl or cyclohexyl) which may be substituted.

The alkenyl group represented by $R_a$, $R_b$, $R_c$ or $R_d$ preferably includes an alkenyl group having from 2 to 6 carbon atoms (e.g., vinyl, propenyl, allyl, butenyl, pentenyl, hexenyl or cyclohexenyl) which may be substituted.

Preferred examples of the substituent described above include a hydroxy group, a halogen atom (e.g., fluorine, chlorine, bromine or iodine), a nitro group, a cyano group, an amido group, a sulfonamido group, an alkyl group such as methyl, ethyl, propyl, n-butyl, sec-butyl, hexyl, 2-ethylhexyl or octyl, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, and a carboxy group.

Specific examples of repeating unit having the acid-decomposable group are set forth below, but the present invention should not be construed as being limited thereto.

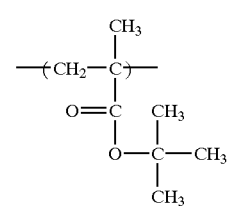
(c1)

-continued (c2) — chemical structure (c3) — chemical structure (c4) — chemical structure (c5) — chemical structure (c6) — chemical structure (c7) — chemical structure (c8) — chemical structure (c9) — chemical structure (c10) — chemical structure (c11) — chemical structure (c12) — chemical structure (c13) — chemical structure (c14) — chemical structure (c15) — chemical structure (c16) — chemical structure -continued (c17) 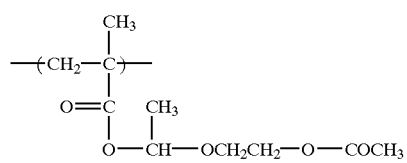

(c18) 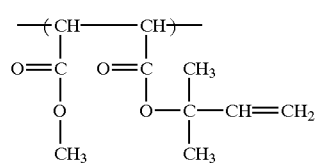

(c19) 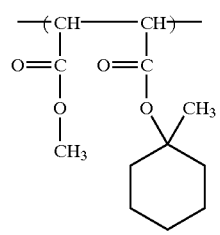

(c20) 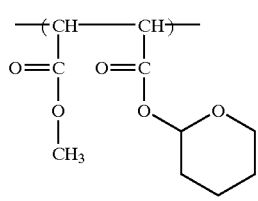

(c21) 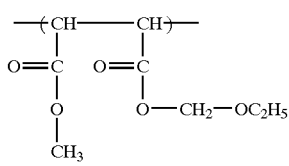

(c22) 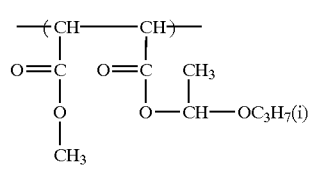

(c23) 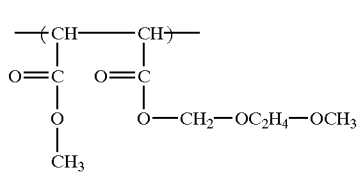

-continued (c24) 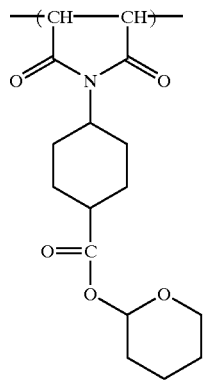

Of the repeating units (c1) to (c24) illustrated above, (c1), (c7) and (c11) are particularly excellent in view of the acid-decomposable property.

It is preferred for the acid-decomposable resin to contain a lactone structure in the present invention.

The alicyclic hydrocarbon structure and lactone structure may or may not have the acid-decomposable property as described above.

The preferred repeating unit having a lactone structure is a repeating unit having a lactone structure represented by the following formula (IV'):

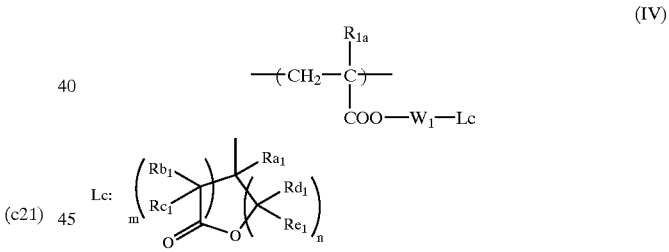

(IV)

wherein $R_{1a}$ represents a hydrogen atom or a methyl group; $W_1$ represents a single bond, an alkylene group, an ether group, a thioether group, a carbonyl group, an ester group or a combination of two or more of these groups; $R_{a1}$, $R_{b1}$, $R_{c1}$, $R_{d1}$ and $R_{e1}$, which are the same or different, each represents a hydrogen atom or an alkyl group having from 1 to 4 carbon atoms; and m and n, which are the same or different, each represents an integer of from 0 to 3, provided that the sum total of m and n is from 2 to 6.

The alkyl group having from 1 to 4 carbon atoms represented by $R_{a1}$, $R_{b1}$, $R_{c1}$, $R_{d1}$ or $R_{e1}$ includes, for example, methyl, ethyl, propyl, isopropyl, n-butyl, isobutyl, sec-butyl and tert-butyl.

The alkylene group represented by $W_1$ in formula (IV') includes a group represented by the following formula:

—{C(Rf)(Rg)}$_{r_1}$— wherein Rf and Rg, which may be the same or different, each represents a hydrogen atom, an alkyl group, a substituted alkyl group, a halogen atom, a hydroxy group or an alkoxy group; and $r_1$ represents an integer of from 1 to 10.

The alkyl group represented by Rf or Rg is preferably a lower alkyl group, for example, methyl, ethyl, propyl, isopropyl or butyl, more preferably methyl, ethyl, propyl or isopropyl. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy and butoxy. The halogen atom includes chlorine, bromine, fluorine and iodine.

Examples of further substituent for the alkyl group include a carboxy group, an acyloxy group, a cyano group, an alkyl group, a substituted alkyl group, a halogen atom, a hydroxy group, an alkoxy group, a substituted alkoxy group, an acetylamido group, an alkoxycarbonyl group and an acyl group.

The alkyl group includes a lower alkyl group, for example, methyl, ethyl, propyl, isopropyl, butyl, cyclopropyl, cyclobutyl or cyclopentyl. A substituent for the substituted alkyl group includes, for example, a hydroxy group, a halogen atom and an alkoxy group. A substituent for the substituted alkoxy group includes, for example, an alkoxy group. The alkoxy group includes an alkoxy group having from 1 to 4 carbon atoms, for example, methoxy, ethoxy, propoxy and butoxy. The acyloxy group includes acetoxy. The halogen atom includes chlorine, bromine, fluorine and iodine.

Specific examples of the repeating unit having a lactone structure are set forth below, but the present invention should not be construed as being limited thereto.

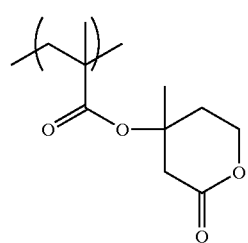

(a1)

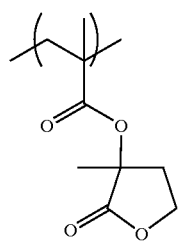

(a2)

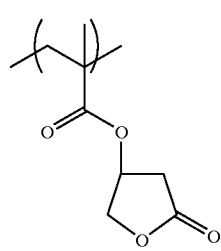

(a3)

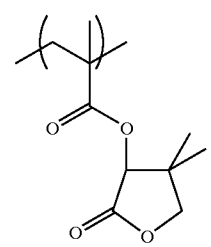

(a4)

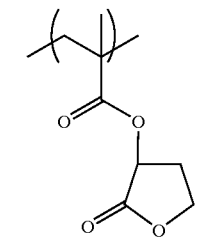

(a5)

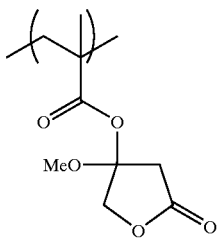

(a6)

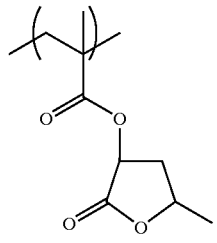

(a7)

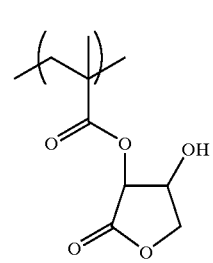

(a8)

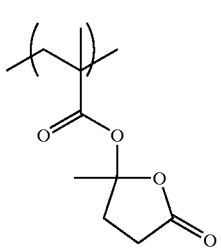

(a9)

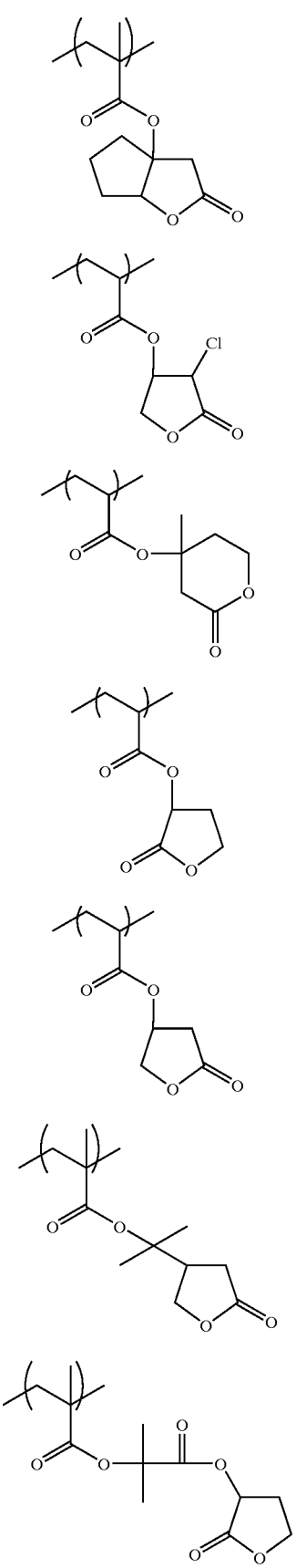
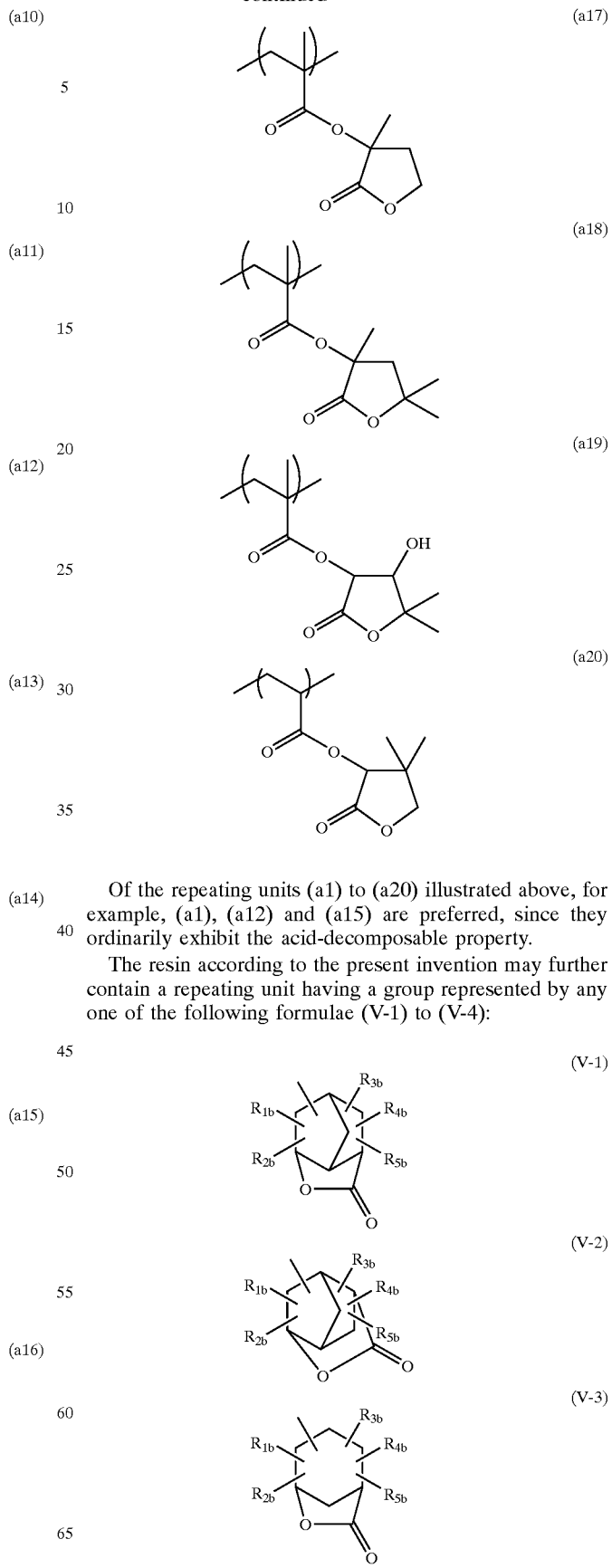
Of the repeating units (a1) to (a20) illustrated above, for example, (a1), (a12) and (a15) are preferred, since they ordinarily exhibit the acid-decomposable property.
The resin according to the present invention may further contain a repeating unit having a group represented by any one of the following formulae (V-1) to (V-4):

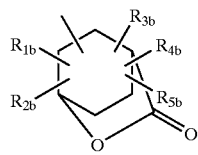
(V-4)

wherein $R_{1b}$, $R_{2b}$, $R_{3b}$, $R_{4b}$ and $R_{5b}$, which may be the same or different, each represents a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring.

The alkyl group represented by any one of $R_{1b}$, $R_{2b}$, $R_{3b}$, $R_{4b}$ and $R_{5b}$ in formulae (V-1) to (V-4) includes a straight-chain or branched alkyl group which may be substituted. The straight-chain or branched alkyl group includes preferably a straight-chain or branched alkyl group having from 1 to 12 carbon atoms, more preferably a straight-chain or branched alkyl group having from 1 to 10 carbon atoms, and still more preferably methyl, ethyl, propyl, isopropyl, n-butyl, isobutyl, sec-butyl, tert-butyl, pentyl, hexyl, heptyl, octyl, nonyl and decyl.

The cycloalkyl group represented by any one of $R_{1b}$, $R_{2b}$, $R_{3b}$, $R_{4b}$ and $R_{5b}$ in formulae (V-1) to (V-4) includes preferably a cycloalkyl group having from 3 to 8 carbon atoms, for example, cyclopropyl, cyclopentyl, cyclohexyl, cycloheptyl and cyclooctyl.

The alkenyl group represented by any one of $R_{1b}$, $R_{2b}$, $R_{3b}$, $R_{4b}$ and $R_{5b}$ in formulae (V-1) to (V-4) includes preferably an alkenyl group having from 2 to 6 carbon atoms, for example, vinyl, propenyl, butenyl and hexenyl.

The ring formed by combining two of $R_{1b}$, $R_{2b}$, $R_{3b}$, $R_{4b}$ and $R_{5b}$ in any one of formulae (V-1) to (V-4) includes preferably a 3-membered to 8-membered ring, for example, cyclopropane, cyclobutane, cyclopentane, cyclohexane and cyclooctane.

The group represented by $R_{1b}$, $R_{2b}$, $R_{3b}$, $R_{4b}$ and $R_{5b}$ in formulae (V-1) to (V-4) can be bonded to any one of the carbon atoms constituting the cyclic structure.

Preferred examples of the substituent for the alkyl group, cycloalkyl group and alkenyl group described above include an alkoxy group having from 1 to 4 carbon atoms, a halogen atom (e.g., fluorine, chlorine, bromine or iodine), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of repeating unit having the group represented by any one of formulae (V-1) to (V-4) include a repeating unit represented by formula (V) described below wherein at least one of Xa, Xb, Ya and Yb has the group represented by any one of formulae (V-1) to (V-4), for example, Xc of —COOXc is the group represented by any one of formulae (V-1) to (V-4), and a repeating unit represented by formula (AI) shown below.

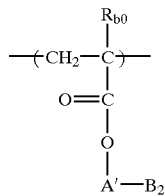
(AI)

In formula (AI), $R_{b0}$ represents a hydrogen atom, a halogen atom, a substituted or unsubstituted alkyl group having from 1 to 4 carbon atoms.

Preferred examples of the substituent for the alkyl group represented by $R_{b0}$ include the preferred examples of substituent for the alkyl group represented by $R_{1b}$ in any one of formulae (V-1) to (V-4) described above.

The halogen atom represented by $R_{b0}$ includes fluorine, chlorine, bromine and iodine atoms. $R_{b0}$ is preferably a hydrogen atom.

A' in formula (AI) represents a single bond, an ether group, an ester group, a carbonyl group, an alkylene group or a divalent group formed by combining these groups.

$B_2$ in formula (AI) represents the group represented by any one of formulae (V-1) to (V-4).

Examples of the divalent group formed by combination represented by A' includes those represented by the following formulae:

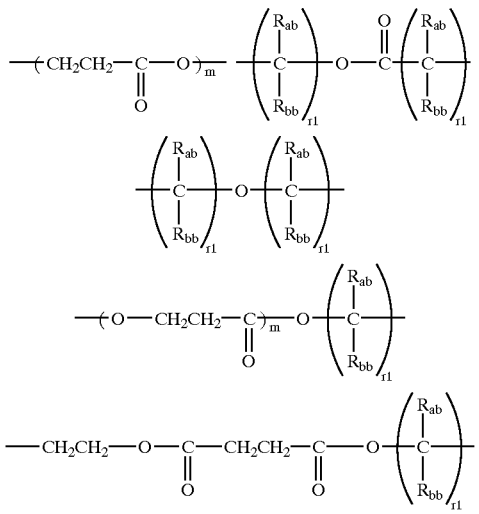

In the above-described formulae, $R_{ab}$ and $R_{bb}$, which may be the same or different, each represents a hydrogen atom, an alkyl group, a substituted alkyl group, a halogen atom, a hydroxy group or an alkoxy group.

The alkyl group represented by any one of $R_{ab}$ and $R_{bb}$ is preferably a lower alkyl group, for example, methyl, ethyl, propyl, isopropyl or butyl, more preferably methyl, ethyl, propyl or isopropyl. A substituent for the substituted alkyl group includes a hydroxy group, a halogen atom and an alkoxy group having from 1 to 4 carbon atoms.

The alkoxy group includes an alkoxy group having from 1 to 4 carbon atoms, for example, methoxy, ethoxy, propoxy and butoxy. The halogen atom includes chlorine, bromine, fluorine and iodine. r1 represents an integer of from 1 to 10, preferably from 1 to 4. m represents an integer of from 1 to 3, preferably 1 or 2.
Specific examples of the repeating unit represented by formula (AI) are set forth below, but the present invention should not be construed as being limited thereto.
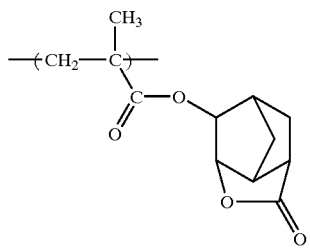
(Ib-1)
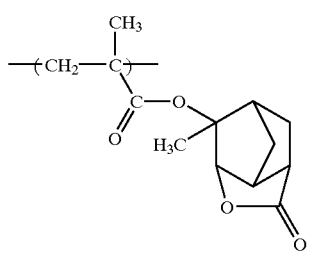
(Ib-2)
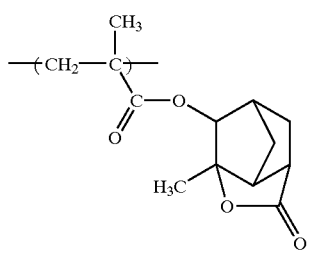
(Ib-3)
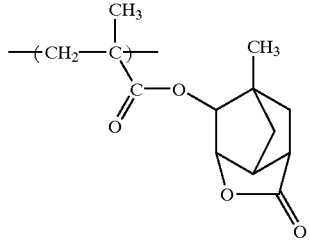
(Ib-4)
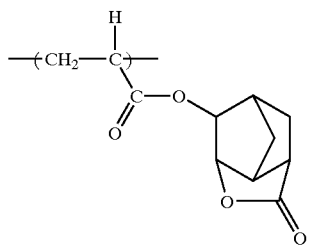
(Ib-5)
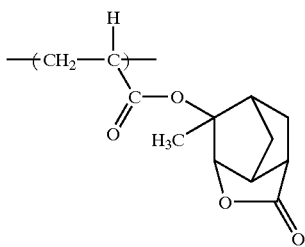
(Ib-6)
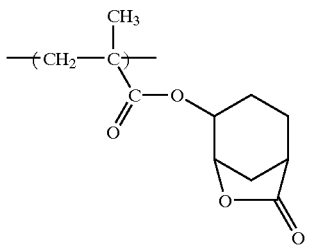
(Ib-7)
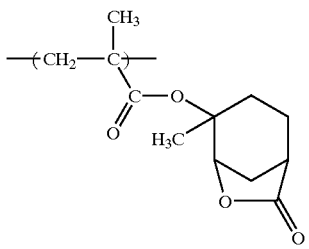
(Ib-8)
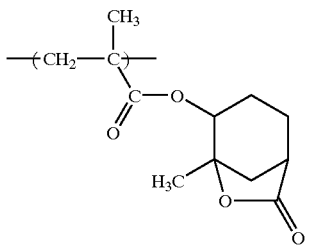
(Ib-9)
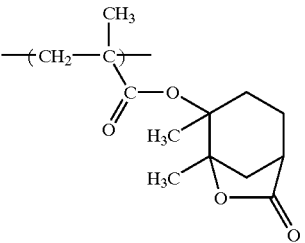
(Ib-10)
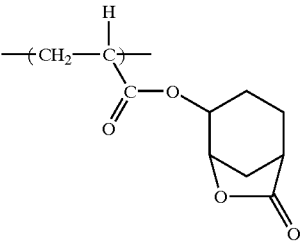
(Ib-11)

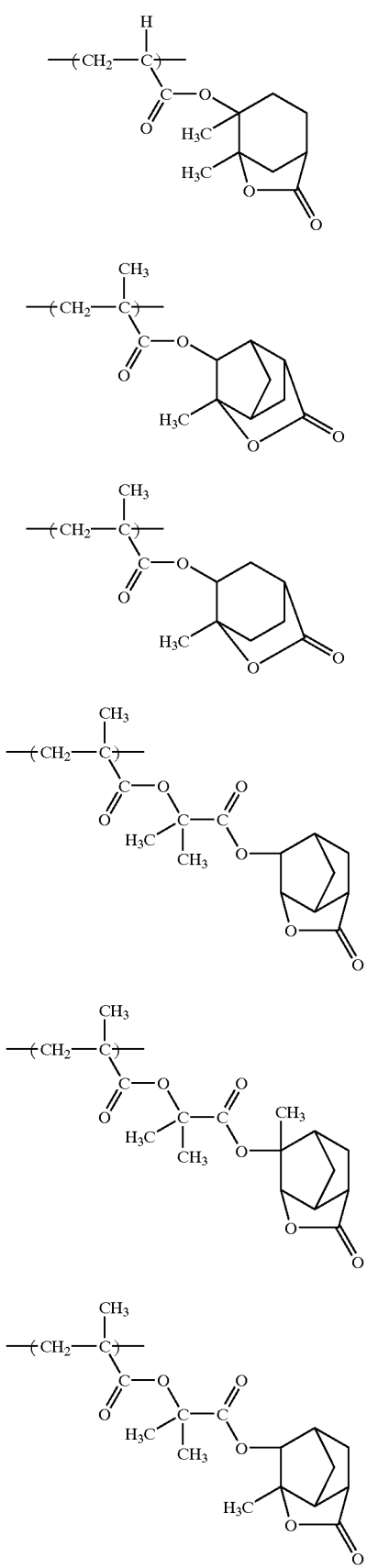
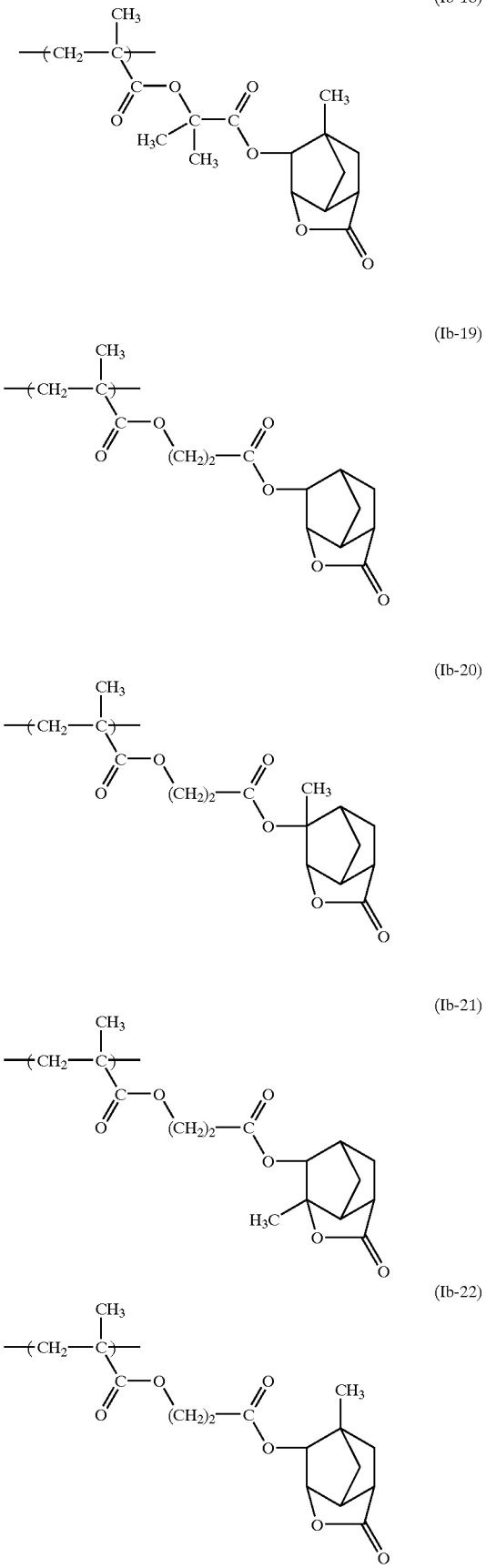

(Ib-23)
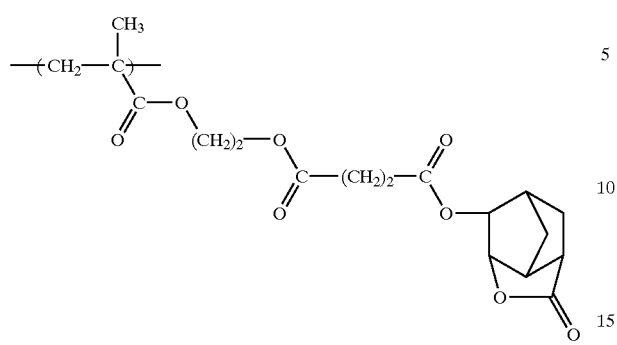
(Ib-24)
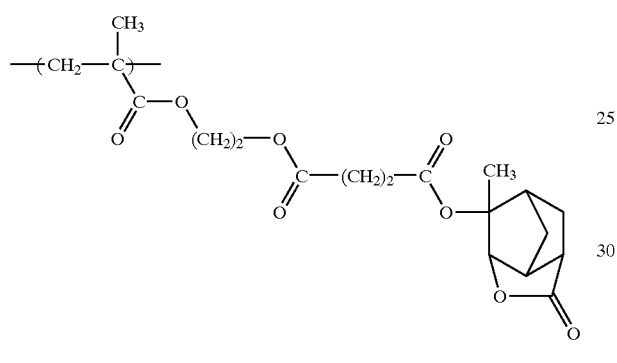
(Ib-25)
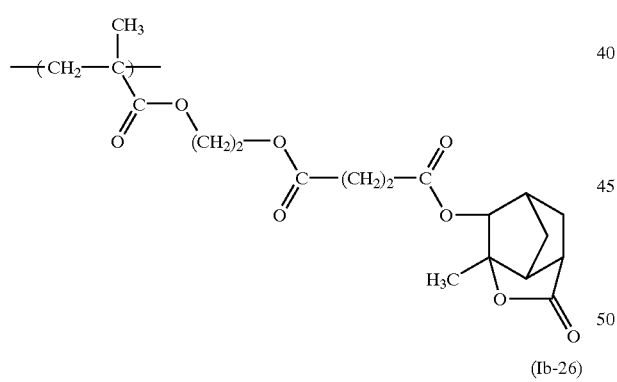
(Ib-26)
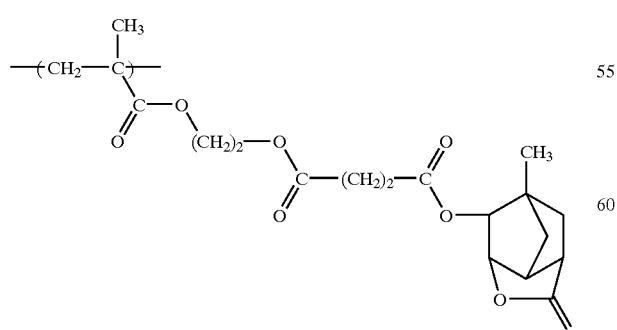
(Ib-27)
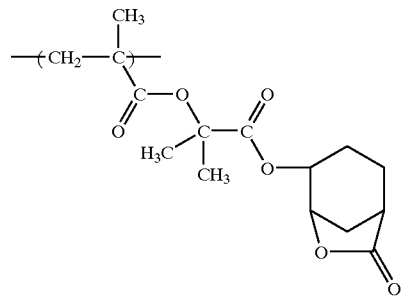
(Ib-28)
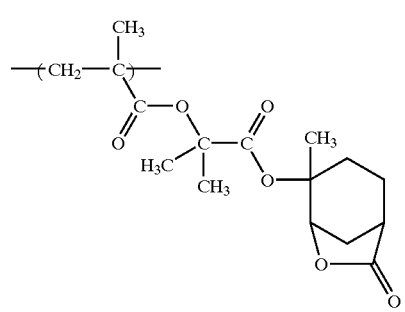
(Ib-29)
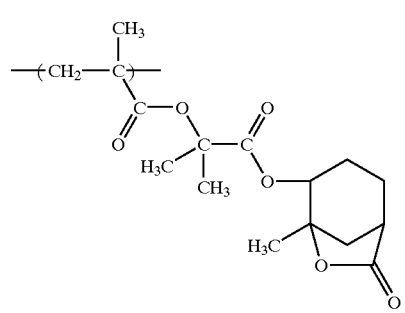
(Ib-30)
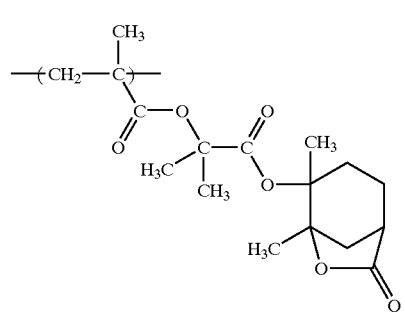
(Ib-31)
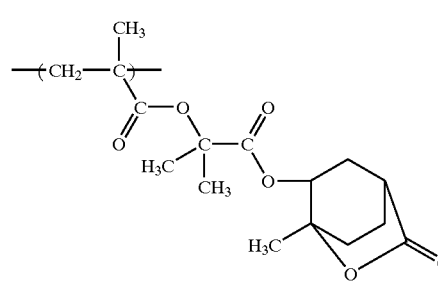

(Ib-32)
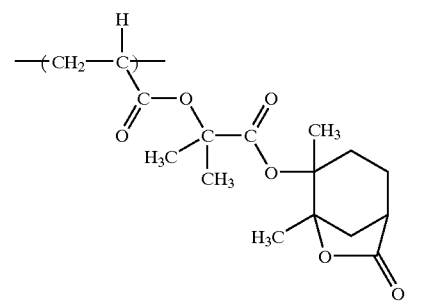
(Ib-33)
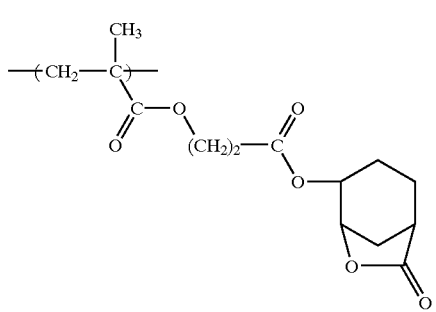
(Ib-34)
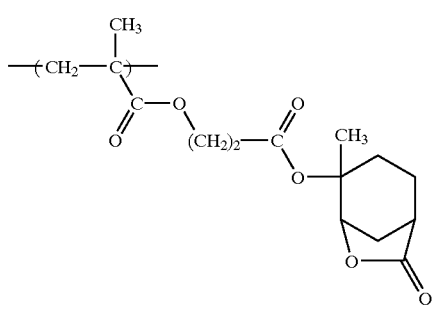
(Ib-35)
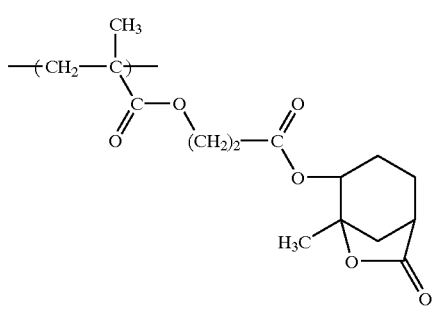
(Ib-36)
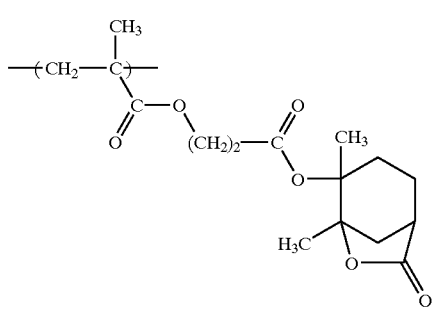
(Ib-37)
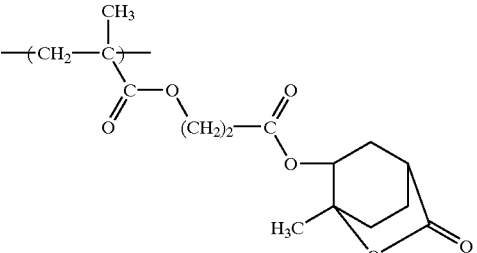
(Ib-38)
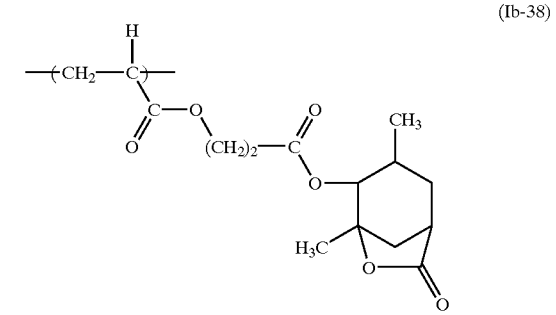
(Ib-39)
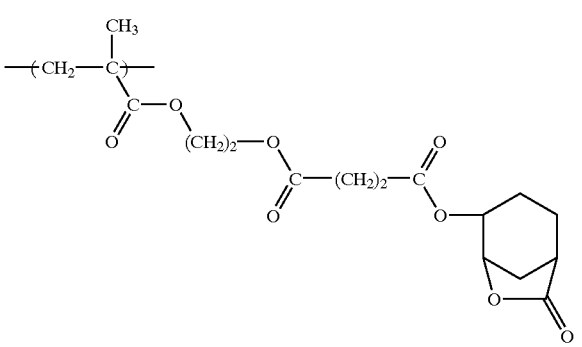
(Ib-40)
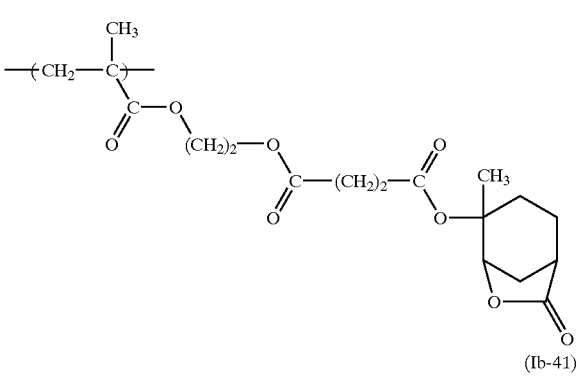
(Ib-41)
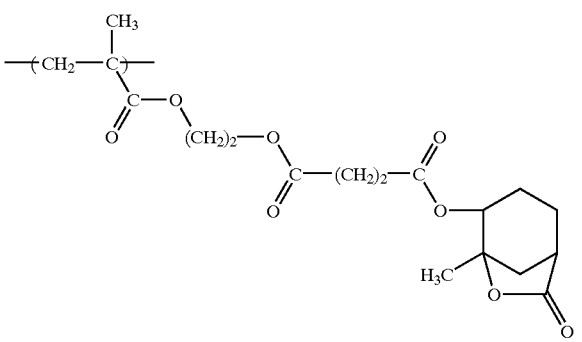

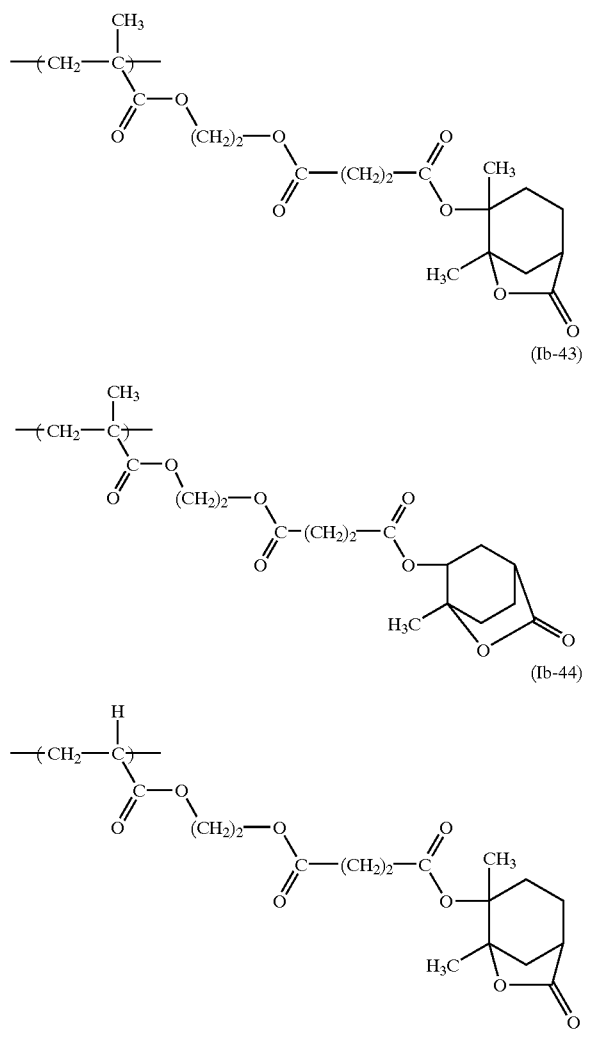

The acid-decomposable resin according to the present invention may further contain a repeating unit represented by the following formula (VI):

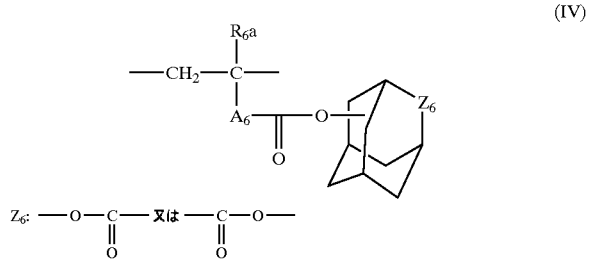

In formula (VI), $A_6$ represents a single bond, an alkylene group, a cycloalkylene group, an ether group, a thioether group, a carbonyl group, an ester group or a combination of two or more of these groups.

$R_{6a}$ represents a hydrogen atom, an alkyl group having from 1 to 4 carbon atoms, a cyano group or a halogen atom.

The alkylene group represented by $A_6$ in formula (VI) includes a group represented by the following formula:

—{C(Rnf)(Rng)}r— wherein Rnf and Rng, which may be the same or different, each represents a hydrogen atom, an alkyl group, a substituted alkyl group, a halogen atom, a hydroxy group or an alkoxy group; and r represents an integer of from 1 to 10.

The alkyl group represented by Rnf or Rng is preferably a lower alkyl group, for example, methyl, ethyl, propyl, isopropyl or butyl, more preferably methyl, ethyl, propyl or isopropyl. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy and butoxy. The halogen atom includes chlorine, bromine, fluorine and iodine.

The cycloalkylene group represented by $A_6$ in formula (VI) includes a cycloalkylene group having from 3 to 10 carbon atoms, for example, cyclopentylene, cyclohexylene and cyclooctylene.

In formula (VI), the bridged alicyclic group including $Z_6$ may have one or more substituents. Examples of the substituent include a halogen atom, an alkoxy group preferably an alkoxy group having from 1 to 4 carbon atoms, an alkoxycarbonyl group preferably an alkoxycarbonyl group having from 1 to 5 carbon atoms, an acyl group, for example, formyl or benzyl, an acyloxy group, for example, propylcarbonyloxy or benzoyloxy, an alkyl group preferably an alkyl group having from 1 to 4 carbon atoms, a carboxy group, a hydroxy group and an alkylsulfonylaminocarbonyl group, for example, —$CONHSO_2CH_3$. The alkyl group as the substituent may further be substituted with a hydroxy group, a halogen atom or an alkoxy group preferably an alkoxy group having from 1 to 4 carbon atoms.

The oxygen atom of the ester group connected to $A_6$ in formula (VI) can be bonded to any one of the carbon atoms constituting the bridged alicyclic structure containing $Z_6$.

Specific examples of the repeating unit represented by formula (VI) are set forth below, but the present invention should not be construed as being limited thereto.

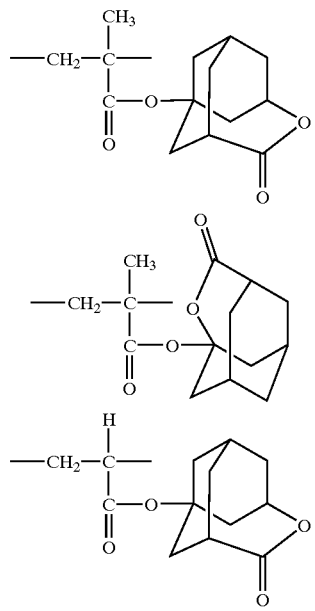

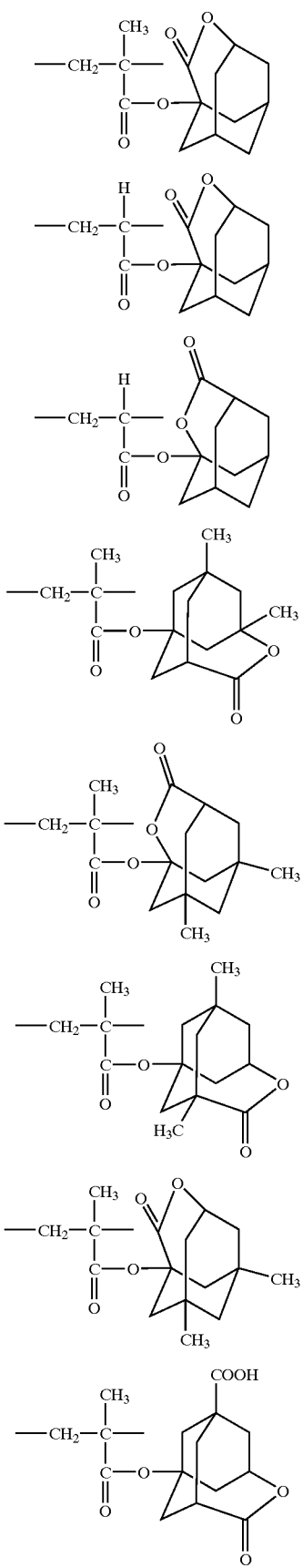
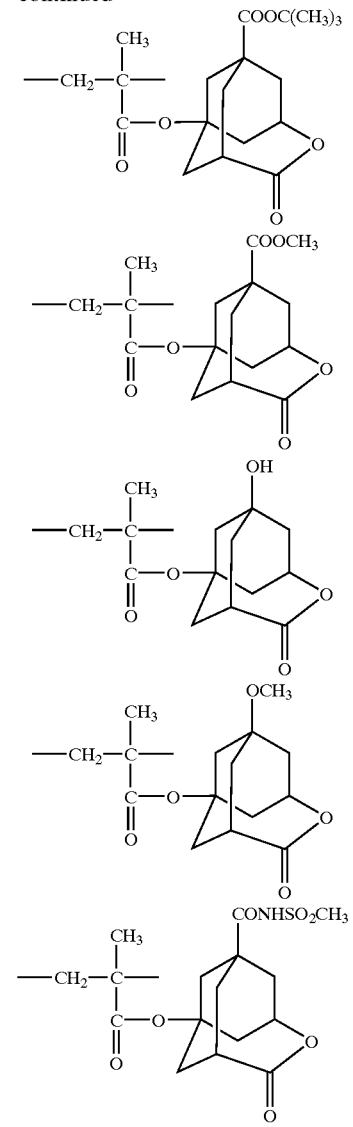

The resin (B) in the present invention preferably contains at least one of the repeating units represented by formulae (V-1) to (V-4) and (VI) in the view of a improvement of the dry etching resistance.

Of the monocyclic or polycyclic alicyclic hydrocarbon structure contained in the acid-decomposable resin, the monocyclic alicyclic hydrocarbon structure includes a monocyclic alicyclic hydrocarbon skeleton having 3 or more carbon atoms, preferably from 3 to 8 carbon atoms, for example, cyclopropane, cyclobutane, cyclopentane or cyclohexane.

The polycyclic alicyclic hydrocarbon structure includes a polycyclic alicyclic hydrocarbon skeleton having 5 or more carbon atoms, preferably from 7 to 25 carbon atoms, for example, bicyclo-, tricyclo- or tetracyclo-alicyclic hydrocarbon group. More specifically, examples of the polycyclic alicyclic hydrocarbon structure include those shown hereinafter.

On the other hand, a structure of the alicyclic hydrocarbon moiety containing the acid-decomposable group includes a form wherein the alicyclic hydrocarbon moiety is connected to the backbone of the resin through the acid-decomposable structure which decomposes upon the action of an acid to release the alicyclic hydrocarbon moiety and a form wherein the alicyclic hydrocarbon moiety is connected directly or through a linking group to the group represented by formula (x) or (y).

In a case wherein the resin contains the monocyclic or polycyclic alicyclic hydrocarbon structure in the side chain thereof, it is preferred that the alicyclic hydrocarbon structure is connected through a tertiary ester group with the main chain thereof.

Examples of repeating unit having the monocyclic or polycyclic alicyclic hydrocarbon structure include preferably those represented by the following formulae (II) to (V):

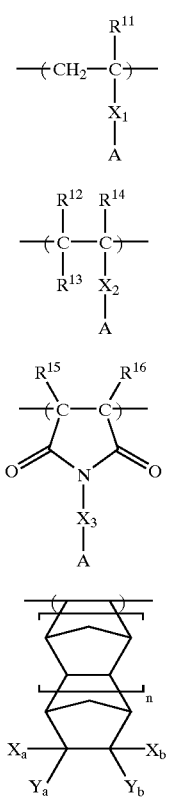

First, the repeating units represented by formulae (II) to (IV) are described in detail and then the repeating unit represented by formula (V) will be described in detail.

In formulae (II) to (IV), the substituents connected to the backbone chains of the repeating units, e.g., $R^{11}$, $R^{12}$, $R^{14}$, $R^{15}$ and $R^{16}$, which may be the same or different, each represents a hydrogen atom, a halogen atom, a cyano group, an alkyl group or a haloalkyl group.

The alkyl group represented by $R^{11}$, $R^{12}$, $R^{14}$, $R^{15}$ or $R^{16}$ includes an alkyl group having from 1 to 4 carbon atoms, for example, methyl, ethyl, propyl, n-butyl and sec-butyl.

The haloalkyl group include a group wherein a part or all of hydrogen atoms of an alkyl group having from 1 to 4 carbon atoms are substituted with halogen atoms. Preferred examples of the halogen atom include a fluorine atom, a chlorine atom and a bromine atom. Specific examples of the haloalkyl group include fluoromethyl, chloromethyl, bromomethyl, fluoroethyl, chloroethyl and bromoethyl.

The alkyl group and haloalkyl group may have one or more substituents other than the halogen atom.

$R^{13}$ represents a cyano group, —CO—$OR^{23}$ or —CO—$NR^{24}R^{25}$. $R^{23}$ represents a hydrogen atom, an alkyl group, a cycloalkyl group, an alkenyl group or an acid-decomposable group. The acid-decomposable group has the same meaning as defined above. For example, compounds having the same repeating unit structure as described above are preferred. Each of the alkyl group, cycloalkyl group and alkenyl group represented by $R^{23}$ may have one or more substituents.

$R^{24}$ and $R^{25}$, which may be the same or different, each represents a hydrogen atom, an alkyl group, a cycloalkyl group or an alkenyl group. Each of the alkyl group, cycloalkyl group and alkenyl group represented by $R^{24}$ or $R^{25}$ may have one or more substituents. Alternatively, $R^{24}$ and $R^{25}$ may be combined with each other to form a ring together with the nitrogen atom. In such a case, the ring structure formed includes preferably 5-membered to 8-membered rings. Specific examples thereof include pyrrolidine, piperidine and piperazine rings.

The alkyl group represented by $R^{23}$, $R^{24}$ or $R^{25}$ includes preferably an alkyl group having from 1 to 8 carbon atoms. Specific examples thereof include methyl, ethyl, propyl, n-butyl, sec-butyl, hexyl, 2-ethylhexyl and octyl.

The cycloalkyl group represented by $R^{23}$, $R^{24}$ or $R^{25}$ includes preferably a cycloalkyl group having from 3 to 8 carbon atoms. Specific examples thereof include cyclopropyl, cyclopentyl and cyclohexyl.

The alkenyl group represented by $R^{23}$, $R^{24}$ or $R^{25}$ includes preferably an alkenyl group having from 2 to 6 carbon atoms. Specific examples thereof include vinyl, propenyl, allyl, butenyl, pentenyl, hexenyl and cyclohexenyl.

The alkyl group, cycloalkyl group and alkenyl group each represented by $R^{23}$, $R^{24}$ or $R^{25}$ may have one or more substituents.

In the substituents represented by $X_1$-A, $X_2$-A and $X_3$-A in formulae (II) to (IV), $X_1$, $X_2$ and $X_3$, which may be the same or different, each represents a sigle bond or a divalent group. The divalent group includes, for example, an alkylene group, an alkenylene group, a cycloalkylene group, —O—, —$SO_2$—, —O—CO—$OR^{26}$—, —CO—O—$R^{27}$— and —CO—$NR^{28}$—$R^{29}$—.

The alkylene group, alkenylene group and cycloalkylene group for $X_1$, $X_2$ and $X_3$ represent the corresponding divalent groups derived from the alkyl group, alkenyl group and cycloalkyl group represented by $R^{11}$, $R^{12}$, $R^{14}$, $R^{15}$ or $R^{16}$, respectively.

$R^{26}$, $R^{27}$ and $R^{29}$ in the —O—CO—$OR^{26}$—, —CO—O—$R^{27}$— and —CO— $NR^{28}$—$R^{29}$— for $X_1$, $X_2$ and $X_3$ each represents a single bond or a divalent group. The divalent group includes, for example, an alkylene group, an alkenylene group, a cycloalkylene group. The alkylene group, alkenylene group and cycloalkylene group represent the corresponding divalent groups derived from the alkyl group, alkenyl group and cycloalkyl group represented by $R^{11}$, $R^{12}$, $R^{14}$, $R^{15}$ or $R^{16}$, respectively. These groups may form divalent groups in all by connecting with an ether bond, an ester bond, an amido bond, a urethane bond or a ureido bond.

$R^{28}$ in the —CO—$NR^{28}$—$R^{29}$— for $X_1$, $X_2$ and $X_3$ represents a hydrogen atom, an alkyl group, a cycloalkyl group or an alkenyl group same as defined for $R^{24}$, $R^{25}$ or $R^{26}$.

The alkyl group, cycloalkyl group and alkenyl group represented by $R^{28}$ may have one or more substituents. $R_{28}$ may have the same as or different from each of $R^{24}$ and $R^{25}$. Specific examples of the alkyl group, cycloalkyl group and alkenyl group represented by $R^{28}$ are same as those described for the alkyl group, cycloalkyl group and alkenyl group represented by $R^{23}$, $R^{24}$ or $R^{25}$.

The substituent represented by A which is connected indirectly to the backbone chain of the repeating unit through $X_1$, $X_2$ or $X_3$ represents a monocyclic or polycyclic hydrocarbon group.

The monocyclic hydrocarbon group represented by A includes a group having a monocyclic alicyclic hydrocarbon skeleton having 3 or more carbon atoms, preferably from 3 to 8 carbon atoms, for example, cyclopropane, cyclobutane, cyclopentane or cyclohexane.

The polycyclic hydrocarbon group includes a group having a polycyclic alicyclic hydrocarbon skeleton having 5 or more carbon atoms, preferably from 7 to 25 carbon atoms, for example, bicyclo—, tricyclo- or tetracyclo-alicyclic hydrocarbon group. The monocyclic or polycyclic hydrocarbon skeleton may have one or more substituents to increase the number of carbon atoms included therein.

Preferred examples of the substituent for the monocyclic or polycyclic alicyclic hydrocarbon skeleton include a hydroxy group, a halogen atom, a nitro group, a cyano group, an amido group, a sulfonamido group, an alkyl group such as the alkyl group defined for $R^{23}$ above, an alkoxy group, an alkoxycarbonyl group, an acyl group, an acyloxy group and a carboxy group.

The halogen atom includes a fluorine atom, a chlorine atom, a bromine atom and an iodine atom.

The alkoxy group includes an alkoxy group having from 1 to 8 carbon atoms, for example, methoxy, ethoxy, hydroxyethoxy, propoxy, hydroxypropoxy and butoxy.

The alkoxycarbonyl group includes, for example, methoxycarbonyl and ethoxycarbonyl.

The acyl group includes, for example, formyl, acetyl and benzoyl.

The acyloxy group includes, for example, acetoxy and butyryloxy.

Examples of representative structure of the monocyclic or polycyclic alicyclic moiety present in the monocyclic or polycyclic hydrocarbon group are set forth below.

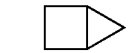 (1)

 (2)

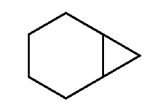 (3)

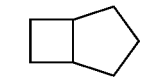 (4)

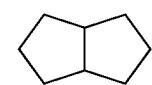 (5)

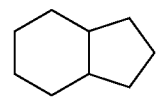 (6)

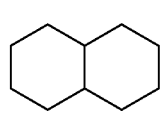 (7)

-continued

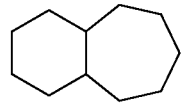 (8)

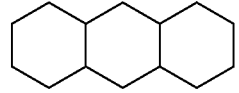 (9)

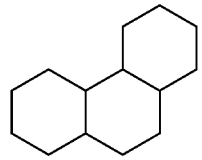 (10)

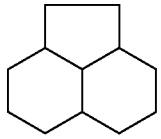 (11)

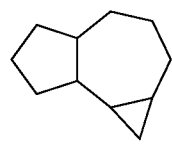 (12)

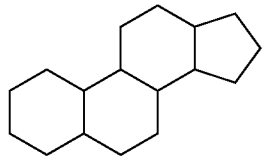 (13)

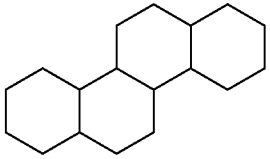 (14)

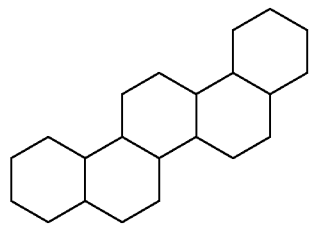 (15)

 (16)

 (17)

 (18)

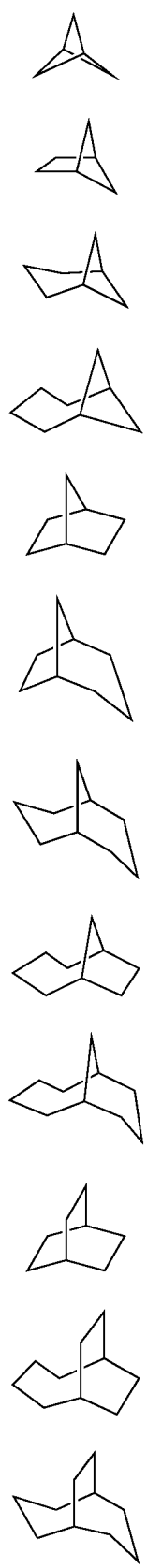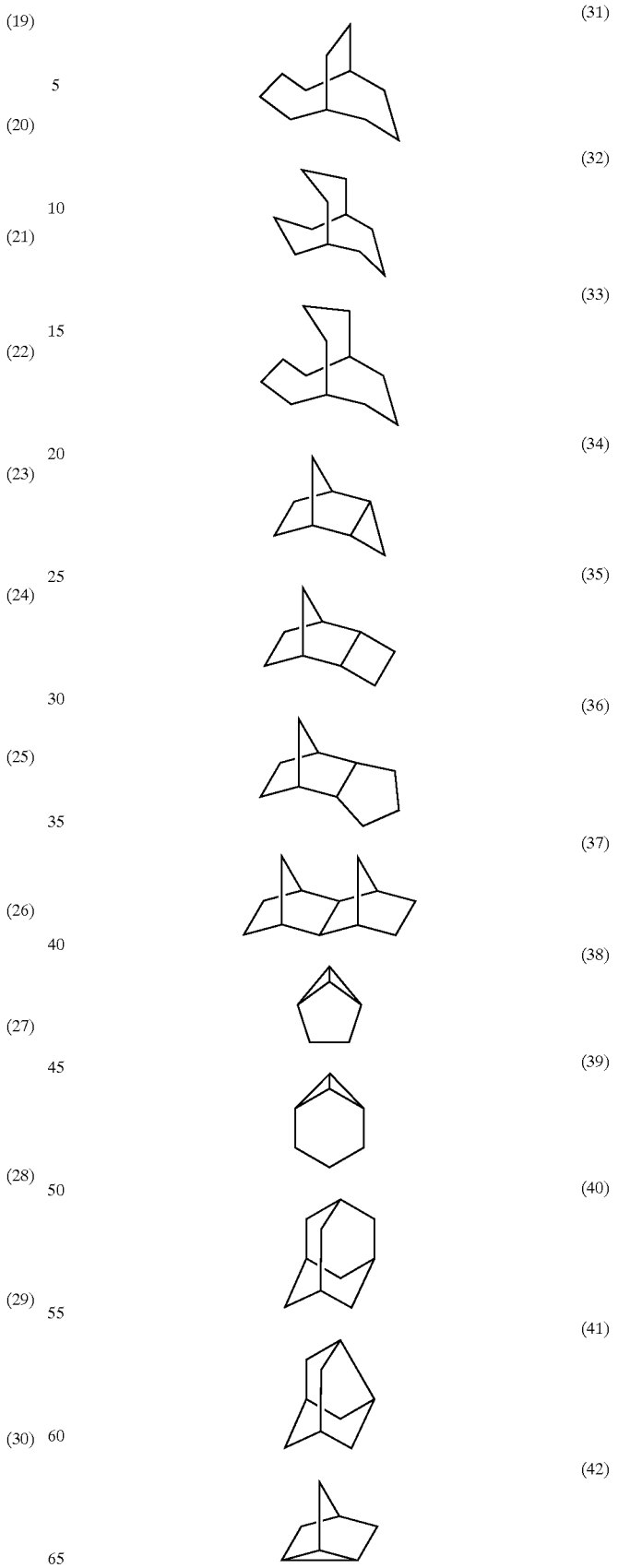

-continued

(43) 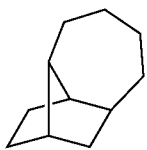

(44) 

(45) 

(46) 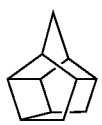

(47) 

(48) 

(49) 

(50) 

Now, the repeating unit represented by formula (V) above is described in detail below.

In formula (V), n represents 0 or 1.

Xa and Xb, which may be the same or different, each represents a hydrogen atom or an alkyl group having from 1 to 4 carbon atoms.

Ya and Yb, which may be the same or different, each represents a hydrogen atom, a hydroxy group or a group represented by —COOXc.

In one embodiment, Xc represents a hydrogen atom or an alkyl group. The alkyl group represented by Xc includes an alkyl group having from 1 to 8 carbon atoms, preferably an Ad alkyl group having from 1 to 4 carbon atoms. Specific examples of the alkyl group include methyl, ethyl, propyl, butyl and tert-butyl. The hydrogen atoms of the alkyl group may be substituted partially or wholly with a hydroxy group, By a halogen atom or a cyano group.

In another embodiment, the group represented by —COOXc represents a group constituting an acid-decomposable group. Specifically, examples of the group represented by —COOXc include groups represented by formulae (x) and (y) described above, acid-decomposable groups containing a lactone structure and acid-decomposable groups containing an alicyclic structure.

Specific examples of the repeating unit represented by any one of formulae (II) to (V) are set forth below, but the present invention should not be construed as being limited thereto.

(b1) 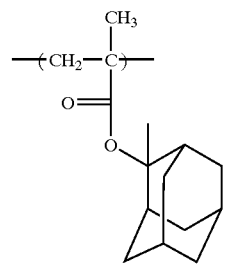

(b2) 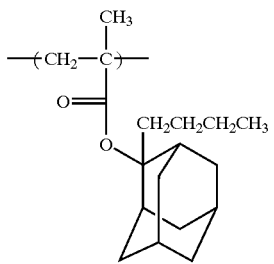

(b3) 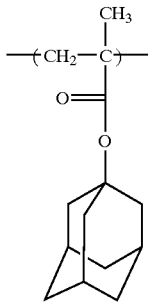

(b4) 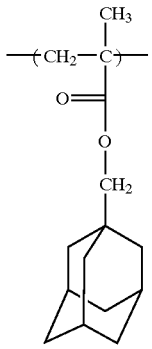

(b5) 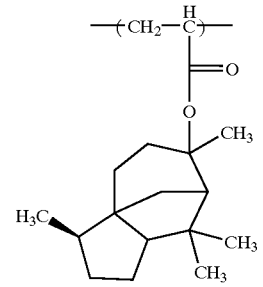

-continued
(b6)
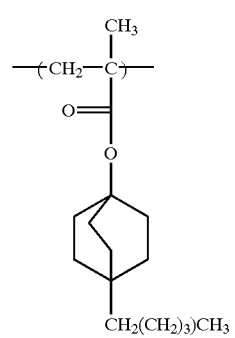
(b7)
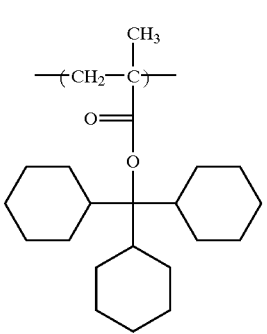
(b8)
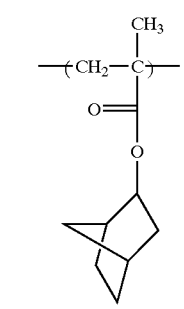
(b9)
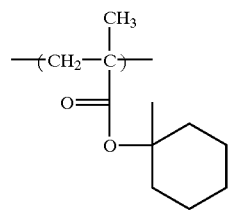
(b10)
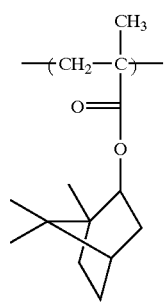
-continued
(b11)
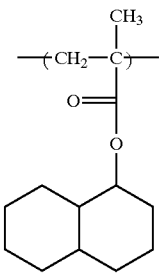
(b12)
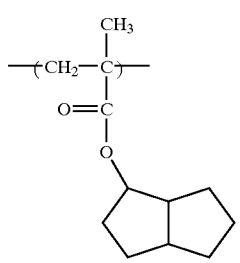
(b13)
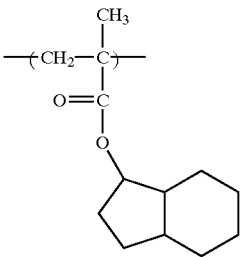
(b14)
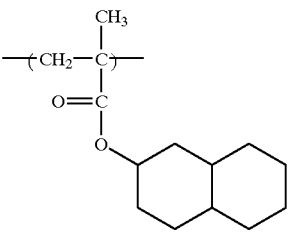
(b15)
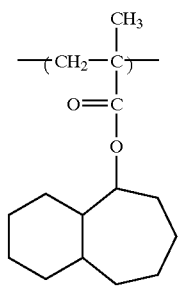
(b16)
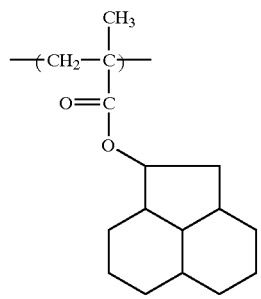

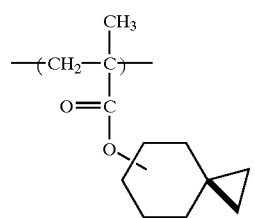
(b17)
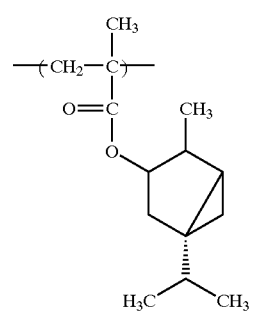
(b18)
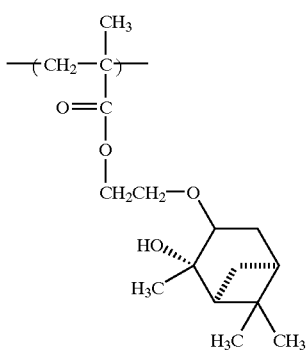
(b19)
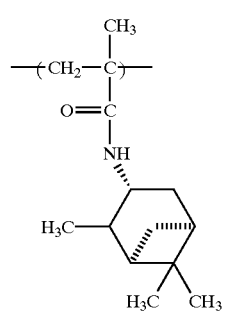
(b20)
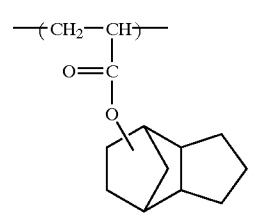
(b21)
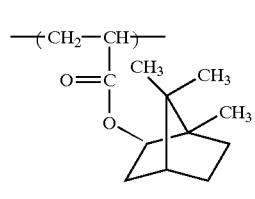
(b22)
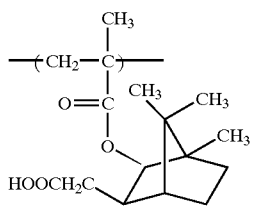
(b23)
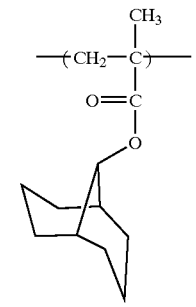
(b24)
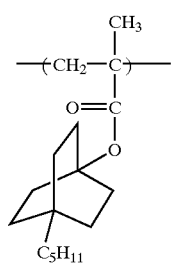
(b25)
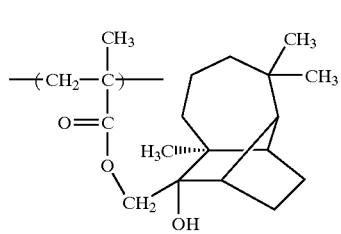
(b26)
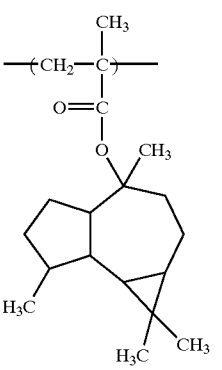
(b27)
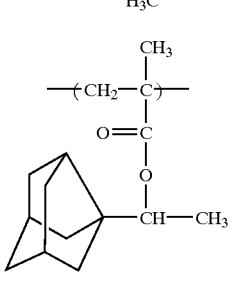
(b28)

(b29) 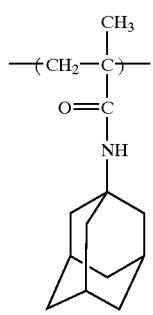
(b30) 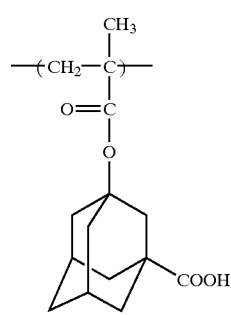
(b31) 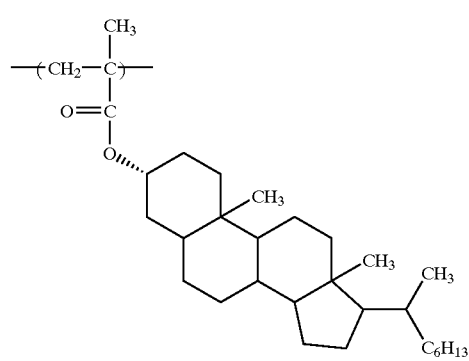
(b32) 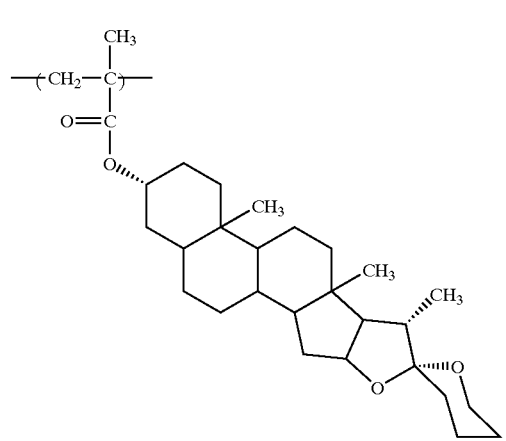
(b33) 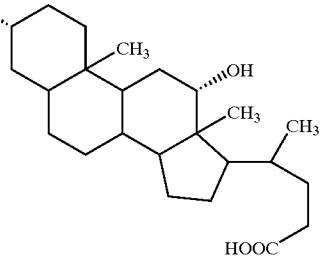
(b34) 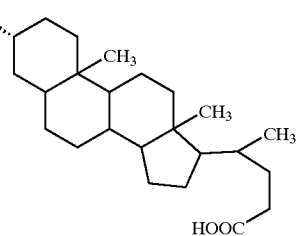
(b35) 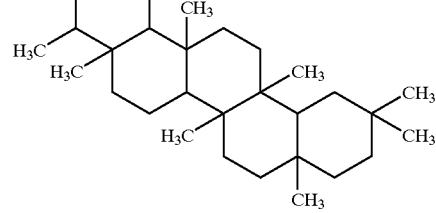
(b36) 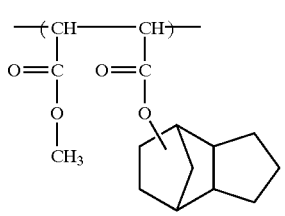

(b37) 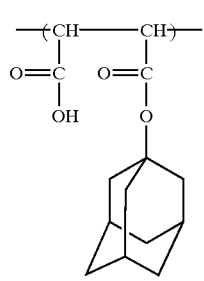
(b38) 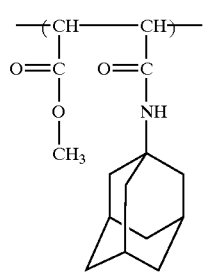
(b39) 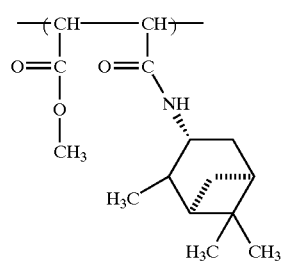
(b40) 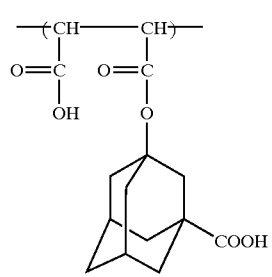
(b41) 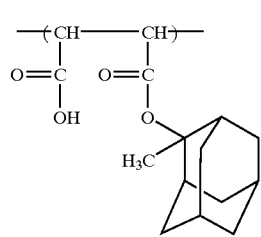
(b42) 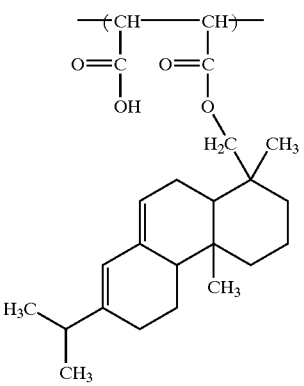
(b43) 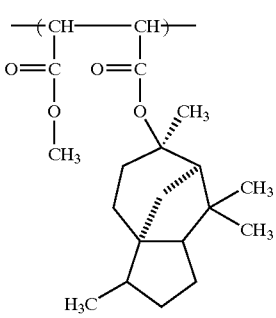
(b44) 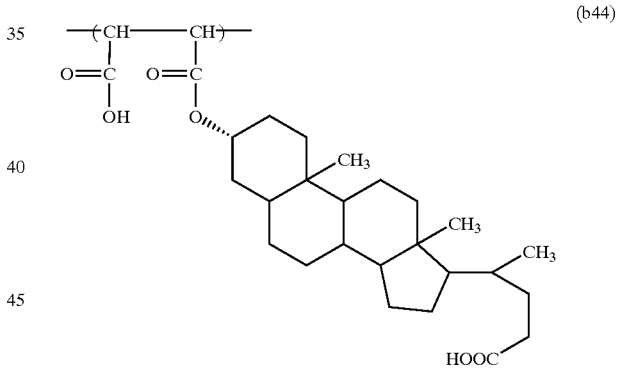
(b45) 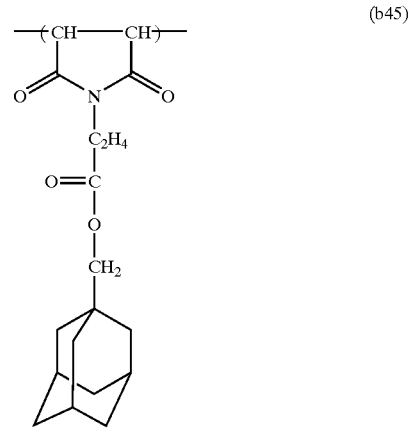

-continued (b46), (b-47), (b-48), (b-49), (b-50), (b-51), (b-52), (b53), (b54), (b55), (b56), (b57), (b58)

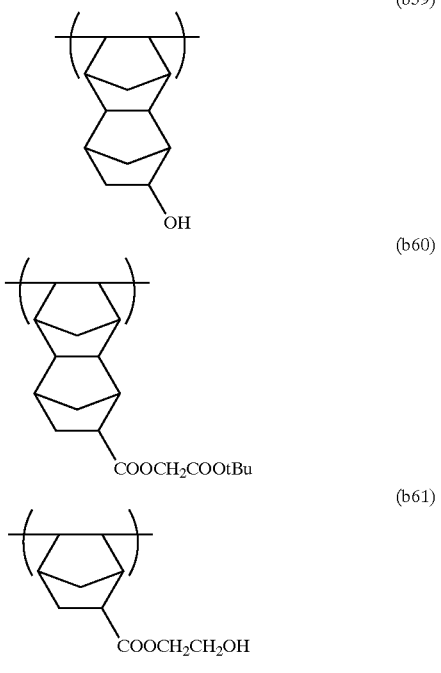

Of the repeating units (b1) to (b61) illustrated above, for example, (b1), (b2), (b5), (b9), (b47), (b48), (b49), (b50), (b54), (b58) and (b60) are preferred, since they ordinarily exhibit the acid-decomposable property. Particularly, (b1), (b47), (b48) and (b49) wherein an adamantyl group is connected to the skeleton of the resin through the acid-decomposable structure are preferred. By the use of these repeating units, dry etching resistance and resolution are further improved.

The acid-decomposable resin may further contain a carboxy group.

The carboxy group may be incorporated into any one of the repeating units described above or a repeating unit other than those repeating units.

A content of the repeating unit having a carboxy group in the acid-decomposable resin contained in the positive photosensitive composition according to the present invention may be controlled taking account of characteristics such as developing property with alkali, adhesion to a substrate, sensitivity and the like. However, the content thereof is preferably from 0 to 60% by mole, more preferably from 0 to 40% by mole, and still more preferably from 0 to 20% by mole, based on the whole repeating unit of the acid-decomposable resin.

Specific examples of the repeating unit having a carboxy group are set forth below, but the present invention should not be construed as being limited thereto.

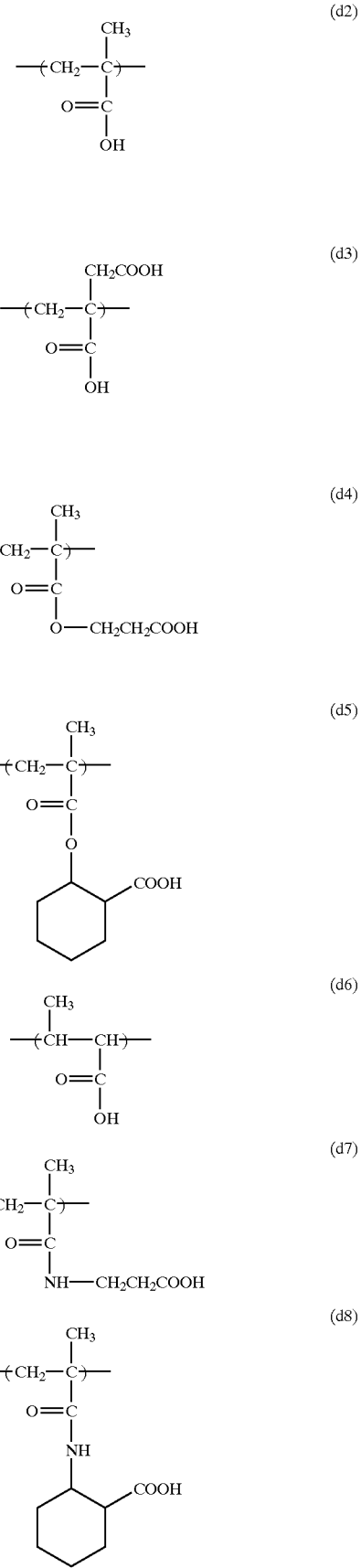

(d9) 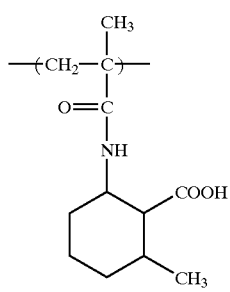

(d10) 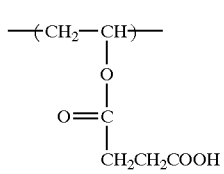

(d11) 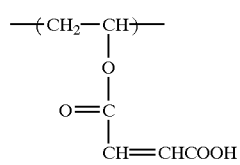

(d12) 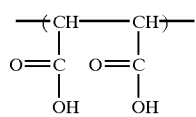

(d13) 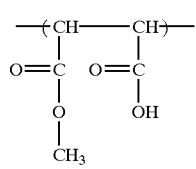

(d14) 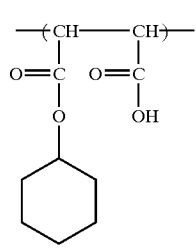

(d15) 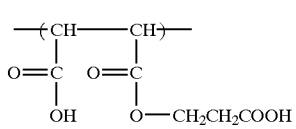

(d16) 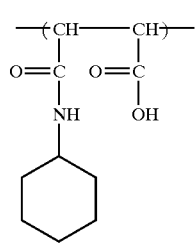

(d17) 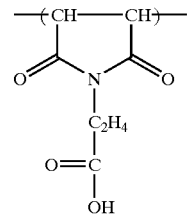

(d18) 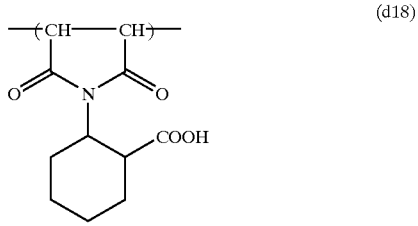

The resin (B) according to the present invention may further contain a repeating unit having a group represented by the following formula (VII):

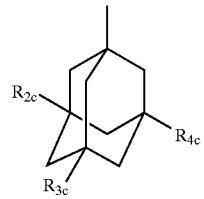

(VIII)

wherein $R_{2c}$, $R_{3c}$ and $R_{4c}$, which may be the same or different, each represents a hydrogen atom or a hydroxy group, provided that at least one of $R_{2c}$, $R_{3c}$, and $R_{4c}$, represents a hydroxy group.

The group represented by formula (VII) is preferably a dihydroxy body or a monohydroxy body and more preferably a dihydroxy body.

Examples of the repeating unit having the group represented by formulae (VII) include a repeating unit represented by formula (V) described below wherein at least one of Xa, Xb, Ya and Yb has the group represented by formulae (VII), for example, Xc of —COOXc is the group represented by formulae (VII), and a repeating unit represented by formula (AII) shown below.

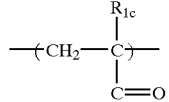

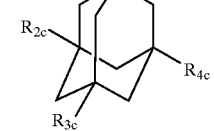

(AII)

wherein $R_{1c}$ represents a hydrogen atom or a methyl group; and $R_{2c}$, $R_{3c}$ and $R_{4c}$, which may be the same or different, each represents a hydrogen atom or a hydroxy group, provided that at least one of $R_{2c}$, $R_{3c}$ and $R_{4c}$ represents a hydroxy group.

Specific examples of the repeating unit represented by formula (AII) are set forth below, but the present invention should not be construed as being limited thereto.

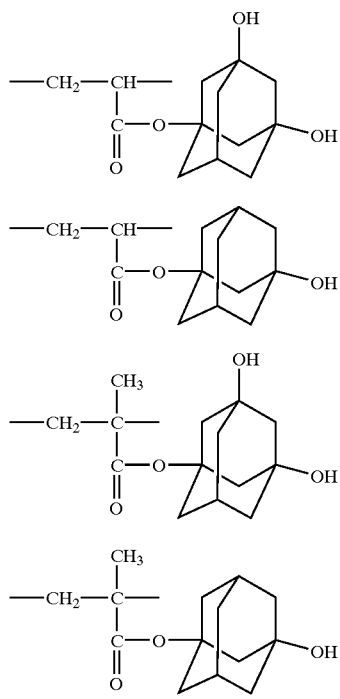

The resin according to the present invention may further contain a repeating unit having a group represented by the following formula (VIII):

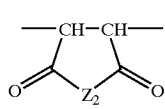

(VIII)

wherein $Z_2$ represents —O— or —N($R_{41}$)—; $R_{41}$ represents a hydrogen atom, a hydroxy group, an alkyl group, a haloalkyl group or —O—SO$_2$—$R_{42}$; and $R_{42}$ represents an alkyl group, a haloakyl group, a cycloalkyl group or a camphol residue.

Examples of the alkyl group represented by $R_{41}$ or $R_{42}$ include preferably a straight-chain or branched alkyl group having form 1 to 10 carbon atoms, more preferably a straight-chain or branched alkyl group having form 1 to 6 carbon atoms, and still more preferably methyl, ethyl, n-propyl, isopropyl, n-butyl, isobutyl, sec-butyl and tert-butyl.

Examples of the haloalkyl group represented by $R_{41}$ or $R_{42}$ include trifluoromethyl, nonafluorobutyl, pentadecafluorooctyl and trichloromethyl.

Examples of the cycloalkyl group represented by $R_{42}$ include cyclopentyl, cyclohexyl and cyclooctyl.

The alkyl group and haloalkyl group represented by $R_{41}$ or $R_{42}$ and the cycloalkyl group and camphol residue represented by $R_{42}$ may have one or more substituents.

Examples of the substituents for the alkyl group, haloalkyl group, cycloalkyl group and camphol residue include a hydroxy group, a carboxy group, a cyano group, a halogen atom (e.g., chlorine, bromine, fluorine or iodine), an alkoxy group (preferably an alkoxy group having from 1 to 4 carbon atoms, e.g., methoxy, ethoxy, propoxy or butoxy), an acyl group (preferably an acyl group having from 2 to 5 carbon atoms, e.g., formyl or acetyl), an acyloxy group (preferably an acyloxy group having from 2 to 5 carbon atoms, e.g., acetoxy) and an aryl group (preferably an aryl group having from 6 to 14 carbon atoms, e.g., phenyl). Specific examples of the repeating unit represented by formula (VIII) are set forth below as formulae [I'-1] to [I'-7], but the present invention should not be construed as being limited thereto.

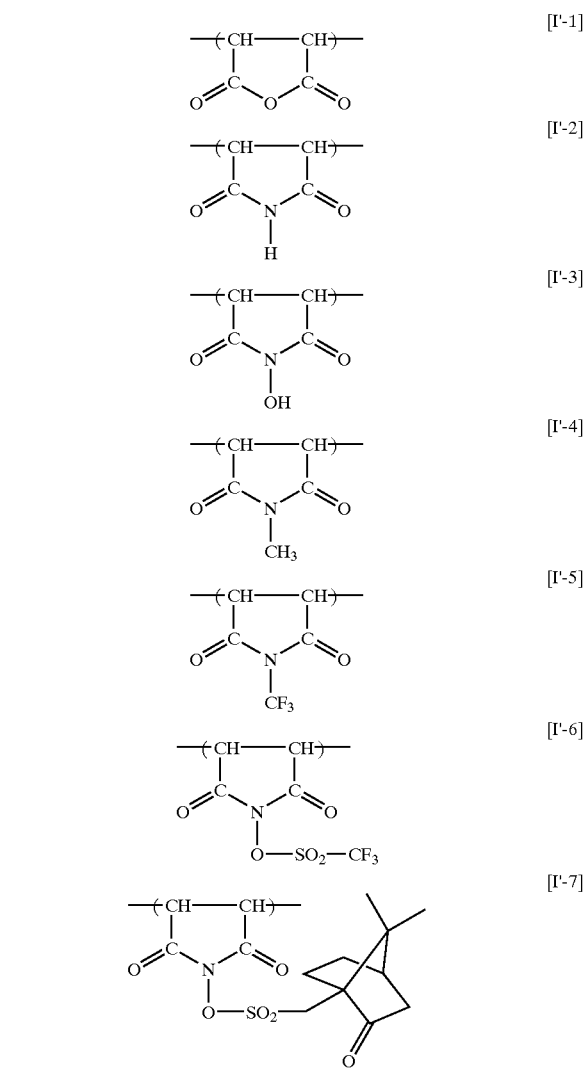

For the purpose of improving characteristics of the acid-decomposable resin for use in the photosensitive composition according to the present invention, one or more other monomers may further be copolymerized to the extent of not severely impairing transparency in a wavelength range of 220 nm or less and dry etching resistance of the resin.

Examples of the copolymerizable monomer which can be used include compounds having one addition-polymerizable unsaturated bond, selected, for example, from acrylic acid esters, acrylamides, methacrylic acid esters, methacrylamides, allyl compounds, vinyl ethers, vinyl esters, styrenes and crotonic acid esters.

Specific examples thereof include acrylic acid esters, for example, an alkyl acrylate (wherein the alkyl group preferably has from 1 to 10 carbon atoms) (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, or tetrahydrofurfuryl acrylate), an aryl acrylate and methoxyethoxyethyl acrylate; methacrylic acid esters, for example, an alkyl methacrylate (wherein the alkyl group preferably has from 1 to 10 carbon atoms) (e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, or tetrahydrofurfuryl methacrylate), an aryl methacrylate (e.g., phenyl methacrylate, or naphthyl methacrylate) and methoxyethoxyethyl methacrylate; acrylamides, for example, acrylamide, an N-alkylacrylamide (wherein the alkyl group includes an alkyl group having from 1 to 10 carbon atoms, for example, methyl, ethyl, propyl, butyl, tert-butyl, heptyl, octyl, cyclohexyl, benzyl, hydroxyethyl or benzyl), an N-arylacrylamide, an N,N-dialkylacrylamide (wherein the alkyl group includes an alkyl group having from 1 to 10 carbon atoms, for example, methyl, ethyl, butyl, isobutyl, ethylhexyl or cyclohexyl), an N,N-diarylacrylamide, N-hydroxyethyl-N-methylacrylamide and N-2-acetamidoethyl-N-acetylacrylamide; methacrylamides, for example, methacrylamide, an N-alkylmethacrylamide (wherein the alkyl group includes an alkyl group having from 1 to 10 carbon atoms, for example, methyl, ethyl, tert-butyl, ethylhexyl, hydroxyethyl or cyclohexyl), an N-arylmethacrylamide, an N,N-dialkylmethacrylamide (wherein the alkyl group includes, for example, ethyl, propyl and butyl), N-hydroxyethyl-N-methylmethacrylamide, N-methyl-N-phenylmethacrylamide and N-ethyl-N-phenylmethacrylamide; allyl compounds, for example, an allyl ester (e.g., allyl acetate, allyl caproate, allyl caprylate, allyl laurate, allyl palmitate, allyl stearate, allyl benzoate, allyl acetoacetate, or allyl lactate) and allyloxyethanol; crotonic acid esters, for example, an alkyl crotonate (e.g., butyl crotonate, hexyl crotonate, or glycerin mono-crotonate); dialkyl itaconates (e.g., dimethyl itaconate, diethyl itaconate, or dibutyl itaconate); dialkyl esters of maleic acid or fumaric acid (e.g., dimethyl maleate, or dibutyl fumarate); maleic anhydride; maleimide; acrylonitrile; methacrylonitrile; and maleonitrile.

In addition, addition-polymerizable unsaturated compounds which can be copolymerized may be used, in general.

Of these monomers, methoxyethoxyethyl methacrylate and methoxyethoxyethyl acrylate are particularly preferred.

The content of repeating unit corresponding to the other polymerizable monomers in the acid-decomposable resin according to the present invention is preferably not more than 50% by mole, more preferably not more than 30% by mole, based on the whole repeating unit.

It is preferred that the acid-decomposable resin according to the present invention does not contain an aromatic ring in order to ensure the transparency of an actinic ray or radiation. If the transparency of an actinic ray or radiation is decreased by the introduction of aromatic ring, exposure light hardly reaches to the bottom of resist film and as a result, a taper pattern profile is formed.

A content of the repeating unit having an acid-decomposable group in the acid-decomposable resin according to the present invention is controlled taking account of the balance of the dry etching resistance, developing property with alkali and the like. However, the content thereof is preferably 20% by mole or more, more preferably 30% by mole or more, and still more preferably 40% by mole or more, based on the whole repeating unit.

A content of the repeating unit having an cyclic hydrocarbon group (preferably a repeating unit represented by any one of formulae (II) to (V)) in the acid-decomposable resin according to the present invention is controlled taking account of the balance of the dry etching resistance, developing property with alkali and the like. However, the content thereof is preferably 20% by mole or more, more preferably from 30 to 80% by mole, still more preferably from 35 to 70% by mole, and still more preferably from 40 to 60% by mole, based on the whole repeating unit.

A content of the repeating unit having a lactone structure in the acid-decomposable resin according to the present invention is controlled taking account of the balance of the dry etching resistance, developing property with alkali and the like. However, the content thereof is preferably 20% by mole or more, more preferably from 30 to 80% by mole, still more preferably from 35 to 70% by mole, and still more preferably from 40 to 60% by mole, based on the whole repeating unit.

In the acid-decomposing resin, the content of the repeating unit having a group shown by one of the formulae (V-1) to (V-4) is preferably from 1 to 80 mol %, more preferably from 10 to 70 mol %, and far more preferably from 30 to 60 mol % in the whole repeating structure units.

In the acid-decomposing resin, the content of the repeating unit shown by the formula (VI) is preferably from 1 to 70 mol %, more preferably from 10 to 60 mol %, and far more preferably from 20 to 50 mol % in the whole repeating structure units.

In the acid-decomposing resin, the content of the repeating unit having a group shown by the formula (VII) is preferably from 1 to 40 mol %, more preferably from 5 to 35 mol %, far more preferably from 5 to 30 mol % in the whole repeating structure units.

In the acid-decomposing resin, the content of the repeating unit shown by the formula (VIII) is preferably from 15 to 55 mol %, more preferably from 19 to 51 mol % in the whole repeating structure units.

In the present invention, an amount of the resin (B) which is decomposed by the action of an acid to increase solubility in an alkali developer is ordinarily from 20 to 99.8% by weight, preferably from 50 to 99.5% by weight, based on the whole composition excluding a solvent or the whole solid content of the photosensitive composition.

A weight average molecular weight of the acid-decomposable resin for use in the present invention which is measured by GPC method and calculated in terms of polystyrene is preferably in a range of from 1,000 to 100,000, more preferably from 2,000 to 50,000, and still more preferably from 3,000 to 30,000. A degree of dispersion is preferably from 1.0 to 5.0, more preferably from 1.0 to 3.0.

(C) Onium Salt of Carboxylic Acid

The onium salt of carboxylic acid (C) according to the present invention includes, for example, a sulfonium salt of carboxylic acid, an iodonium salt of carboxylic acid and an ammonium salt of carboxylic acid.

The onium salt of carboxylic acid for use in the present invention includes compounds represented by any one of formulae (AI) to (AVI) shown below.

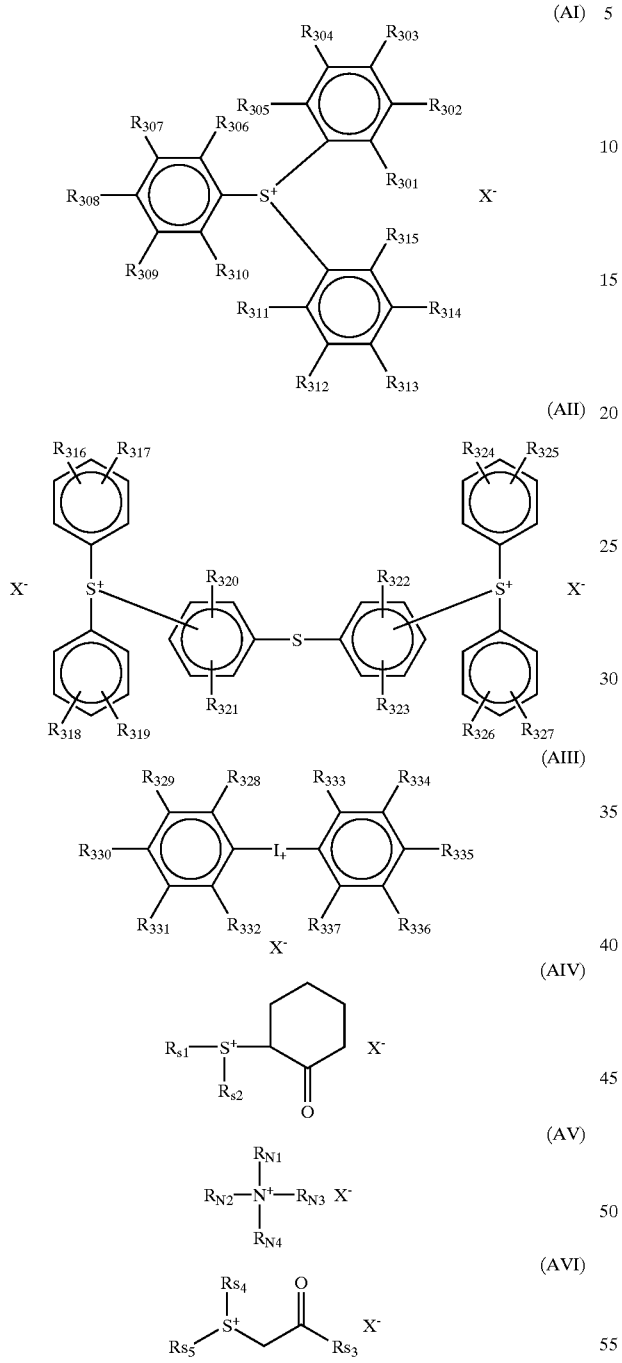

In formulae (AI) to (AVI), $R_{301}$ to $R_{337}$, which are the same or different, each represents a hydrogen atom, a straight-chain, branched or cyclic alkyl group, a straight-chain, branched or cyclic alkoxy group, a hydroxy group, a halogen atom or —S—$R_0$, and $R_0$ represents a straight-chain, branched or cyclic alkyl group or an aryl group.

$R_{s1}$ and $R_{s2}$, which are the same or different, each represents a straight-chain, branched or cyclic alkyl group.

$R_{N1}$ to $R_{N4}$, which are the same or different, each represents a straight-chain, branched or cyclic alkyl group which may be substituted. Two of $R_{N1}$ to $R_{N4}$ may be connected with each other to form a ring. Further, one of $R_{N1}$ to $R_{N4}$ may be connected with $X^-$ in the molecule.

$R_{s3}$ to $R_{s5}$, which are the same or different, represent a straight-chain, branched or cyclic alkyl group which may be substituted or an aryl group which may be substituted. The onium salt represented by formula (AVI) may contain two of the sulfonium salt structures.

$X^-$ represents an anion derived from a carboxylic acid compound represented by any one of the following formulae (C1) to (C10):

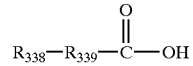

(C1)

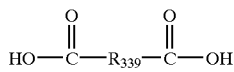

(C2)

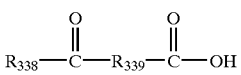

(C3)

(C4)

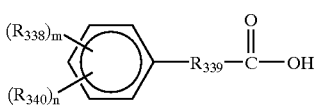

(C5)

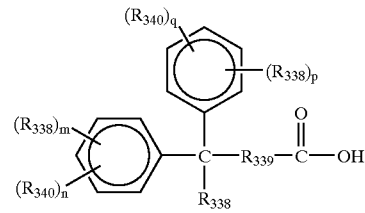

(C6)

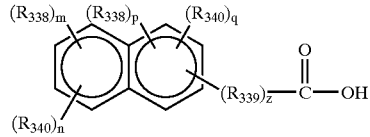

(C7)

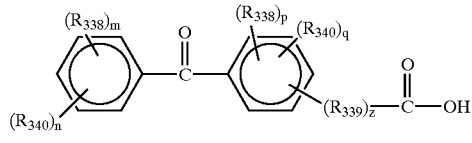

(C8)

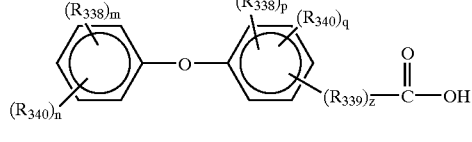

(C9)

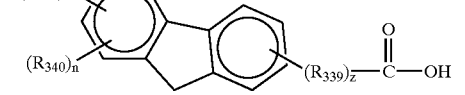

(C10)

In formulae (C1) to (C10), $R_{338}$ represents a substituted or unsubstituted, straight-chain or branched alkyl group having from 1 to 30 carbon atoms, a substituted or unsubstituted cycloalkyl group having from 3 to 30 carbon atoms (the alkyl group or cycloalkyl group may contain at least one of an oxygen atom and a nitrogen atom in the alkyl chain thereof), a straight-chain, branched or cyclic alkenyl group having from 2 to 20 carbon atoms, a straight-chain, branched or cyclic alkynyl group having from 2 to 20 carbon atoms, a straight-chain, branched or cyclic alkoxy group having from 1 to 20 carbon atoms, a substituted or unsubstituted aryl group having from 6 to 20 carbon atoms, a halogen atom, a nitro group or a camphol residue.

At least one part of the hydrogen atoms of the alkyl group or cycloalkyl group may be substituted with one or more of halogen atoms and hydroxy groups. At least one part of the hydrogen atoms of the alkenyl group may be substituted with one or more of halogen atoms and hydroxy groups.

Examples of the substituent for the aryl group include an alkyl group, a nitro group, a hydroxy group, an alkoxy group, an acyl group, an alkoxycarbonyl group and a halogen atom.

$R_{339}$ represents a single bond, a straight-chain, branched or cyclic alkylene group having from 1 to 20 carbon atoms (the alkylene group may contain an oxygen atom and/or a nitrogen atom in the alkyl chain thereof), a straight-chain, branched or cyclic alkenylene group having from 2 to 20 carbon atoms or an alkoxyalkylene group having from 2 to 20 carbon atoms.

At least one part of the hydrogen atoms of the alkylene group may be substituted with one or more of halogen atoms and hydroxy groups. At least one part of the hydrogen atoms of the alkenylene group may be substituted with one or more of halogen atoms and hydroxy groups.

$R_{340}$ represents a hydroxy group or a halogen atom.

Two or more of $R_{338}$'s, $R_{339}$'s and $R_{340}$'s may be the same or different, respectively.

m, n, p and q, which may be the same or different, each represents an integer of from 0 to 3, provided that $m+n \leq 5$ and $p+q \leq 5$. z represents 0 or 1.

Examples of the straight-chain or branched alkyl group represented by any one of $R_{301}$ to $R_{337}$, $R_{s1}$ to $R_{s5}$, $R_{N1}$ to $R_{N4}$ in formulae (AI) to (AVI) include an alkyl group having from 1 to 4 carbon atoms which may be substituted, e.g., methyl, ethyl, propyl, n-butyl, sec-butyl and tert-butyl.

Examples of the cyclic alkyl group represented by any one of $R_{301}$ to $R_{337}$, $R_{s1}$ to $R_{s5}$, $R_{N1}$ to $R_{N4}$ include a cycloalkyl group having from 3 to 8 carbon atoms which may be substituted, e.g., cyclopropyl, cyclopentyl and cyclohexyl.

Examples of the alkoxy group represented by any one of $R_{301}$ to $R_{337}$ include an alkoxy group having from 1 to 4 carbon atoms which may be substituted, e.g., methoxy, ethoxy, hydroxyethoxy, propoxy, n-butoxy, isobutoxy, sec-butoxy and tert-butoxy.

Examples of the halogen atom represented by any one of $R_{301}$ to $R_{337}$ include fluorine, chlorine, bromine and iodine.

Examples of the aryl group represented by any one of $R_0$ and $R_{s3}$ to $R_{s5}$ include an aryl group having from 6 to 14 carbon atoms which may be substituted, e.g., phenyl, tolyl, metoxyphenyl and naphthyl.

Preferred examples of the substituents for the above described groups include an alkoxy group having from 1 to 4 carbon atoms, a halogen atom (e.g., fluorine, chlorine or iodine), an aryl group having from 6 to 10 carbon atoms, an alkenyl group having from 2 to 6 carbon atoms, a cyano group, a hydroxy group, a carboxy group, an alkoxycarbonyl group and a nitrogroup.

Examples of the ring formed by connecting two of $R_{N1}$ to $R_{N4}$ each other include an aromatic ring and a monocyclic or polycyclic hydrocarbon ring (the ring may contain an oxygen atom and/or a nitrogen atom), e.g., benzene ring, naphthalene ring, cyclohexan ring, norbornene ring and oxabicyclo ring.

The sulfonium, iodonium and ammonium compounds represented by any one of formulae (AI) to (AVI) each contains as the counter anion of $X^-$, an anion ($—COO^-$) derived from the carboxy group ($—COOH$) of carboxylic acid compound represented by any one of formulae (C1) to (C10) described above.

Examples of the straight-chain or branched alkyl group having from 1 to 30 carbon atoms (the alkyl group may contain an oxygen atom and/or a nitrogen atom in the alkyl chain thereof) represented by $R_{338}$ include methyl, ethyl, propyl, butyl, pentyl, hexyl, dodecyl, 2-ethoxyethyl and 2-hydroxyethyl.

Examples of the cycloalkyl group having from 3 to 30 carbon atoms include a monocyclic or polycyclic alicyclic group, e.g., cyclohexyl, adamantyl, cyclopentyl and a group containing a bicyclo ring, oxabicyclo ring or tricyclo ring.

Examples of representative structure of the monocyclic or polycyclic alicyclic moiety present in the monocyclic or polycyclic alicyclic group are set forth below.

(1)

(2)

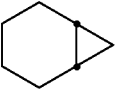

(3)

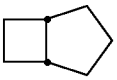

(4)

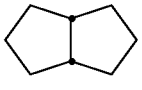

(5)

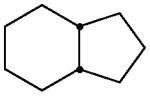

(6)

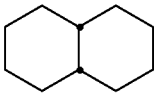

(7)

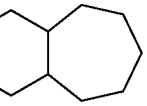

(8)

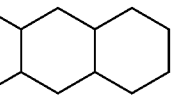

(9)

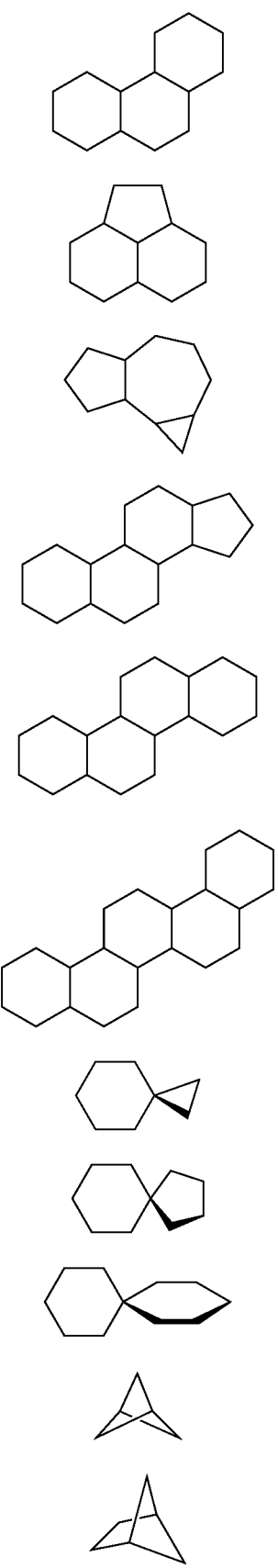
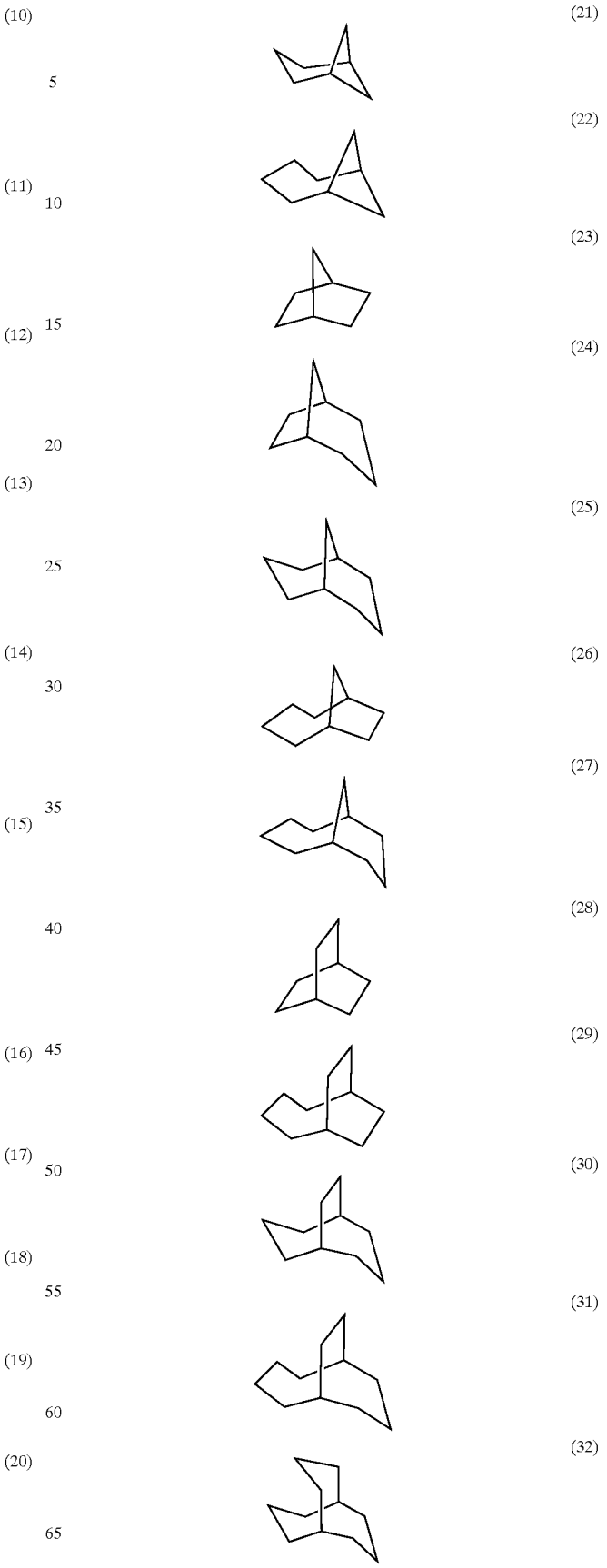

-continued

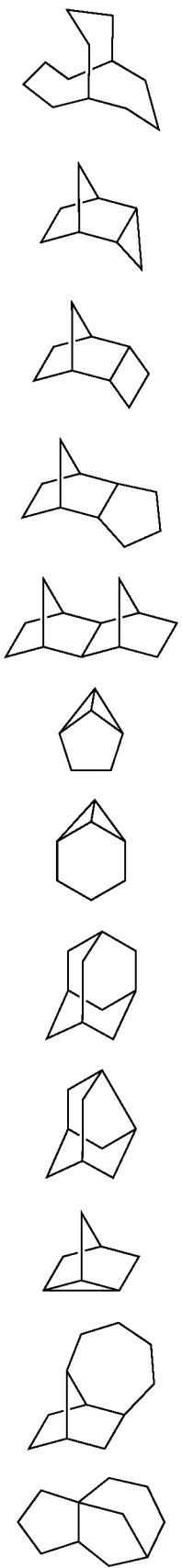

(33)
(34)
(35)
(36)
(37)
(38)
(39)
(40)
(41)
(42)
(43)
(44)

-continued

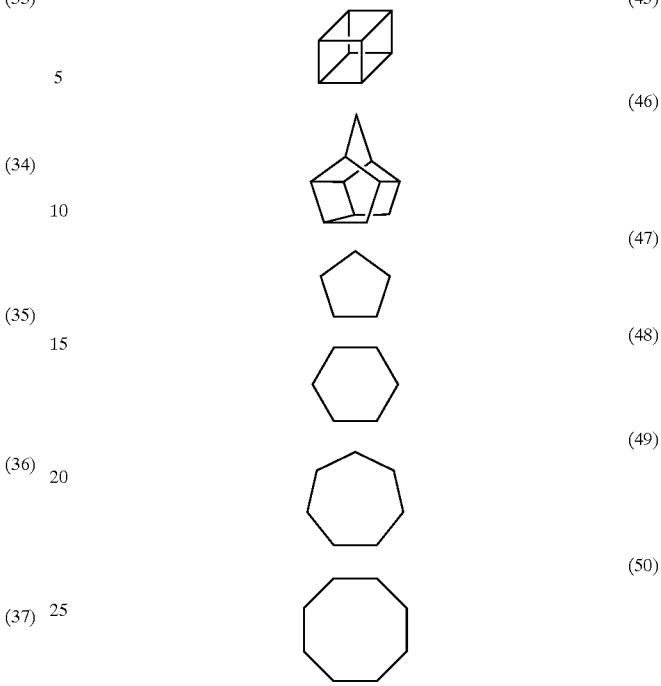

(45)
(46)
(47)
(48)
(49)
(50)

Examples of the straight-chain, branched or cyclic alkenyl group having from 2 to 20 carbon atoms include ethenyl, propenyl, isopropenyl and cyclohexyenyl.

Examples of the straight-chain, branched or cyclic alkynyl group having from 2 to 20 carbon atoms include ethynyl and propynyl.

Examples of the straight-chain, branched or cyclic alkoxy group having from 1 to 20 carbon atoms include methoxy, ethoxy, propoxy, butoxy, cyclohexyloxy, isobutoxy and dodecyloxy.

Examples of the substituted or unsubstituted aryl group having from 6 to 20 carbon atoms include phenyl, naphthyl and anthracenyl.

Examples of the substituents for the straight-chain or branched alkyl group, cycloalkyl group and aryl group include an alkyl group, a nitro group, a hydroxy group, an alkoxy group, an acyl group, an alkoxycarbonyl group and a halogen atom.

Examples of the straight-chain, branched or cyclic alkylene group having from 1 to 20 carbon atoms (the alkylene group may contain an oxygen atom and/or a nitrogen atom in the alkyl chain thereof) represented by $R_{339}$ include methylene, ethylene, propylene, butylene, isobutylene, ethoxyethylene and cyclohexylene.

Examples of the straight-chain, branched or cyclic alkenylene group having from 1 to 20 carbon atoms include vinylene and allylene.

Of the onium salts of carboxylic acid (C), the iodonium salts and sulfonium salts are preferred in the present invention.

It is also preferred that the carboxylate residue of the onium salt of carboxylic acid according to the present invention contains neither an aromatic group nor a carbon atom-carbon atom double bond.

Of the anions represented by $X^-$, alkyl group-containing carboxylic acid anions wherein the alkyl group is a straight-chain, branched, monocyclic or polycyclic alkyl group containing from 1 to 30 carbon atoms are more preferred. Alkyl group-containing carboxylic acid anions wherein the hydrogen atoms of the alkyl group are partially or wholly substituted with fluorine are still more preferred. The alkyl chain may contain one or more oxygen atoms. Using such anions, transparency of light having a wavelength range of not more than 220 nm is ensured, and sensitivity, resolution, pitch dependency and exposure margin are further improved.

Examples of the fluorinated alkyl group-containing carboxylic acid anion include anions of monofluoroacetic acid, difluoroacetic acid, trifluoroacetic acid, pentafluoropropionic acid, heptafluorobutylic acid, nonafluoropentanoic acid, perfluorododecanoic acid, perfluorotridecanoic acid, perfluorocyclohexanecarboxylic acid and 2,2-bistrifluoromethylpropionic acid.

Specific examples of the onium salt of carboxylic acid (C) for use in the present invention are set forth below, but the present invention should not be construed as being limited thereto.

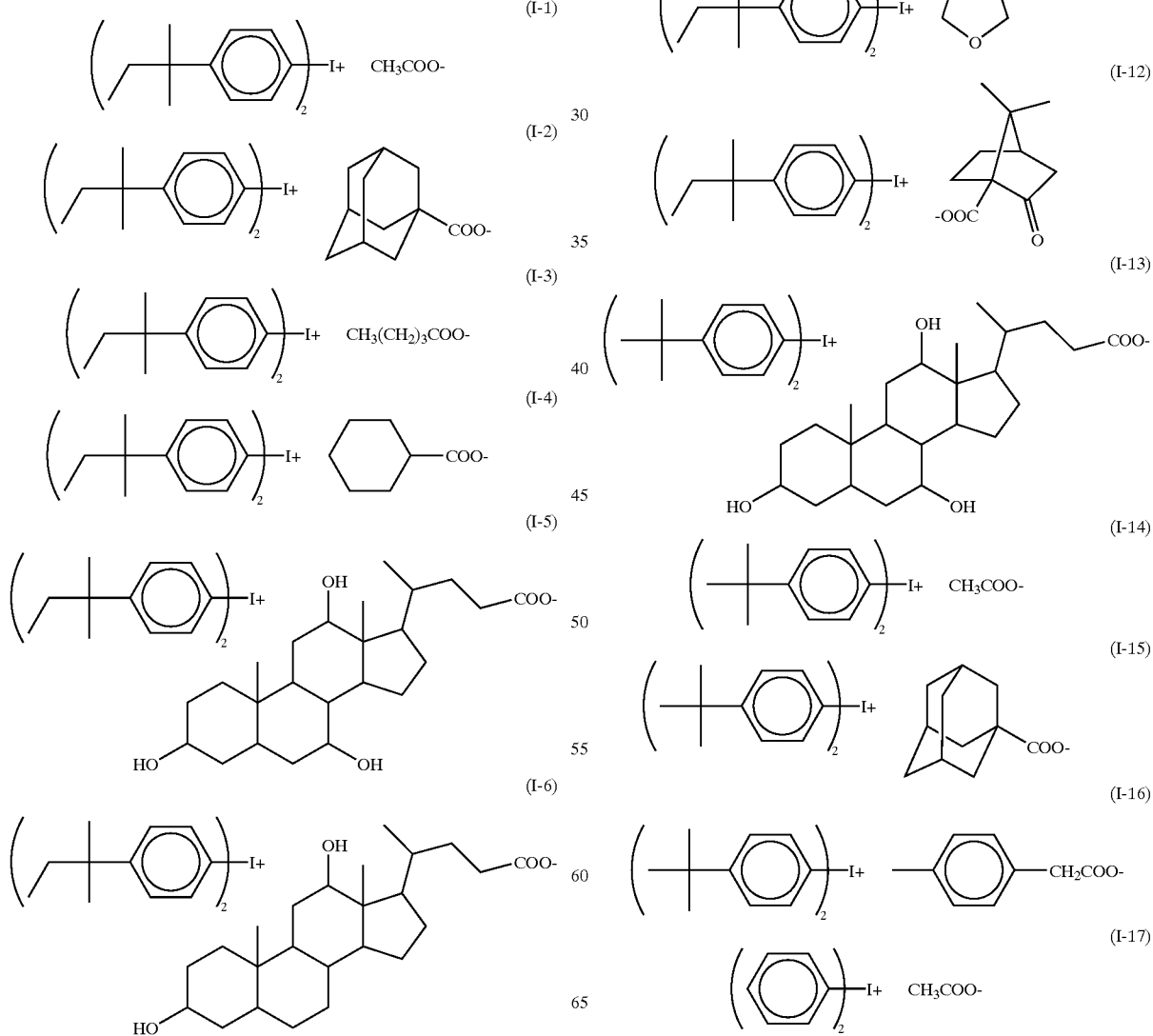

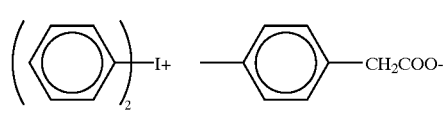 (I-18)
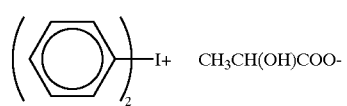 (I-19)
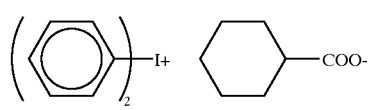 (I-20)
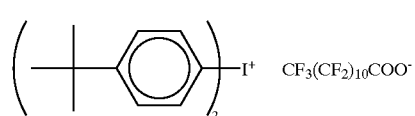 (I-21)
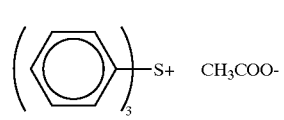 (II-1)
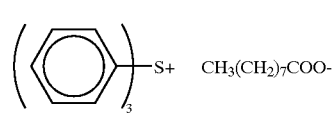 (II-2)
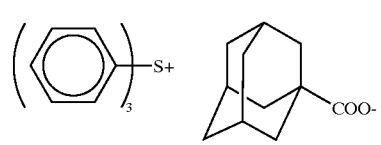 (II-3)
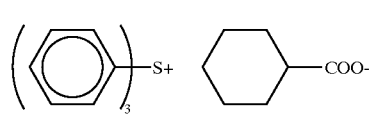 (II-4)
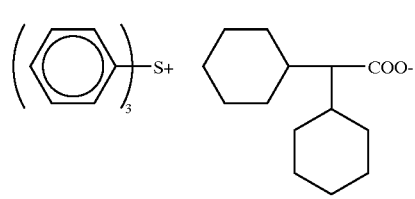 (II-5)
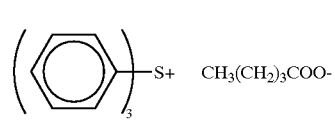 (II-6)
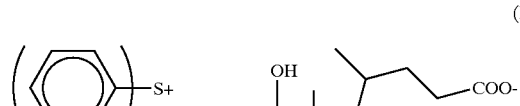 (II-7)
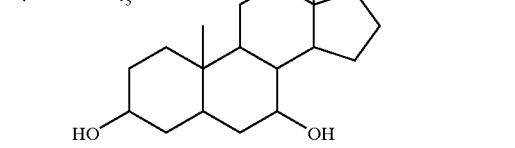 (II-8)
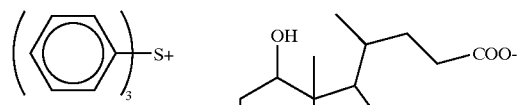 (II-9)
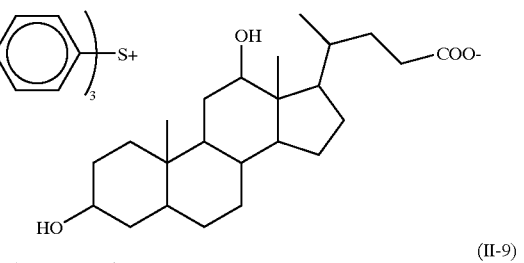 (II-10)
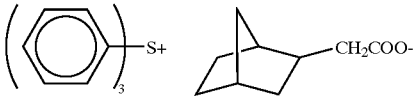 (II-11)
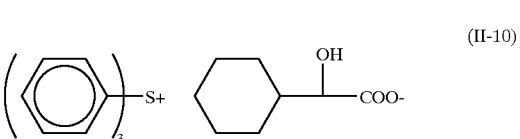 (II-12)
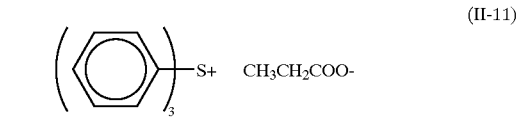 (II-13)
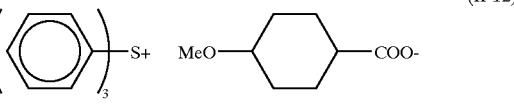 (II-14)
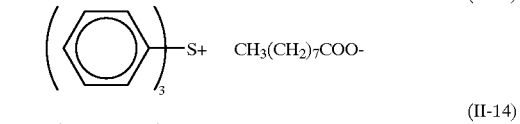 (II-15)
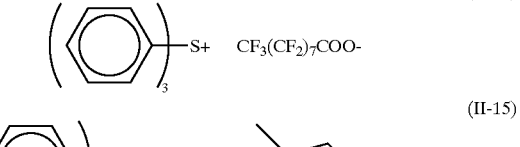 (II-16)
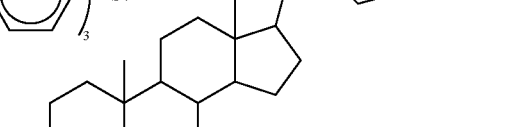 (II-17)
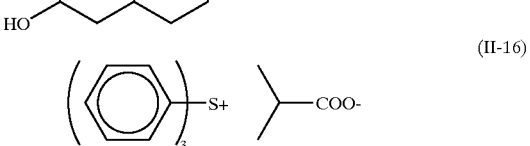 (II-18)
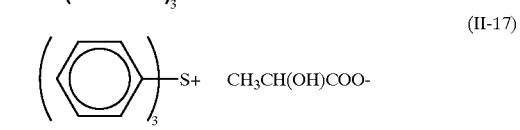
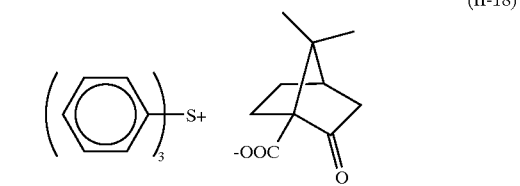

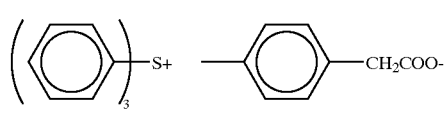
(II-19)
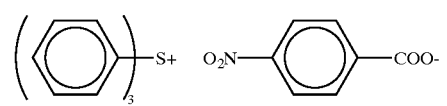
(II-20)
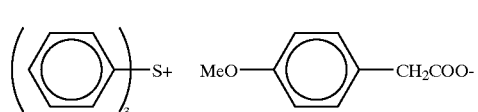
(II-21)
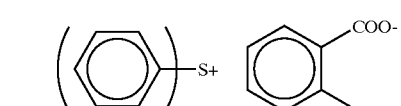
(II-22)
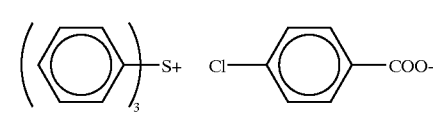
(II-23)
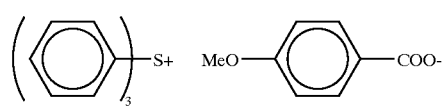
(II-24)
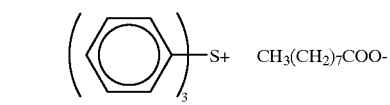
(II-25)
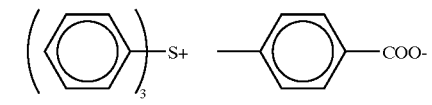
(II-26)
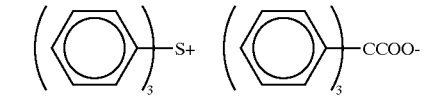
(II-27)
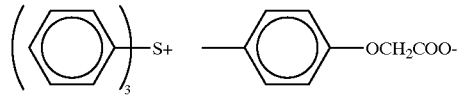
(II-28)
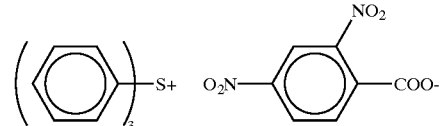
(II-29)
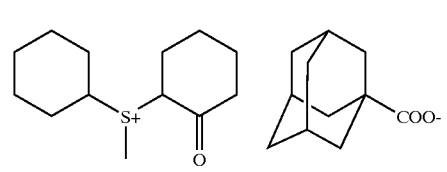
(II-30)
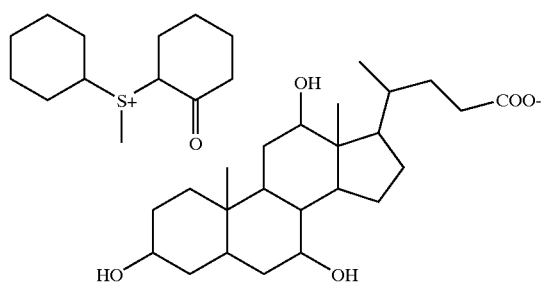
(II-31)
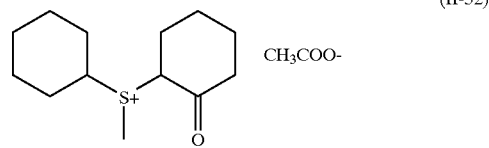
(II-32)
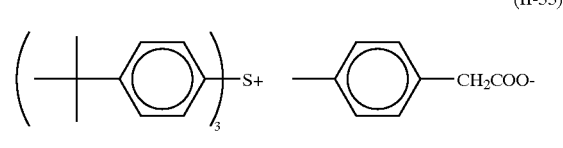
(II-33)
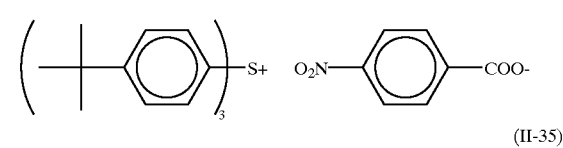
(II-34)
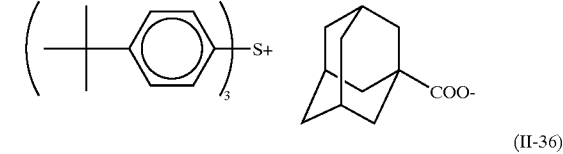
(II-35)
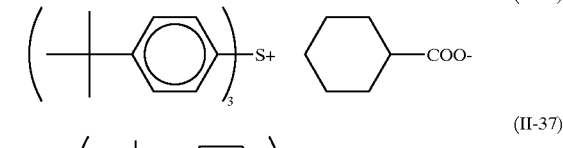
(II-36)
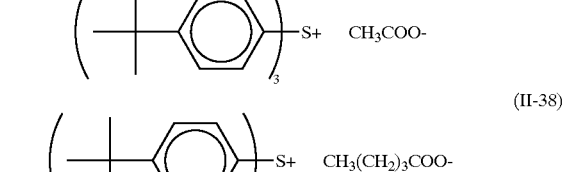
(II-37)
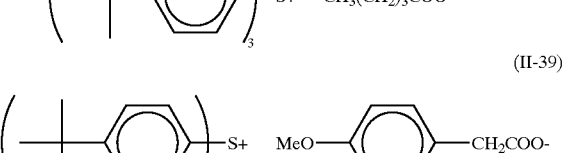
(II-38)
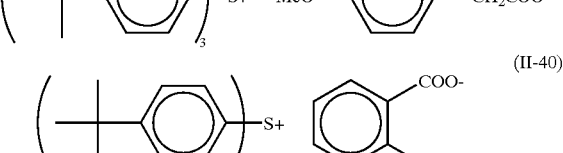
(II-39)
(II-40)

(II-41)
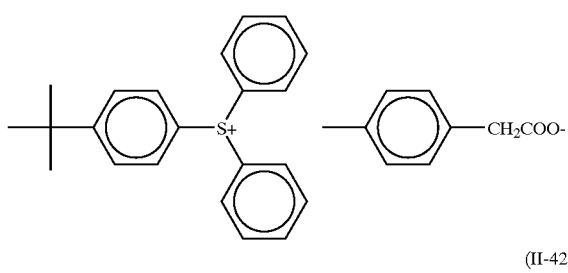
(II-42)
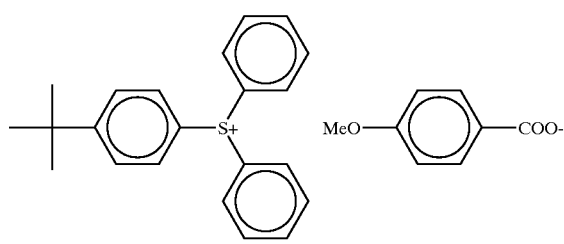
(II-43)
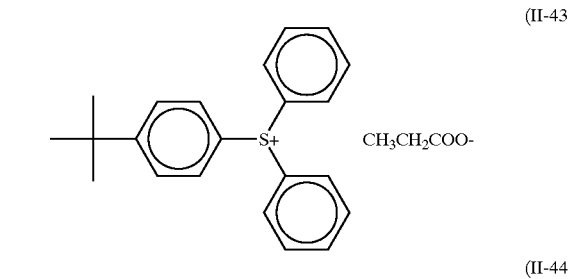
(II-44)
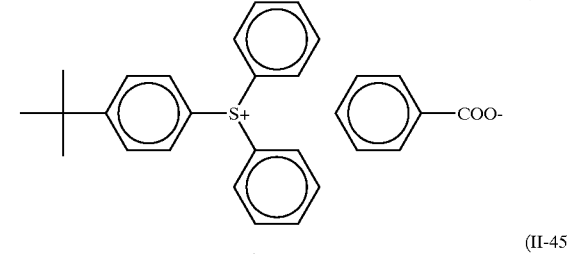
(II-45)
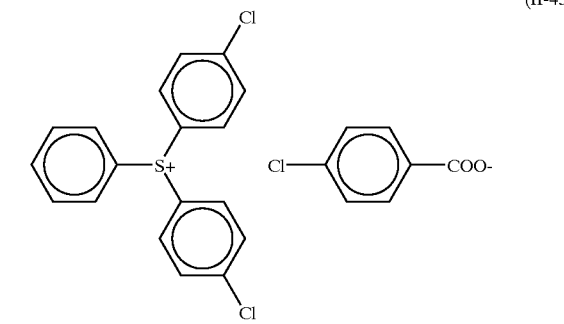
(II-46)
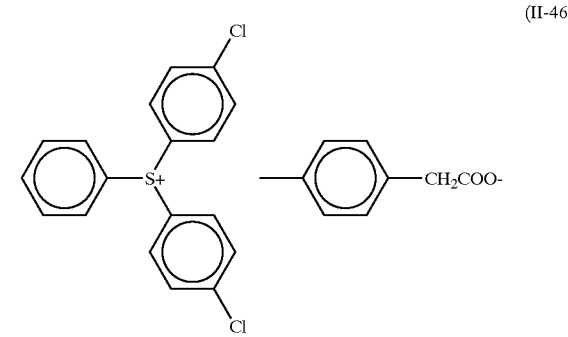
(II-47)
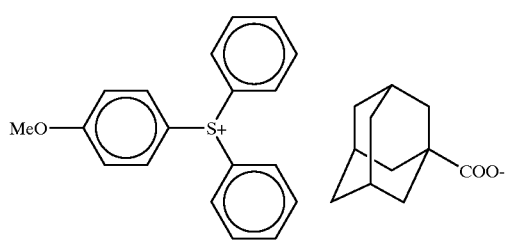
(II-48)
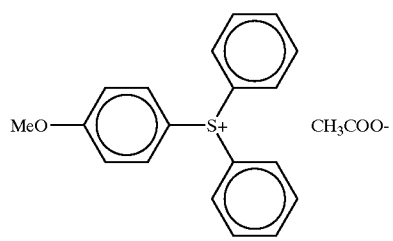
(II-49)
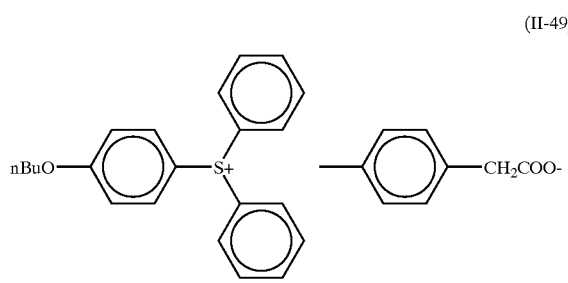
(II-50)
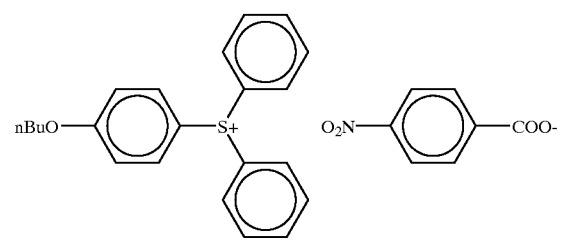
(II-51)
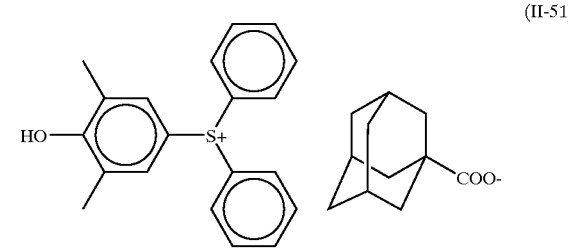
(II-52)
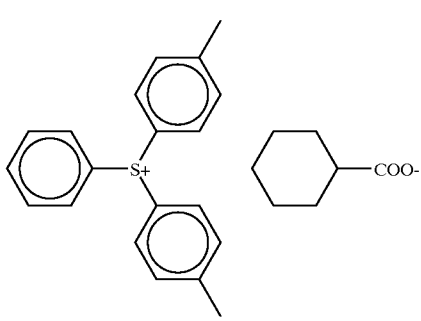

(II-53)
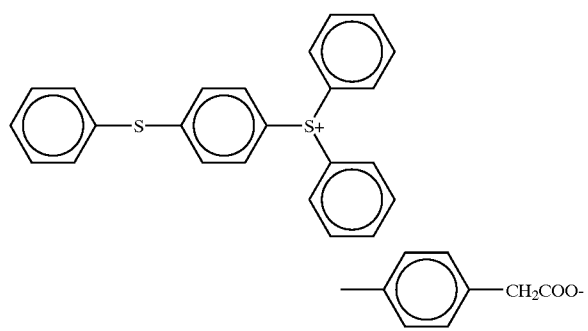
(II-54)
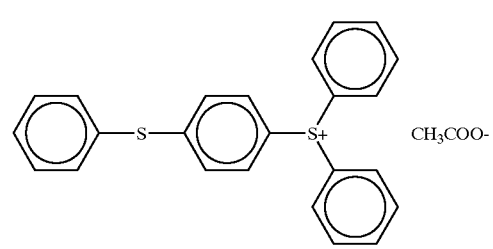
(II-55)
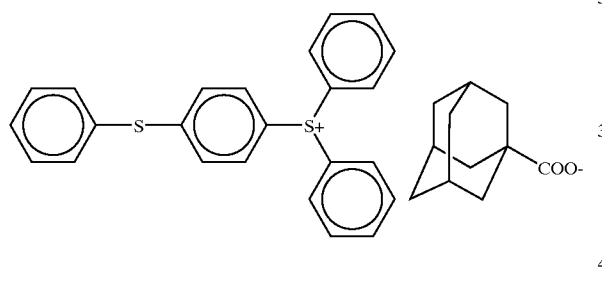
(II-56)
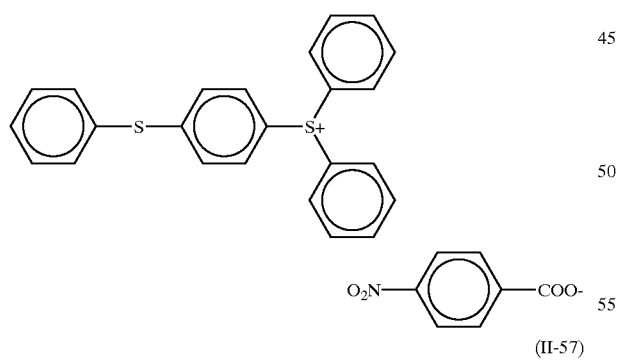
(II-57)
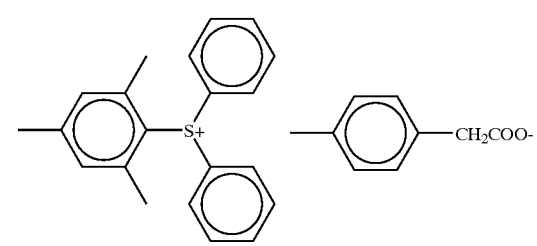
(II-58)
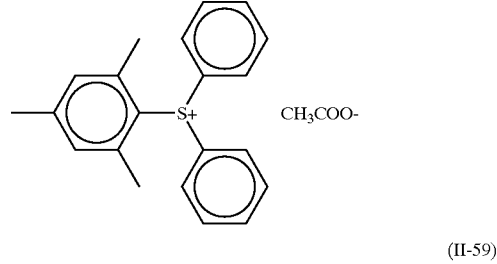
(II-59)
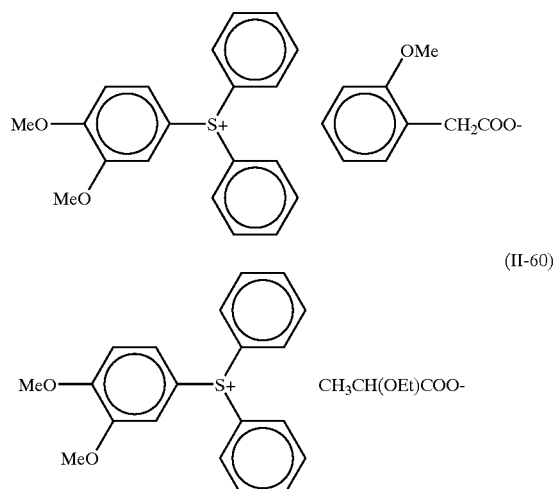
(II-60)
(II-61)
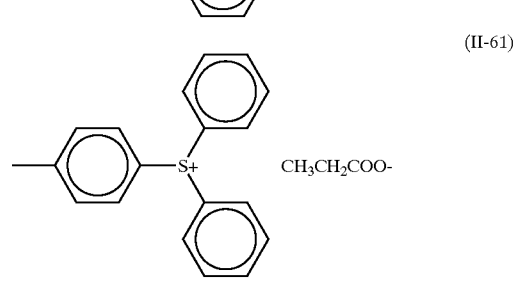
(II-62)
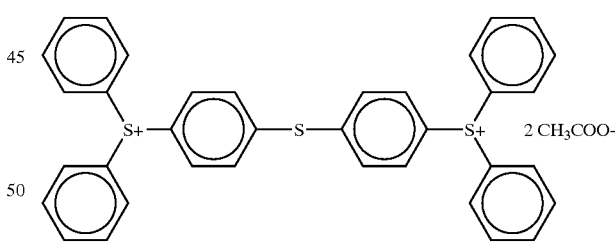
(II-63)
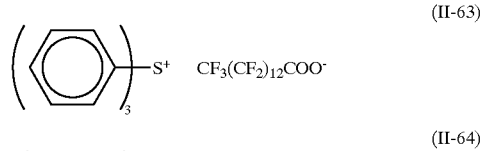
(II-64)
(II-65)
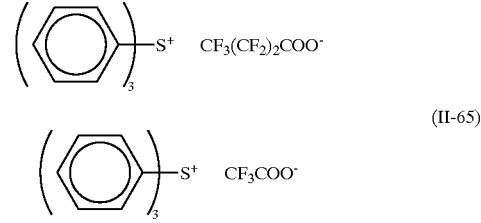

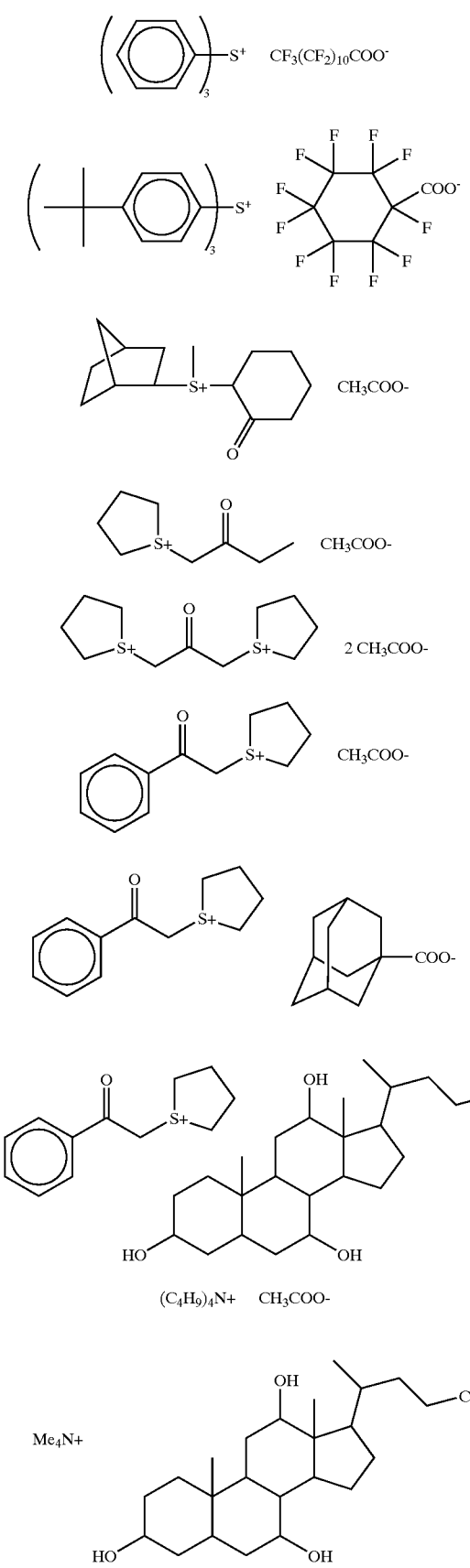

In the formulae described above, Me represents a methyl group and Et represents an ethyl group.

The compounds represented by any one of formulae (AI) to (AVI) may be used individually or in combination of two or more thereof.

The compound represented by any one of formulae (AI) to (AVI) can be synthesized by reacting sulfonium hydroxide, iodonium hydroxide or ammonium hydroxide with a carboxylic acid in an appropriate solvent. The sulfonium hydroxide, iodonium hydroxide and ammonium hydroxide can be obtained by reacting sulfonium iodide, iodonium iodide and ammonium iodide with silver oxide in an appropriate solvent, respectively.

An amount of the onium salt of carboxylic acid (C) is ordinarily from 0.1 to 20% by weight, preferably from 0.5 to 10% by weight, and more preferably from 1 to 7% by weight based on the whole solid content of the positive photosensitive composition.

(D) Acid-decomposable Dissolution-inhibiting Compound

The positive photosensitive composition of the present invention preferably contains a low molecular weight dissolution-inhibiting compound (D) (hereinafter also referred to as acid-decomposable dissolution-inhibiting compound (D)) having a molecular weight of 3,000 or less, having a group capable of being decomposed by an acid and increasing the solubility to an alkali developer by the action of an acid.

In order to prevent reduction in transparency particularly in a wavelength range of 220 nm or less, an alicyclic or aliphatic compound containing an acid-decomposable group, for example, a cholic acid derivative described in *Proceeding of SPIE*, 2724, 355 (1996) is preferred as the acid-decomposable dissolution-inhibiting compound (D). The acid-decomposable group and alicyclic structure are the same as those described with respect to the acid-decomposable resin.

An amount of the acid-decomposable dissolution—inhibiting compound (D) added is preferably from 3 to 50% by weight, more preferably from 5 to 40% by weight, based on the whole solid content of the positive photosensitive composition.

Specific examples of the acid-decomposable dissolution-inhibiting compound (D) are set forth below, but the present invention should not be construed as being limited thereto.

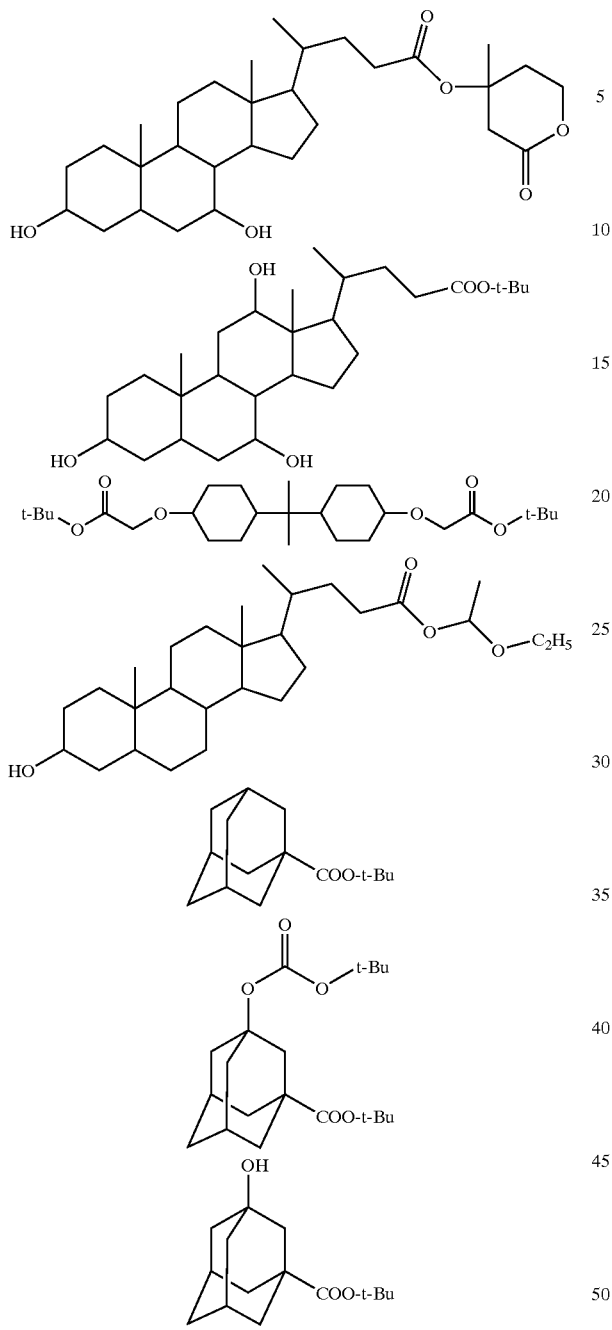

(F) Nitrogen-containing Basic Compound

The positive photosensitive composition of the present invention preferably contains (F) a nitrogen-containing basic compound in order to restrain change in resist characteristics due to the lapse of time between an exposure step and a heating step.

The nitrogen-containing basic compound for use in the present invention preferably contains the structure represented by any one of the following formulae (A) to (E):

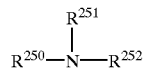   (A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or $R^{251}$ and $R^{252}$ may combine with each other to form a ring;

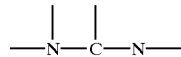   (B)

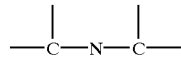   (C)

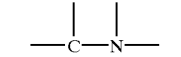   (D)

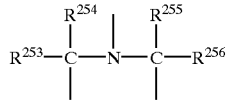   (E)

wherein $R^{253}$, $R^{254}$, $R^{255}$ and $R^{256}$, which may be the same or different, each represents an alkyl group having from 1 to 6 carbon atoms.

Preferred specific examples of the nitrogen-containing basic compound include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, a substituted or unsubstituted aminoalkylmorpholine, a mono—, di- or tri-alkylamine, a substituted or unsubstituted aniline, a substituted or unsubstituted piperidine and a mono- or di-ethanolamine. The substituent is preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group or a cyano group.

More preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4,3,0]non-5-ene, 1,8-diazabicyclo[5,4,0]undec-7-ene, 2,4,5-triphenylimidazole, tri(n-butyl)amine, tri(n-octyl)amine, N-phenyldiethanolamine, N-hydroxyethylpiperidine, 2,6-diisopropylaniline and N-cyclohexyl-N'-morpholinoethylthiourea. However, the present invention should not be construed as being limited thereto.

The nitrogen-containing basic compounds are used individually or in combination of two or more thereof. An amount of the nitrogen-containing basic compound used is usually from 0.001 to 10% by weight, preferably from 0.01 to 5% by weight, based on the solid content of the photosensitive composition. If the amount used is less than 0.001% by weight, the effect owing to the addition of the nitrogen-containing basic compound may not be obtained, whereas if it exceeds 10% by weight, reduction in sensitivity or deterioration in developing property of the unexposed area is liable to occur.

(G) a Surfactant Containing at Least one of Fluorine Atom and Silicon Atom

The positive photosensitive composition of the present invention preferably contains a fluorine-containing surfactant (a fluorine-base surfactant), a silicon-containing surfactant (a silicon-base surfactant) and a surfactant containing both fluorine atom and silicon atom). The fluorine-base and/or silicon-base surfactants may be used individually or in combination of two or more thereof.

The positive photosensitive composition containing the fluorine-base and/or silicon-base surfactant (G) according to the present invention has excellent sensitivity and resolution and provides a resist pattern having a good adhesion property to a substrate and less development defect, when an exposure light source having a wavelength of 250 nm or less, particularly 220 nm or less is used.

Examples of the surfactant (G) include those described, for example, in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, U.S. Pat. Nos. 5,405,720, 5,360,692, 5,529,881, 5,296,330, 5,436,098, 5,576,143, 5,294,511 and 5,824,451. Commercially available surfactants are also employed as they are.

Examples of the commercially available surfactant which can be used include fluorine-base surfactants and silicon-base surfactants, for example, EfTop EF301 and EF303 (manufactured by Shin Akita Kasei K. K.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.), and Troysol S-366 (manufactured by Troy Chemical Industries Inc.). Also, polysiloxane polymer KP-341 (manufactured by Shin-Etsu Chemical Industry Co., Ltd.) is employed as the surfactant.

An amount of the surfactant used is preferably from 0.0001 to 2% by weight, more preferably from 0.001 to 1% by weight based on the whole composition (excluding a solvent) of the positive photosensitive composition of the present invention.

(E) a Resin Being Insoluble in Water But Soluble in an Alkali Developer and Containing a Monocyclic or Polycyclic Alicyclic Hydrocarbon Structure (Alkali-soluble resin).

The positive photosensitive composition of the present invention comprising the compound (A), the compound (C) and the compound (D), comprises the resin (E) which does not contain an acid-decomposable group.

It is preferred that the resin (E) contains a carboxy group together with a monocyclic or polycyclic alicyclic hydrocarbon structure. Specific examples thereof include a copolymer of methacrylate containing an alicyclic hydrocarbon structure which does not have an acid-decomposable function and (meth)acrylic acid and a resin of (meth)acrylate containing an alicyclic hydrocarbon structure having a carboxy group at the terminal thereof.

An amount of the resin (E) used is preferably from 30% to 95% by weight, more preferably from 50 to 95% by weight based on the whole composition (excluding a solvent) of the positive photosensitive composition of the present invention which comprises the compound (A), the compound (C) and the compound (D).

The positive photosensitive composition of the present invention comprising the compound (A), the resin (B) and the compound (C), may contain (E) a resin which is insoluble in water but soluble in an alkali developer and does not contain an acid-decomposable group in order to increase sensitivity.

In such the case, a novolak resin having a molecular weight of from about 1,000 to about 20,000 or a polyhydroxystyrene derivative having a molecular weight of from about 3,000 to about 50,000 may be employed as the alkali-soluble resin. However, since these resins have large absorption to light having a wavelength of 250 nm or shorter, it is preferred to use them in a partially hydrogenated form or in an amount of not more than 30% by weight based on the whole amount of the resin used.

A resin containing a carboxy group as the alkali-soluble group may also be used.

It is preferred that the resin containing a carboxy group contains a monocyclic or polycyclic alicyclic hydrocarbon structure in order to improve dry etching resistance. Specific examples thereof include a copolymer of methacrylate containing an alicyclic hydrocarbon structure which does not have an acid-decomposable function and (meth)acrylic acid and a resin of (meth)acrylate containing an alicyclic hydrocarbon structure having a carboxy group at the terminal thereof.

Other Substances

The positive photosensitive composition of the present invention may further comprises, if desired, a dye, a plasticizer, a surfactant other than the component (G), a photosensitizer, a compound which accelerates the dissolution in a developing solution, and the like.

The compound for accelerating the dissolution in a developing solution, which can be used in the present invention, is a low molecular weight compound containing two or more phenolic hydroxy groups or one or more carboxy groups and having a molecular weight of 1,000 or less. In the case where the compound contains a carboxyl group, an alicyclic or aliphatic compound is preferred from the same reason as described above.

An amount of the dissolution accelerating compound added is preferably from 2 to 50% by weight, more preferably from 5 to 30% by weight, based on the resin (B) which is decomposed by the action of an acid to increase solubility in an alkali developer according to the present invention. If the amount added exceeds 50 wt %, development residue increases adversely or a new problem disadvantageously arises such that the pattern deforms at the development.

The above-described phenol compound having a molecular weight of 1,000 or less can be easily synthesized by one skilled in the art making reference to the methods described, for example, in JP-A-4-122938, JP-A-2-28531, U.S. Pat. No. 4,916,210 and European Patent 219294.

Specific examples of the alicyclic or aliphatic compound having a carboxy group include a carboxylic acid derivative containing steroid structure such as cholic acid, deoxycholic acid or lithocholic acid, an adamantanecarboxylic acid derivative, adamantanedicarboxylic acid, cyclohexanecarboxylic acid and cyclohexanedicarboxylic acid. However, the compound which can be used in the present invention should not be construed as being limited thereto.

Method for the Use

The photosensitive composition of the present invention is dissolved in an appropriate solvent which can dissolve the above-described respective components, and then coated on an appropriate support. Preferred examples of the solvent used include ethylene dichloride, cyclohexanone, cyclopentanone, 2-heptanone, y-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. The solvents are used individually or in combination of two or more thereof.

Of these solvents, cyclohexane, 2-heptane, propylene glycol monomethyl ether, propylene glycol monomethyl ether acetate, ethyl lactate and ethyl ethoxypropionate are preferably used individually or in combination of two thereof in a ratio of 1/9 to 9/1.

In the present invention, a surfactant other than the fluorine-base and/or silicon-base surfactant (G) described above may be added. Specific examples thereof include a nonionic surfactant, for example, polyoxyethylene alkyl ethers such as polyoxyethylene lauryl ether, polyoxyethylene stearyl ether, polyoxyethylene cetyl ether or polyoxyethylene oleyl ether, polyoxyethylene alkylaryl ethers such as polyoxyethylene octylphenol ether or polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate or sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The surfactants may be used individually or in combination of two or more thereof.

The positive photosensitive composition dissolved in a solvent is applied to the desired substrate in the following manner.

Specifically, the photosensitive composition is coated on a substrate (e.g., silicon/silicon dioxide coating) for use in the production of a precision integrated circuit element by an appropriate coating means such as a spinner or coater.

Then, the photosensitive composition is exposed through a predetermined mask, baked and developed to thereby obtain a good resist pattern.

The exposure light is preferably a deep ultraviolet ray having a wavelength of 250 nm or less, more preferably 220 nm or less. Specific examples thereof include a KrF excimer laser (248, nm), an ArF excimer laser (193 m), an $F_2$ excimer laser (157 nm), an X ray and an electron beam.

A developing solution which can be used for development step of the photosensitive composition according to the present invention is an alkaline aqueous solution of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcohol amine such as dimethylethanolamine or triethanolamine, a quaternary ammonium salt such as tetramethylammonium hydroxide or tetraethylammonium hydroxide, and a cyclic amine such as pyrrole or piperidine.

To the alkaline aqueous solution, an appropriate amount of an alcohol or surfactant may be added.

The present invention will be described in greater detail with reference to the following examples, however, the present invention should not be construed as being limited thereto.

Synthesis of Resin

SYNTHESIS EXAMPLE (1)

Synthesis of Resin (P1) {(a1)/(b1)=50/50}

A solution prepared by dissolving 5.0 g of 2-methyl-2-adamantyl methacrylate, 4.23 g of mevalonic lactone methacrylate, 0.534 g of 2,2'-azobis(2,4-dimethylvaleronitrile) (V-65 manufactured by Wako Pure Chemical Industries, Ltd.) as a polymerization initiator in 30.0 g of N,N-dimethylacetamide was added dropwise to 7.0 g of N,N-dimethylacetamide heated at 60° C. under a nitrogen gas stream over a period of 4 hours, and the mixture was reacted at 60° C. for 2 hours. Then, 0.267 g of V-65 was added thereto, followed by reacting for 2 hours. The reaction solution was poured into 1,000 ml of ion exchanged water, and the powder deposited was collected by filtration. The powder was dissolved in tetrahydrofuran, the resulting solution was poured into 1,500 ml of hexane, and the powder deposited was collected and dried to obtain Resin (P1).

A weight average molecular weight of the resin was 5,500 and a degree of dispersion (Mw/Mn) thereof was 1.9. The weight average molecular weight and degree of dispersion were measured by DSC method and expressed in terms of polystyrene.

Synthesis of Resins (P2) to (P12)

Resins (P2) to (P12) shown in Table 1 below were synthesized in a similar manner to Synthesis Example (1). The weight average molecular weight and degree of dispersion of each of these resins are shown in Table 1.

TABLE 1

| Resin | Monomer Used (molar ratio) | Weight Average Molecular Weight (degree of dispersion) |
|---|---|---|
| (P1) | (a1)/(b1) (50/50) | 5,500 (1.9) |
| (P2) | (a1)/(b1)/(methacrylic acid) (45/45/10) | 9,000 (1.9) |

TABLE 1-continued

| Resin | Monomer Used (molar ratio) | Weight Average Molecular Weight (degree of dispersion) |
|---|---|---|
| (P3) | (a4)/(b47) (55/45) | 16,700 (1.8) |
| (P4) | (a4)/(b5) (60/40) | 4,600 (2.2) |
| (P5) | (a5)/(b47)/(methacrylic acid) (45/45/10) | 8,700 (2.1) |
| (P6) | (a5)/(b1) (50/50) | 5,600 (1.7) |
| (P7) | (a18)/(b1) (50/50) | 23,000 (2.3) |
| (P8) | (a16)/(b1) (50/50) | 12,300 (2.2) |
| (P9) | (a16)/(b1)/(methacrylic acid) (45/45/10) | 14,100 (1.9) |
| (P10) | (b54)/(maleic anhydride) (50/50) | 3,600 (2.0) |
| (P11) | (b54)/(b55)/(b56)/(maleic anhydride) (15/25/10/50) | 5,400 (1.9) |
| (P12) | (a1)/(b1)/(diethyleneglycol monomethyl ether methacrylate) (47.5/47.5/5) | 10,100 (2.4) |

SYNTHESIS EXAMPLE (2)

Synthesis of Resin (1) {Side chain type}

2-Ethyl-2-adamantyl methacrylate and butyrolactone methacrylate in a molar ratio of 55/45 were dissolved in a mixed solvent of methyl ethyl ketone and tetrahydrofuran (5/5) to prepare 100 ml of a solution having a solid consentration of 20% by weight. To the solution was added 2 mol % of V-65 manufactured by Wako Pure Chemical Industries, Ltd., and the solution was added dropwise to 10 ml of methyl ethyl ketone heated at 60° C. under a nitrogen gas stream over a period of 4 hours. After the completion of the addition, the reaction solution was heated for 4 hours and 1 mol % of V-65 was again added thereto, followed by stirring for 4 hours. Then, the reaction solution was cooled to a room temperature and poured into 3 liters of a mixed solvent of distilled water and isopropyl alcohol (1/1) to crystallize, and the white powder deposited was recovered to obtain Resin (1).

A constituent ratio of the resin determined by $C^{13}NMR$ was 46/54 (mole%). A weight average molecular weight thereof measured by GPC method and expressed in terms of standard polystyrene was 10,700.

Resins (2) to (15) were synthesized in a similar manner to Synthesis Example (2) respectively. The constituent ratio and weight average molecular weight of each of Resins (2) to (15) are shown in Table 2 below.

TABLE 2

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 2 | 53 | 40 | 7 | — | 13,400 |
| 3 | 46 | 34 | 20 | — | 9,400 |
| 4 | 42 | 31 | 27 | — | 8,300 |
| 5 | 49 | 42 | 9 | — | 9,900 |
| 6 | 42 | 30 | 28 | — | 10,300 |
| 7 | 39 | 35 | 26 | — | 8,900 |
| 8 | 46 | 22 | 30 | 2 | 12,900 |
| 9 | 42 | 20 | 32 | 6 | 11,600 |
| 10 | 46 | 42 | 12 | — | 9,200 |
| 11 | 38 | 32 | 30 | — | 11,300 |
| 12 | 42 | 18 | 38 | 2 | 13,800 |
| 13 | 38 | 31 | 29 | 2 | 11,100 |
| 14 | 50 | 31 | 19 | — | 11,700 |
| 15 | 35 | 6 | 16 | 43 | 13,200 |

In Table 2 above, Repeating Units 1, 2, 3 and 4 denote epeating units of Resins (2) to (15) shown below from to right in order, respectively.

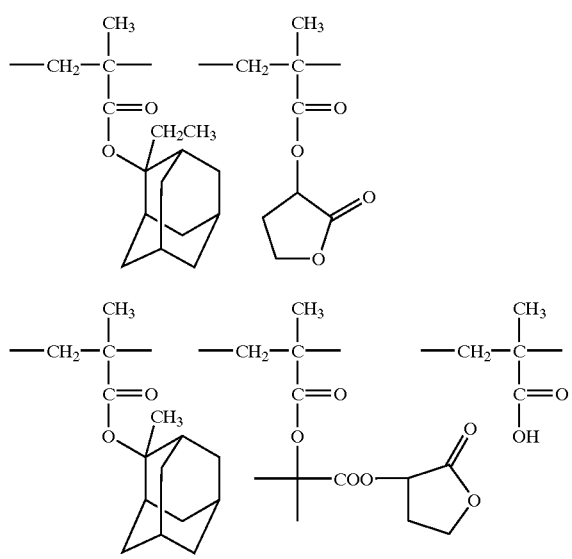

(1)

(2)

(3)
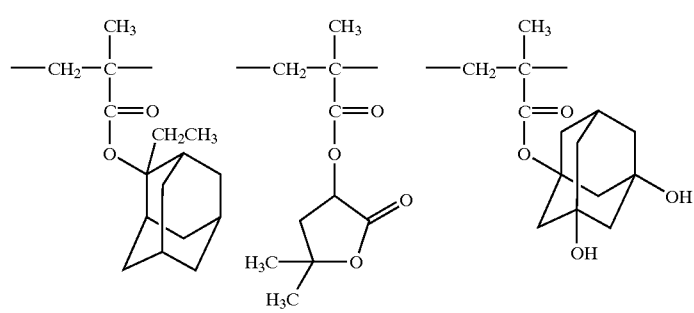
(4)
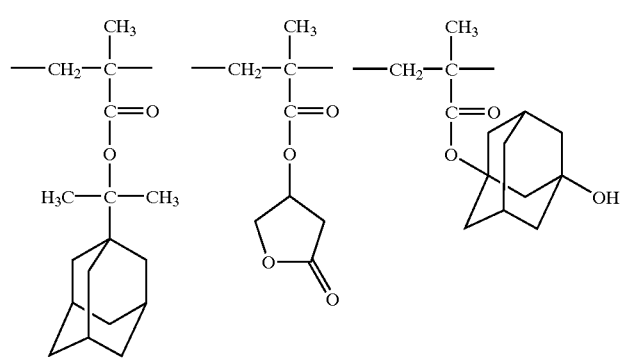
(5)
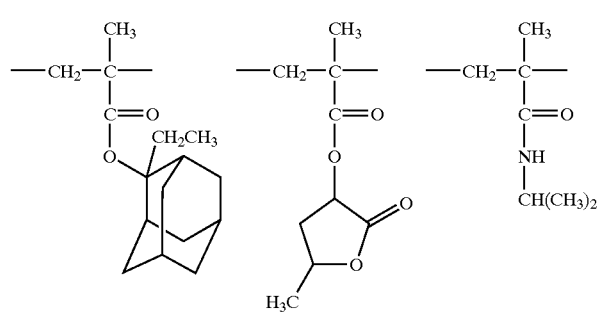
(6)
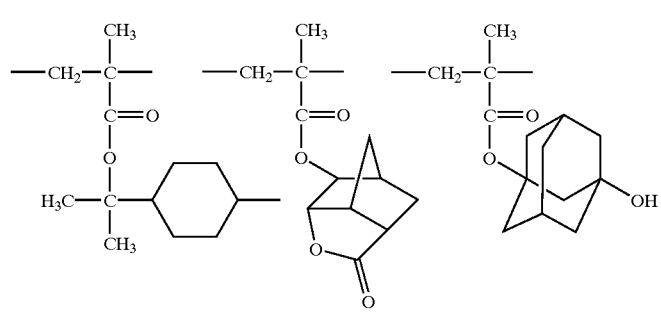
(7)
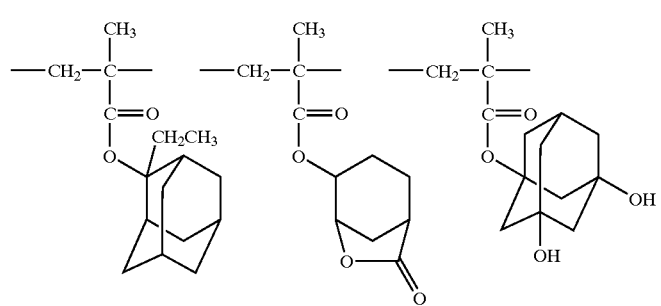

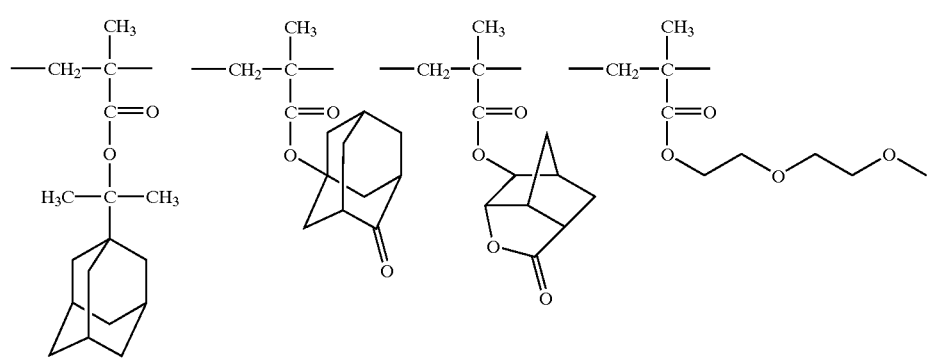
(8)
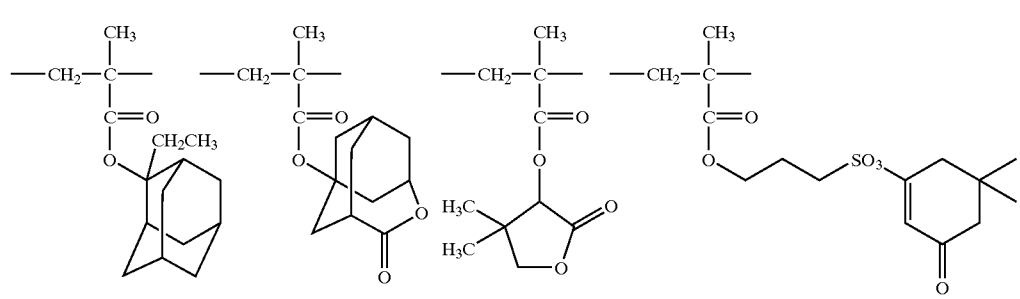
(9)
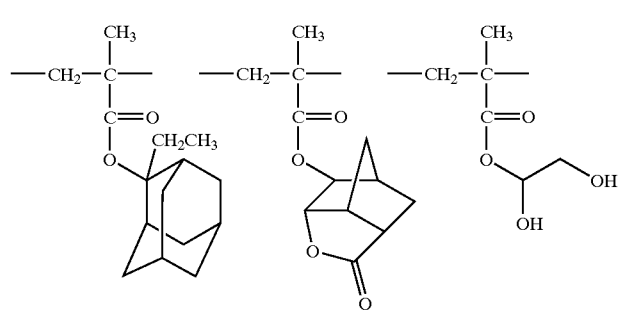
(10)
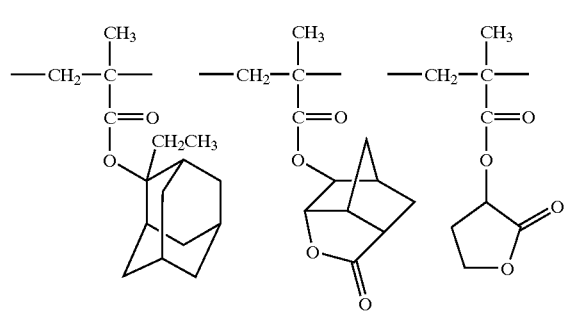
(11)
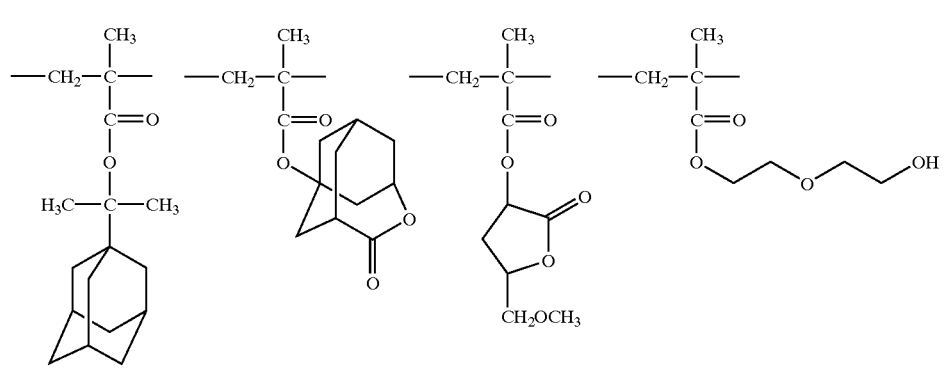
(12)

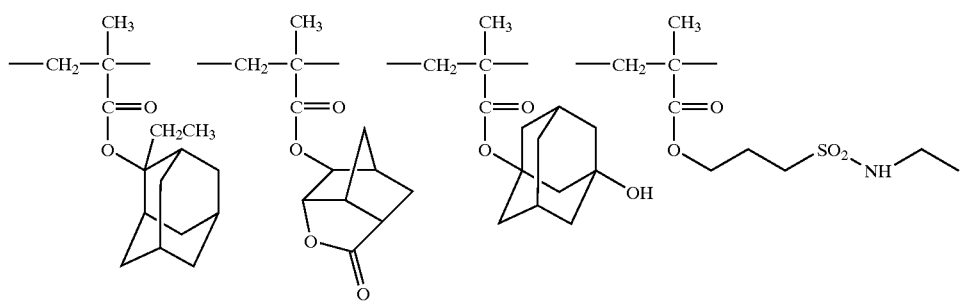

(13)

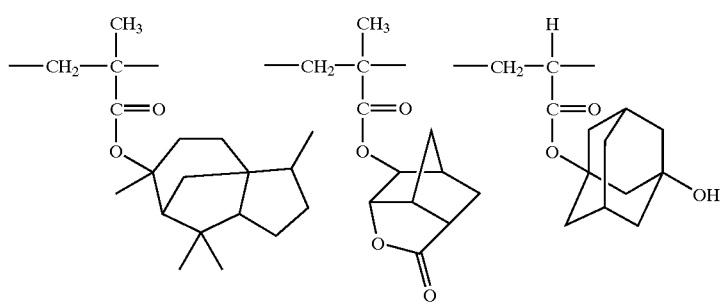

(14)

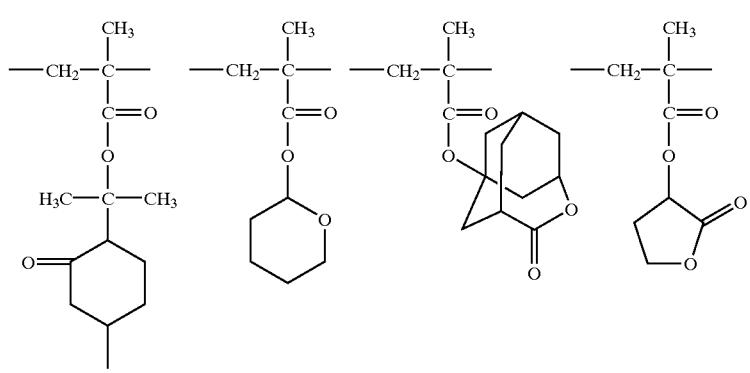

(15)

SYNTHESIS EXAMPLE (3)

Synthesis of Resin (16) {Main chain type}

Into a separable flask were put tert-butyl ester of norbornenecarboxylic acid, butyrolactone ester of norbornenecarboxylic acid and maleic anhydride in a molar ratio of 40/10/50 and tetrahydrofuran in an amount necessary for forming a solution having a reaction concentration of 60% by weight, and the solution was heated at 60° C. under a nitrogen gas stream. After the reaction temperature was stabilized, 2 mol % of a radical initiator (V-601 manufactured by Wako Pure Chemical Industries, Ltd.) was added to initiate a reaction. After heating for 12 hours, the reaction mixture was diluted twice with tetrahydrofuran and poured into a solvent mixture of hexane and isopropyl alcohol (1/1) to deposit white powder. The powder was collected by filtration and dried to obtain Resin (16).

Resin (16) was subjected to molecular weight analysis by GPC method and it was found that a weight average molecular weight thereof expressed in terms of polystyrene was 8,300. A molar ratio of repeating units corresponding to the tert-butyl ester of norbornenecarboxylic acid, butyrolactone ester of norbornenecarboxylic acid and maleic anhydride determined from an NMR spectrum was 42/8/50.

Resins (17) to (27) were synthesized in a similar manner to Synthesis Example (3) respectively. The constituent ratio and weight average molecular weight of each of Resins (17) to (27) are shown in Table 3 below.

TABLE 3

| Resin | Alicyclic Olefin Unit 1 (mol %) | Alicyclic Olefin Unit 2 (mol %) | Alicyclic Olefin Unit 3 (mol %) | Maleic Anhydride Unit (mol %) | Weight Average Molecular Weight |
|---|---|---|---|---|---|
| 17 | 35 | 15 | — | 50 | 8,200 |
| 18 | 20 | 30 | — | 50 | 8,600 |
| 19 | 36 | 14 | — | 50 | 9,100 |
| 20 | 31 | 19 | — | 50 | 7,900 |
| 21 | 35 | 5 | 10 | 50 | 8,300 |
| 22 | 33 | 17 | — | 50 | 8,500 |
| 23 | 38 | 12 | — | 50 | 8,900 |
| 24 | 31 | 6 | 13 | 50 | 8,100 |
| 25 | 33 | 7 | 10 | 50 | 9,100 |
| 26 | 40 | 10 | — | 50 | 9,300 |
| 27 | 34 | 16 | — | 50 | 8,800 |

In Table 3 above, Alicyclic Olefin Units 1, 2 and 3 denotes the repeating units of Resins (17) to (27) shown below from left to right in order, respectively.

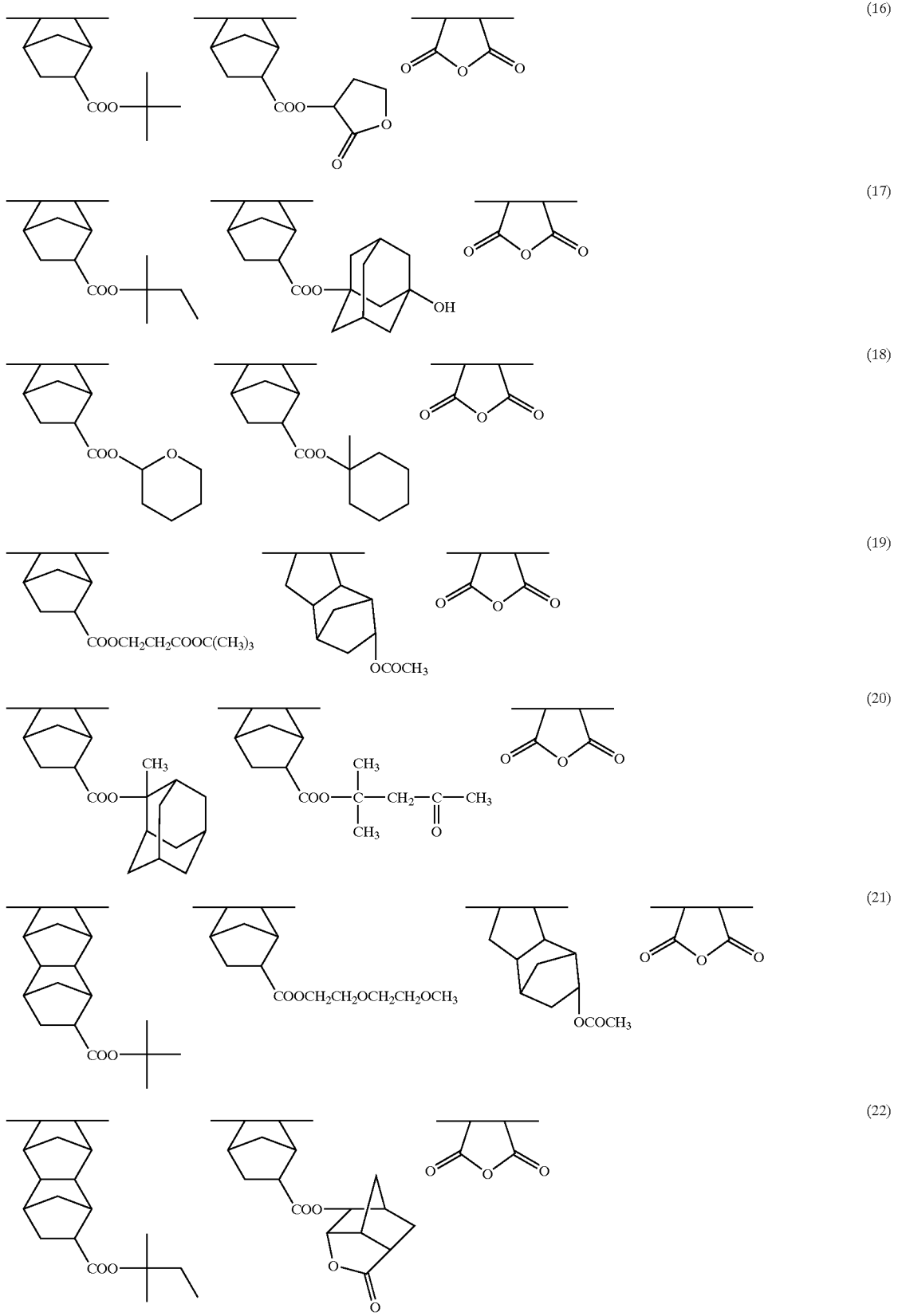

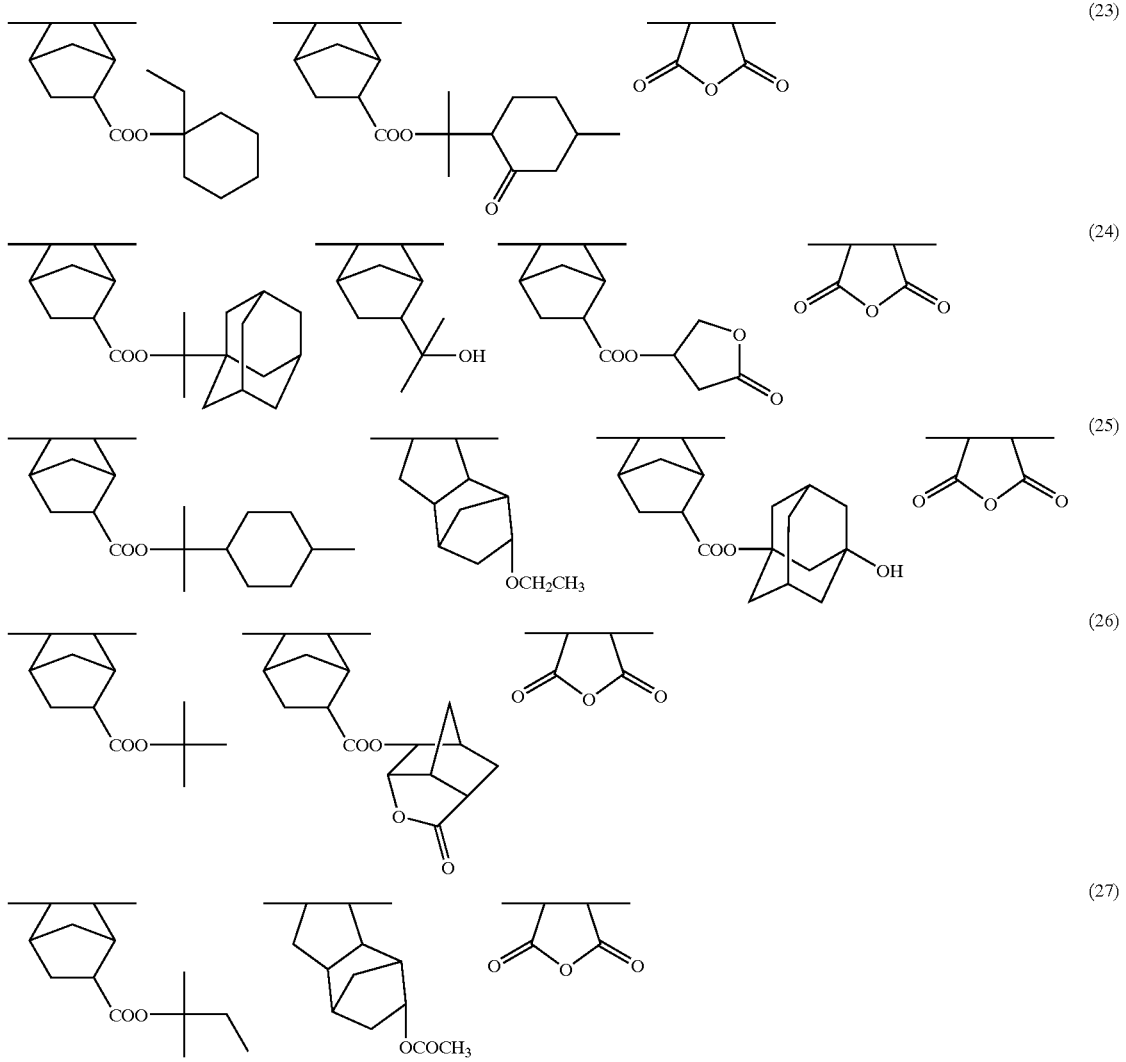

SYNTHESIS EXAMPLE (4)

Synthesis of Resin (28) {Hybrid type}

Into a reaction vessel were put norbornene, maleic anhydride, tert-butyl acrylate and 2-cyclohexyl-2-propyl acrylate in a molar ratio of 35/35/20/10 and dissolved in tetrahydrofuran to form a solution having a solid content of 60% by weight, and the solution was heated at 65° C. under a nitrogen gas stream. After the reaction temperature was stabilized, 1 mol % of a radical initiator (V-601 manufactured by Wako Pure Chemical Industries, Ltd.) was added to initiate a reaction. After heating for 8 hours, the reaction mixture was diluted twice with tetrahydrofuran and poured into hexane of five times in volume to deposit white powder. The powder was collected by filtration and dissolved in methyl ethyl ketone and the solution was poured into a mixed solvent of hexane and tert-butyl methyl ether (1/1) of five times in volume to reprecipitate. The white powder deposited was collected by filtration and dried to obtain Resin (28).

Resin (28) was subjected to molecular weight analysis by GPC method and it was found that a weight average molecular weight thereof expressed in terms of polystyrene was 12,100. A molar ratio of repeating units corresponding to the norbornene, maleic anhydride, tert-butyl acrylate and 2-cyclohexyl-2-propyl acrylate determined from an NMR spectrum was 32/39/19/10.

Resins (29) to (41) were synthesized in a similar manner to Synthesis Example (4) respectively. The constituent ratio and weight average molecular weight of each of Resins (29) to (41) are shown in Table 4 below.

TABLE 4

| Resin | Norbornene Unit (mol %) | Acid Anhydride Unit (mol %) | (Meth) acrylate Unit (mol %) | Weight Average Molecular Weight |
|---|---|---|---|---|
| 29 | 20/15 | 40 | 15/10 | 11,900 |
| 30 | 32 | 37 | 20/8/3 | 10,500 |
| 31 | 16 | 21 | 36/27 | 13,900 |
| 32 | 15 | 22 | 34/29 | 12,300 |
| 33 | 17 | 20 | 33/30 | 12,400 |
| 34 | 18 | 24 | 32/26 | 13,000 |
| 35 | 15 | 19 | 36/30 | 12,700 |
| 36 | 15 | 20 | 29/10/26 | 13,100 |
| 37 | 17 | 21 | 31/31 | 12,800 |

TABLE 4-continued
| Resin | Norbornene Unit (mol %) | Acid Anhydride Unit (mol %) | (Meth) acrylate Unit (mol %) | Weight Average Molecular Weight |
|---|---|---|---|---|
| 38 | 18 | 17/3 | 30/32 | 13,300 |
| 39 | 16 | 19 | 31/12/11/11 | 12,600 |
| 40 | 20 | 22 | 58 | 14,700 |
| 41 | 23 | 28 | 35/14 | 13,300 |
In Table 4 above, Norbornene Unit, Acid Anhydride Unit and (Meth)acrylate Unit denotes the repeating units of Resins (29) to (41) shown below from left to right in order, respectively.
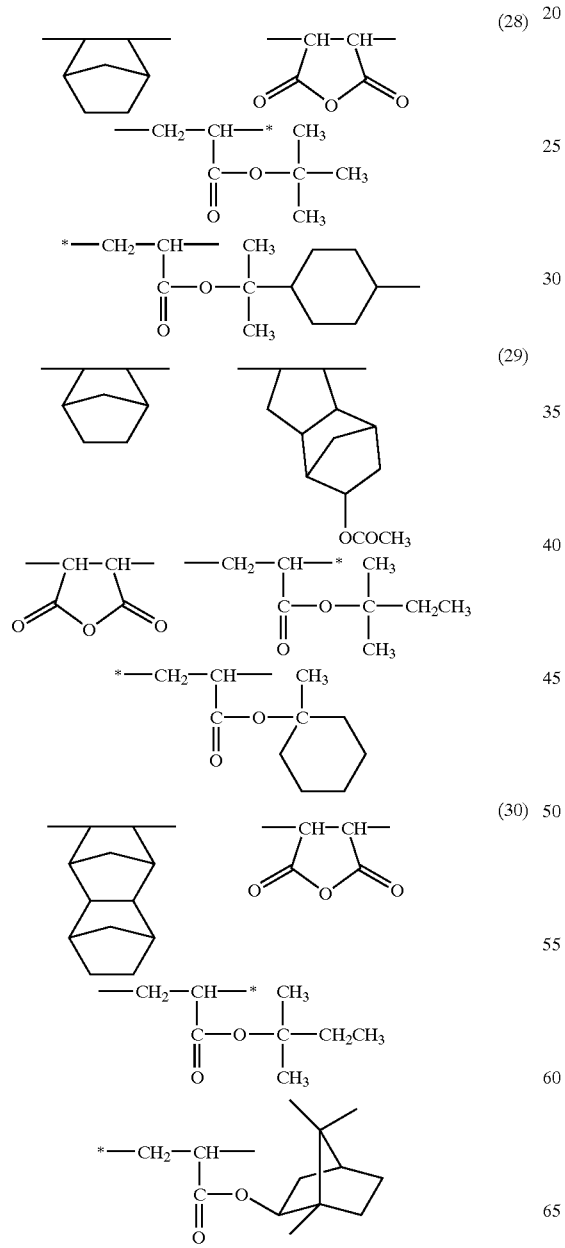
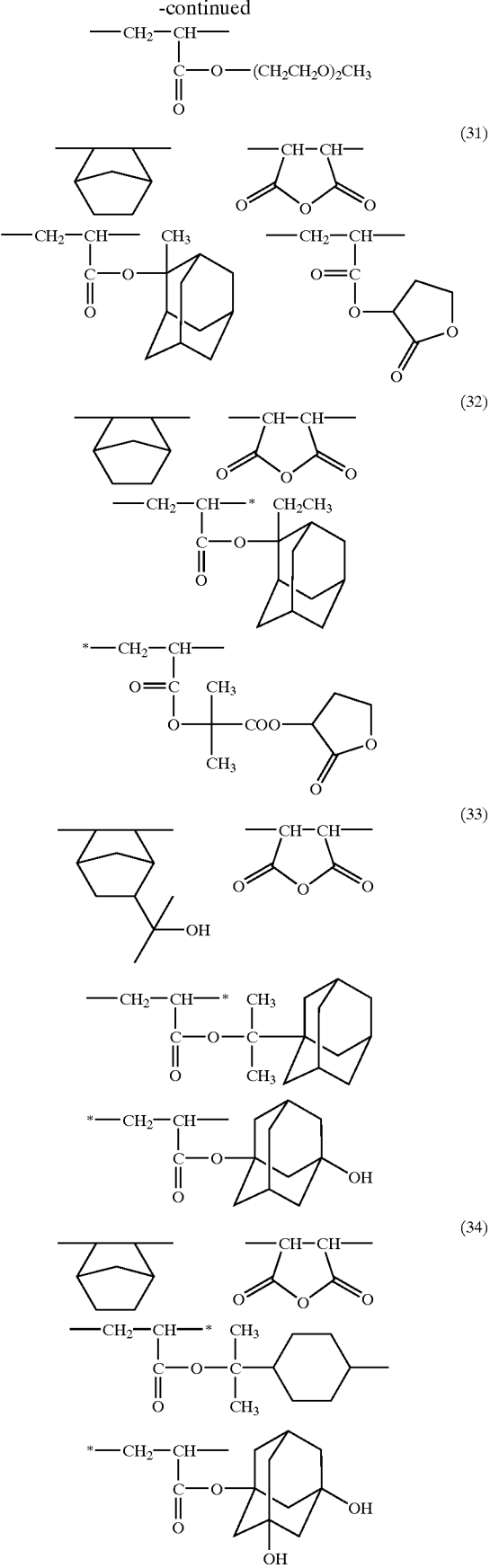

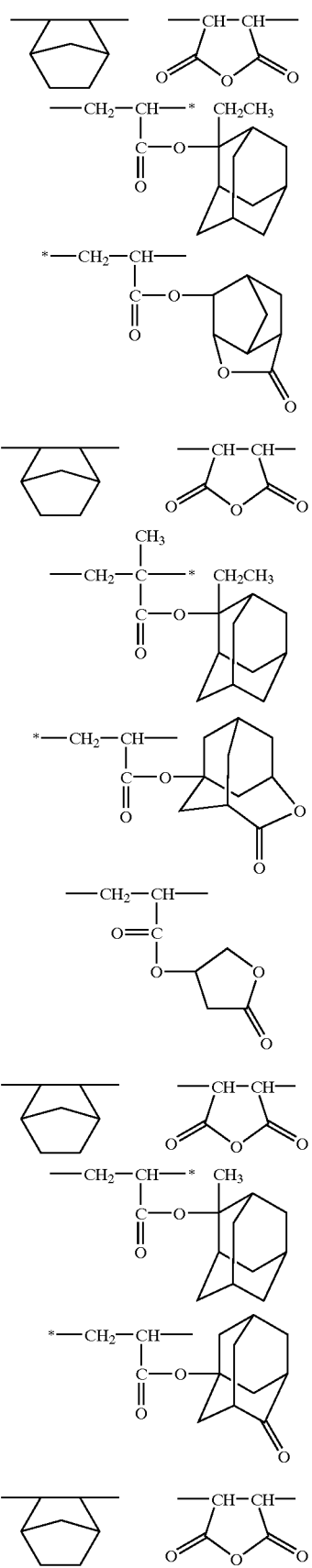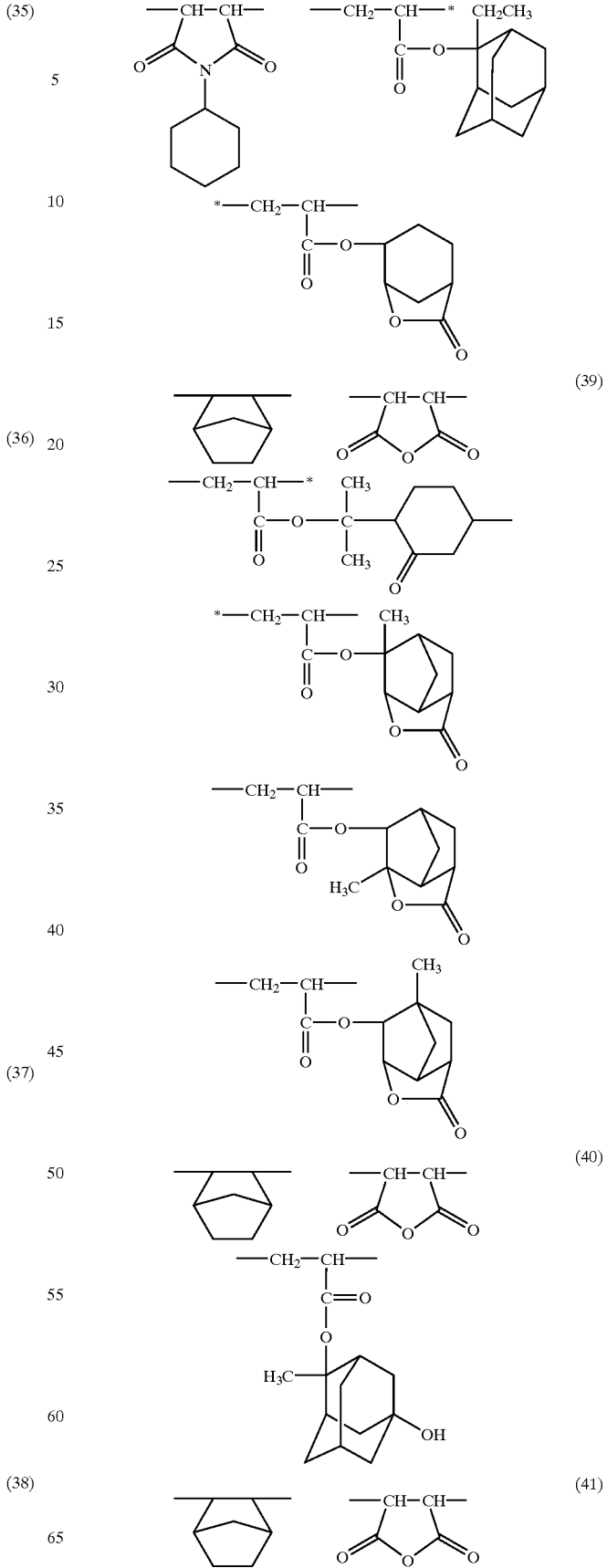

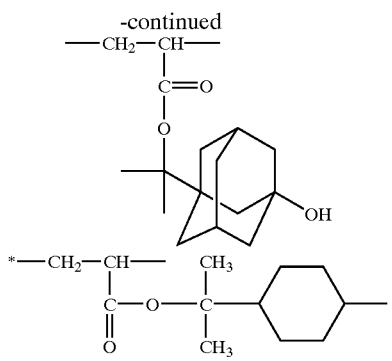

SYNTHESIS EXAMPLE (5)

Synthesis of Resin (42) {Hybrid type}

Into a reaction vessel were put tert-butyl ester of norbornenecarboxylic acid, maleic anhydride, 2-methyl-2-adamantyl acrylate and norbornenelactone acrylate in a molar ratio of 20/20/35/25 and dissolved in a mixed solvent of methyl ethyl ketone and tetrahydrofuran (1/1) to form a solution having a solid content of 60% by weight, and the solution was heated at 65° C. under a nitrogen gas stream. After the reaction temperature was stabilized, 3 mol % of a radical initiator (V-601 manufactured by Wako Pure Chemical Industries, Ltd.) was added to initiate a reaction. After heating for 12 hours, the reaction mixture was poured into hexane of five times in volume to deposit white powder. The powder was collected by filtration and dissolved in a mixed solvent of methyl ethyl ketone and tetrahydrofuran (1/1), the solution was poured into a solvent mixture of hexane and tert-butyl methyl ether (1/1) of five times in volume to deposit white powder, and the powder was collected by filtration. This procedure was repeated once again and the powder deposited was dried to obtain Resin (42).

Resin (42) was subjected to molecular weight analysis (RI analysis) by GPC method and it was found that a weight average molecular weight thereof expressed in terms of polystyrene was 11,600. An amount of the remaining monomer was 0.4%. A molar ratio of repeating units corresponding to the tert-butyl ester of norbornenecarboxylic acid, maleic anhydride, 2-methyl-2-adamantyl acrylate and norbornenelactone acrylate determined from an NMR spectrum was 18/23/34/25.

Resins (43) to (66) were synthesized in a similar manner to Synthesis Example (5) respectively. The constituent ratio and weight average molecular weight of each of Resins (43) to (66) are shown in Table 5 below.

TABLE 5

| Resin | Alicyclic Olefin Unit (mol %) | Monomer of Formula (VIII) Unit (Acid Anhydride) (mol %) | Acrylic Monomer Unit (mol %) | Weight Average Molecular Weight |
|---|---|---|---|---|
| 43 | 24 | 29 | 31/16 | 12,300 |
| 44 | 21 | 28 | 32/29 | 11,100 |
| 45 | 22 | 27 | 28/23 | 11,300 |
| 46 | 27 | 31 | 24/18 | 10,700 |
| 47 | 32 | 38 | 20/10 | 9,700 |
| 48 | 31 | 35 | 21/13 | 9,200 |
| 49 | 29 | 35 | 20/16 | 8,900 |
| 50 | 35 | 39 | 23/3 | 8,700 |
| 51 | 28 | 36 | 22/14 | 10,600 |
| 52 | 28/8 | 44 | 20 | 9,100 |
| 53 | 30/6 | 42 | 22 | 7,700 |
| 54 | 46 | 47/3 | 4 | 6,300 |
| 55 | 37/6 | 48 | 9 | 6,800 |
| 56 | 34/10 | 51 | 5 | 7,400 |
| 57 | 41 | 43 | 10/6 | 6,700 |
| 58 | 39 | 42 | 11/8 | 8,800 |
| 59 | 36 | 42 | 10/12 | 9,300 |
| 60 | 39 | 43 | 14/4 | 9,800 |
| 61 | 38 | 42 | 15/5 | 9,300 |
| 62 | 24 | 27 | 25/24 | 12,600 |
| 63 | 19 | 24 | 40/17 | 9,500 |
| 64 | 29 | 32 | 34/5 | 10,400 |
| 65 | 20 | 25 | 26/5/24 | 13,400 |
| 66 | 16 | 24 | 32/24/4 | 12,700 |

In Table 5 above, Alicyclic Olefin Unit, Monomer of Formula (VIII) Unit and Acrylic Monomer Unit denotes the repeating units of Resins (43) to (66) shown below from left to right in order, respectively.

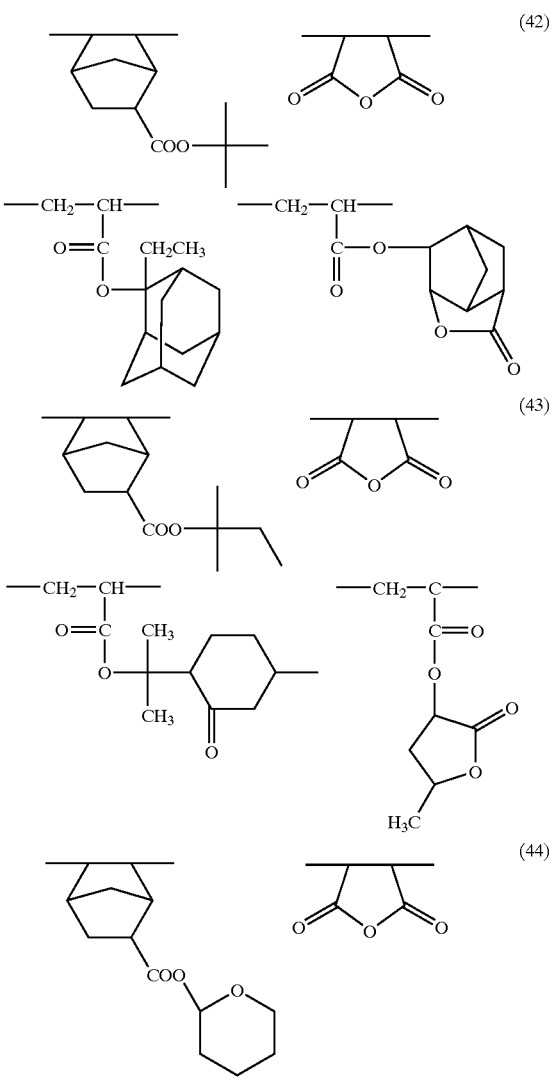

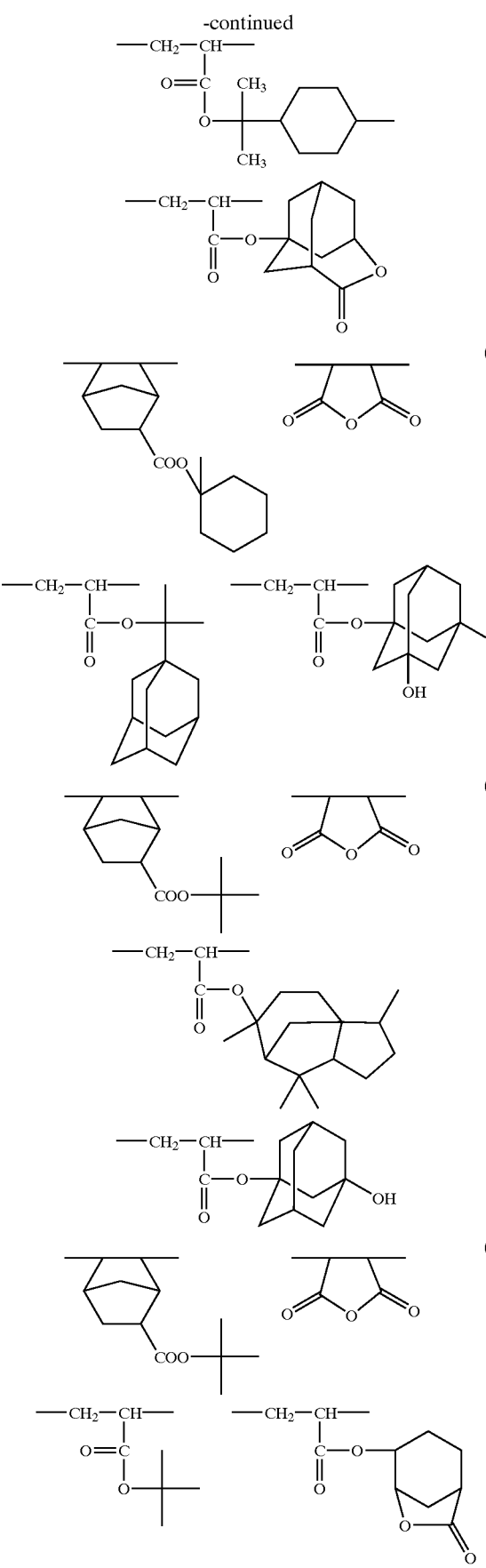
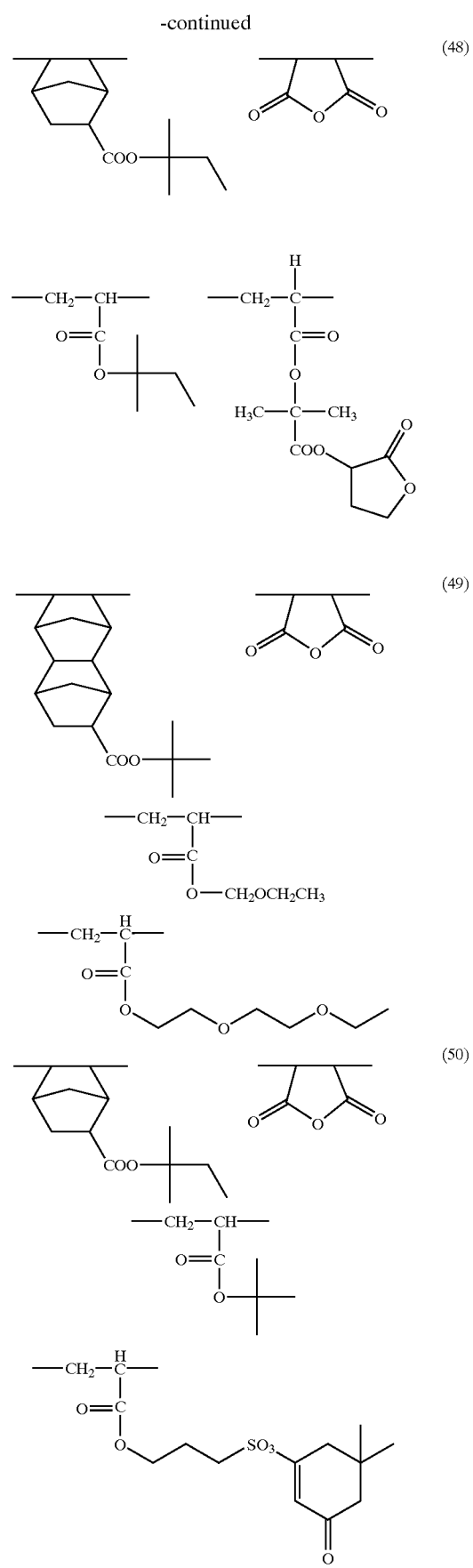

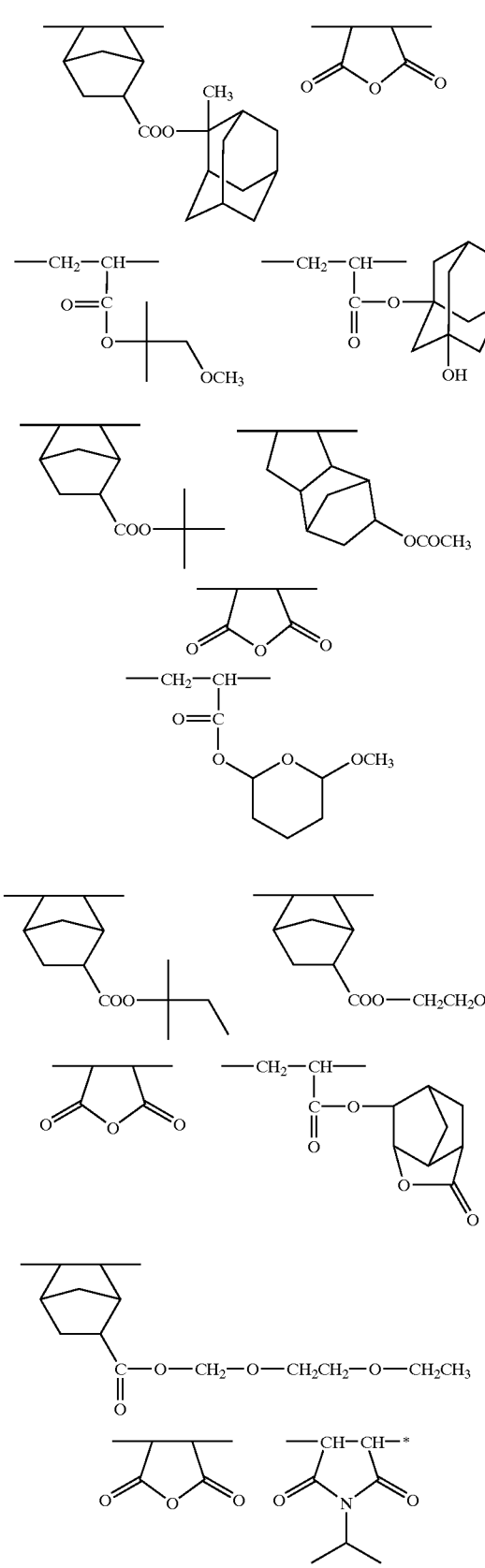
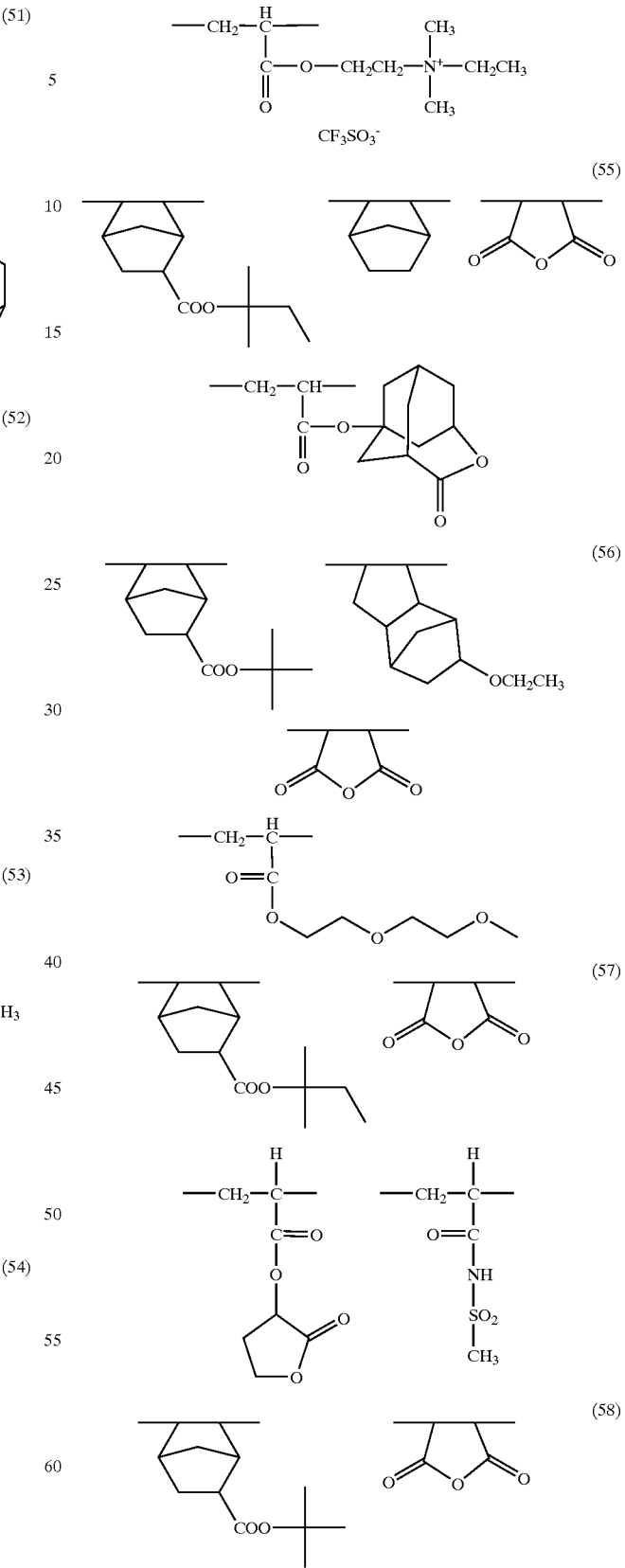

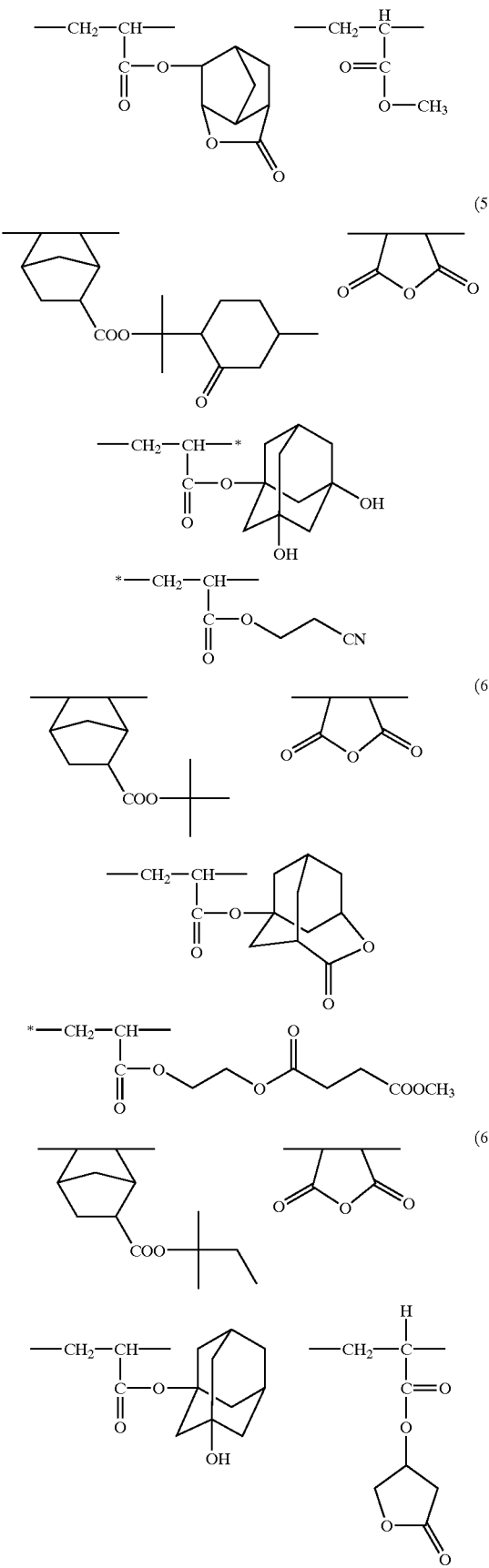
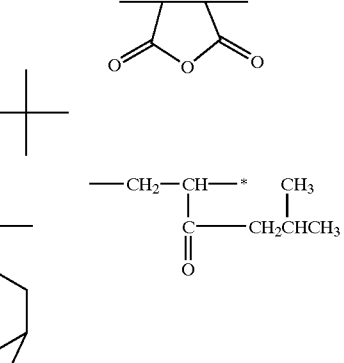

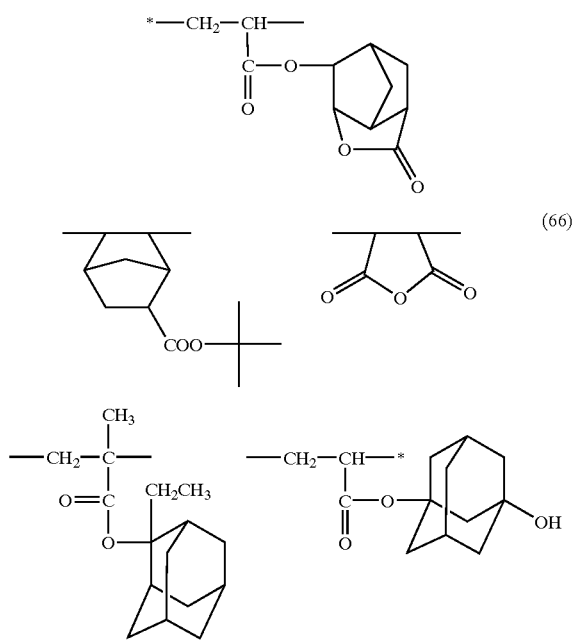

Preparation of Resist

EXAMPLES 1 TO 86 AND COMPARATIVE EXAMPLES 1 TO 6

Each of the components shown in Table 6 was dissolved in propylene glycol monomethyl ether acetate so as to prepare a solution having a solid content of 15% by weight and the resulting solution was filtered through a Teflon filter of 0.1 μm to prepare a photosensitive composition.

Also, each of the components shown in Tables 7 to 9 was dissolved in the solvents shown in Tables 7 to 9 so as to prepare a solution having a solid content of 15% by weight and the resulting solution was filtered through a Teflon filter of 0.1 μm to prepare a photosensitive composition.

The photosensitive composition thus-prepared was evaluated according to the methods described below. The results obtained are shown in Tables 10 to 13 below.

TABLE 6

| Example | Acid-Generator (g) | Resin (g) | Onium Salt of Carboxylic Acid (g) | Dissolution Inhibiting Compound (g) | Nitrogen-Containing Basic Compound (g) | Surfactant (g) |
|---|---|---|---|---|---|---|
| 1 | TPSTF (0.1) | P1 (9.0) | I-1 (0.05) | — | — | W-1 (0.01) |
| 2 | TPSTF (0.2) | P2 (9.0) | I-5 (0.2) | — | — | W-2 (0.01) |
| 3 | TPSPFBS (0.1) | P3 (9.0) | I-16 (0.1) | — | — | W-3 (0.01) |
| 4 | TPSTF (0.1) TPSPFB (0.1) | P4 (9.0) | II-1 (0.02) | — | — | W-4 (0.01) |
| 5 | TPSPFB (0.1) | P5 (9.0) | II-3 (0.07) | — | — | W-1 (0.01) |
| 6 | TPSPFB (0.2) | P6 (9.0) | II-7 (0.02) | — | — | W-2 (0.01) |
| 7 | TPSPFB (0.1) | P7 (9.0) | II-8 (0.02) | — | — | W-3 (0.01) |
| 8 | TPSTF (0.1) | P8 (9.0) | II-14 (0.01) | — | DBN (0.005) | W-4 (0.01) |
| 9 | TPSPFBS (0.1) | P9 (9.0) | II-17 (0.02) | — | — | W-1 (0.01) |
| 10 | TPSTF (0.1) | P10 (8.0) | II-1 (0.02) | tert-Butyl Cholate (1.0) | — | W-2 (0.01) |
| 11 | TPSTF (0.1) | P11 (9.0) | IV-6 (0.05) | — | — | W-4 (0.01) |
| 12 | TPSTF (0.2) | P12 (9.0) | IV-1 (0.01) | — | — | W-1 (0.01) |
| 13 | TPSBTFBS (0.2) | P1 (8.0) | II-32 (0.1) | — | DBN (0.005) | W-3 (0.01) |
| 14 | TPSTF (0.1) | P3 (8.0) | II-62 (0.1) | — | TPI (0.005) | W-4 (0.01) |
| 15 | TPSPFBS (0.2) | P1 (9.0) | I-21 (0.02) | — | — | W-1 (0.01) |
| 16 | TPSPFBS (0.1) BCHSDM (0.3) | P2 (9.0) | II-63 (0.07) | — | TPI (0.01) | W-2 (0.01) |
| 17 | TPSBTFBS (0.2) | P3 (9.0) | II-64 (0.05) | — | — | W-3 (0.01) |

TABLE 6-continued

| Example | Acid-Generator (g) | Resin (g) | Onium Salt of Carboxylic Acid (g) | Dissolution Inhibiting Compound (g) | Nitrogen-Containing Basic Compound (g) | Surfactant (g) |
|---|---|---|---|---|---|---|
| 18 | TPSPFOS (0.1) TPSTF (0.1) | P10 (9.0) | II-66 (0.03) | — | — | W-4 (0.01) |
| 19 | BTBPIPFBS (0.2) | P11 (9.0) | II-67 (0.05) | — | — | W-1 (0.01) |
| 20 | TPSBTFBS (0.1) BCHSDM (0.2) | P12 (9.0) | II-65 (0.01) | — | DBN (0.005) | W-2 (0.01) |
| Comparative Example 1 | TPSTF (0.1) | P1 (9.0) | — | — | DBN (0.01) | W-1 (0.01) |
| Comparative Example 2 | TPSTF (0.1) | P10 (8.0) | — | tert-Butyl Cholate (1.0) | TPI (0.02) | W-2 (0.01) |
| Comparative Example 3 | TPSTF (0.1) | P3 (9.0) | — | — | TPI (0.005) | W-3 (0.01) |

TABLE 7

| Example | Resin (10 g) | Acid Generator (g) | Onium Salt of Carboxylic Acid (g) | Dissolution Inhibiting Compound (g) | Nitrogen Containing Basic Compound (g) | Surfactant (0.03 g) | Solvent (Weight ratio) |
|---|---|---|---|---|---|---|---|
| 21 | (1) | z33 (0.15) | II-1 (0.04) | | DBN (0.02) | W-1 | A1 = 100 |
| 22 | (2) | z2 (0.1) | II-2 (0.01) | | TPI (0.03) | W-1 | A1 = 100 |
| 23 | (3) | z33 (0.05) z31 (0.3) | II-3 (0.04) | | | W-2 | A1/B1 = 90/10 |
| 24 | (4) | z14 (0.18) | II-4 (0.01) | | HEP (0.01) | W-2 | A3/B2 = 80/20 |
| 25 | (5) | z3 (0.15) | II-7 (0.05) | | TPI (0.03) | W-3 | A2/B1 = 90/10 |
| 26 | (6) | z33 (0.2) | II-1 (0.05) | | DIA (0.01) | W-3 | A4/B1 = 90/10 |
| 27 | (7) | z6 (0.1) z5 (0.05) | II-13 (0.02) | | DIA (0.007) | W-4 | A1/B1 = 50/50 |
| 28 | (8) | z10 (0.05) | II-7 (0.01) | | TOA (0.02) | W-4 | A1/B1 = 90/10 |
| 29 | (9) | z33 (0.1) z21 (0.5) | II-1 (0.1) | LCB (1) | TPI (0.03) | W-1 | A5/B2 = 90/10 |
| 30 | (10) | z30 (0.3) | II-19 (0.01) | | TPI (0.02) | W-1 | A1 = 100 |
| 31 | (11) | z31 (0.3) | II-37 (0.1) | | TPI (0.03) | W-2 | A1/B1 = 90/10 |
| 32 | (12) | z32 (0.4) | II-47 (0.05) | | TPI (0.03) | W-2 | A1/B1 = 95/5 |
| 33 | (13) | z36 (1.0) | II-3 (0.01) | | TPI (0.03) | W-3 | A1/B1 = 95/5 |
| 34 | (14) | z6 (0.1) z35 (0.2) | II-14 (0.01) | | DBN (0.02) | W-3 | A1/B1 = 95/5 |
| 35 | (15) | z8 (0.1) z38 (0.6) | II-48 (0.03) | LCB (1) | TPI (0.03) | W-4 | A1 = 100 |
| 36 | (16) | z31 (0.5) z39 (0.5) | II-63 (0.02) | | DIA (0.01) | W-4 | A1/B1 = 80/20 |
| 37 | (17) | z1 (0.2) z37 (0.4) | II-64 (0.05) | | TPI (0.03) | W-4 | A1/B1 = 95/5 |
| 38 | (18) | z34 (0.15) | II-65 (0.05) | | DCMA (0.001) | W-4 | A1/B1 = 95/5 |
| 39 | (19) | z33 (0.1) z31 (0.2) z35 (0.3) | II-66 (0.06) | | TOA (0.02) | W-4 | A1/B1 = 95/5 |
| 40 | (20) | z14 (0.2) | II-66 (0.01) | | TPI (0.03) | W-4 | A1 = 100 |
| 41 | (21) | z33 (0.1) | II-69 (0.02) | | DBN (0.02) | W-1 | A1/B1 = 95/5 |
| 42 | (22) | z31 (0.15) | II-71 (0.05) | | TPI (0.03) | W-1 | A1/B1 = 80/20 |
| 43 | (23) | z35 (0.3) | II-73 (0.05) | | | W-2 | A1/B1 = 90/10 |
| 44 | (24) | z8 (0.2) | I-1 (0.04) | | HEP (0.01) | W-2 | A3/B2 = 80/20 |
| 45 | (25) | z6 (0.1) z22 (0.2) | IV-1 (0.03) | | TPI (0.03) | W-3 | A2/B1 = 90/10 |

TABLE 8

| Example | Resin (10 g) | Acid Generator (g) | Onium Salt of Carboxylic Acid (g) | Dissolution Inhibiting Compound (g) | Nitrogen Containing Basic Compound (g) | Surfactant (0.03 g) | Solvent (Weight ratio) |
|---|---|---|---|---|---|---|---|
| 46 | (26) | z2 (0.1) z29 (0.2) | IV-6 (0.05) | | DIA (0.01) | W-3 | A4/B1 = 90/10 |
| 47 | (27) | z33 (0.1) z31 (0.1) z26 (0.2) | II-1 (0.1) | | DIA (0.007) | W-4 | A1/B1 = 50/50 |
| 48 | (28) | z13 (0.2) z21 (0.3) | II-1 (0.04) | | DBN (0.02) | W-4 | A1/B1 = 90/10 |
| 49 | (29) | z1 (0.1) z23 (0.3) | II-2 (0.01) | LCB (1) | TPI (0.03) | W-1 | A5/B2 = 90/10 |
| 50 | (30) | z16 (0.2) | II-3 (0.04) | | TPI (0.02) | W-1 | A1/B1 = 95/5 |
| 51 | (31) | z3 (0.05) z20 (0.8) | II-4 (0.01) | | TPI (0.03) | W-2 | A1/B1 = 90/10 |
| 52 | (32) | z2 (0.1) | II-7 (0.05) | | TPI (0.03) | W-2 | A1/B1 = 95/5 |
| 53 | (33) | z1 (0.1) | II-1 (0.05) | | TPI (0.03) | W-3 | A1/B1 = 95/5 |
| 54 | (34) | z4 (0.05) | II-13 (0.02) | | DBN (0.02) | W-3 | A1/B2 = 95/5 |
| 55 | (35) | z8 (0.1) | II-7 (0.01) | | TPI (0.03) | W-4 | A1/B1 = 80/20 |
| 56 | (36) | z5 (0.05) | II-1 (0.1) | | DIA (0.01) | W-4 | A1/B1 = 80/20 |
| 57 | (37) | z39 (0.5) | II-19 (0.01) | | TPI (0.03) | W-4 | A1/B1 = 95/5 |
| 58 | (38) | z40 (0.5) | II-37 (0.1) | | DCMA (0.01) | W-4 | A1/B1 = 95/5 |
| 59 | (39) | z33 (0.2) | II-47 (0.05) | | TPI (0.02) | W-4 | A1/B1 = 95/5 |
| 60 | (40) | z31 (0.6) | II-3 (0.01) | LCB (1) | TPI (0.03) | W-4 | A1/B1 = 95/5 |
| 61 | (41) | z30 (0.4) | II-14 (0.01) | | DBN (0.02) | W-1 | A1/B1 = 95/5 |
| 62 | (42) | z34 (0.18) | II-48 (0.03) | | DBN (0.02) | W-1 | A1/B1 = 95/5 |
| 63 | (43) | z14 (0.1) | II-63 (0.02) | | TPI (0.03) | W-1 | A1/B1 = 80/20 |
| 64 | (44) | z2 (0.1) z26 (0.3) | II-64 (0.05) | | HEP (0.01) | W-2 | A3/B2 = 80/20 |
| 65 | (45) | z22 (0.2) z33 (0.1) | II-65 (0.05) | | TPI (0.03) | W-3 | A2/B1 = 90/10 |
| 66 | (46) | z31 (0.3) z21 (0.5) | II-66 (0.06) | | DIA (0.01) | W-3 | A4/B1 = 90/10 |
| 67 | (47) | z21 (1.0) | II-66 (0.01) | | DIA (0.07) | W-4 | A1/B1 = 50/50 |
| 68 | (48) | z3 (0.05) z1 (0.05) | II-69 (0.02) | | DBN (0.02) | W-4 | A1/B1 = 90/10 |
| 69 | (49) | z6 (0.1) z33 (0.1) | II-71 (0.05) | | TPI (0.03) | W-1 | A5/B2 = 90/10 |
| 70 | (50) | z6 (0.1) | II-73 (0.05) | | TPI (0.02) | W-1 | A1/B1 = 95/5 |

TABLE 9

| Example | Resin (10 g) | Acid Generator (g) | Onium Salt of Carboxylic Acid (g) | Dissolution Inhibiting Compound (g) | Nitrogen Containing Basic Compound (g) | Surfactant (0.03 g) | Solvent (Weight ratio) |
|---|---|---|---|---|---|---|---|
| 71 | (51) | z3 (0.15) | I-1 (0.04) | | TOA (0.03) | W-2 | A1/B1 = 90/10 |
| 72 | (52) | z34 (0.15) | IV-1 (0.03) | | TPI (0.03) | W-2 | A1/B1 = 95/5 |
| 73 | (53) | z33 (0.1) z31 (0.2) | IV-6 (0.05) | | TPI (0.03) | W-3 | A1/B1 = 95/5 |
| 74 | (54) | z36 (0.9) | II-1 (0.1) | | DBN (0.02) | W-3 | A1/B1 = 95/5 |
| 75 | (55) | z33 (0.1) z31 (0.3) | II-1 (0.04) | | TPI (0.03) | W-4 | A1/B1 = 80/20 |
| 76 | (56) | z26 (0.1) z33 (0.1) | II-2 (0.01) | | DIA (0.01) | W-4 | A1/B1 = 80/20 |
| 77 | (57) | z40 (0.1) | II-3 (0.04) | | TPI (0.03) | W-4 | A1/B1 = 95/5 |
| 78 | (58) | z37 (0.9) | II-4 (0.01) | | DCMA (0.01) | W-4 | A1/B1 = 95/5 |
| 79 | (59) | z33 (0.2) | II-7 (0.05) | | TPI (0.02) | W-4 | A1/B1 = 95/5 |
| 80 | (60) | z33 (0.1) | II-1 (0.05) | | TPI (0.03) | W-4 | A1/B1 = 95/5 |
| 81 | (61) | z1 (0.1) | II-13 (0.02) | | DBN (0.02) | W-1 | A1/B1 = 95/5 |
| 82 | (62) | z33 (0.2) z12 (0.05) | II-7 (0.01) | | TPI (0.03) | W-1 | A1/B1 = 80/20 |
| 83 | (63) | z14 (0.15) | II-1 (0.1) | | | W-2 | A1/B1 = 90/10 |
| 84 | (64) | z13 (0.1) | II-19 (0.01) | | HEP (0.01) | W-2 | A3/B2 = 80/20 |
| 85 | (65) | z33 (0.05) | II-37 (0.1) | | TP (0.03) | W-3 | A2/B1 = 90/10 |
| 86 | (66) | z33 (0.1) z31 (0.1) | II-47 (0.05) | | DIA (0.01) | W-3 | A4/B1 = 90/10 |

In Tables 6 to 9 above, the compounds used are abbreviately denoted as follows:
TPSTF: Triphenylsulfonium triflate
TPSPFB: Triphenylsulfonium perfluorobutanesulfonate
TPSPFBS: Triphenylsulfonium pentafluorobenzenesulfonate
TPSBTFBS: Triphenylsulfonium 3,5-bistrifluoromethylbenzenesulfonate
BTBPIPFBS: Bis(tert-butylphenyl)iodonium perfluorobutanesulfonate
BCHSDM: Bis (cyclohexylsulfonyl)diazomethane
DBN: 1,5-Diazabicyclo[4.3.0]-5-nonene
TPI: 2,4,5-Triphenylimidazole
HEP: N-hydroxyethylpiperidine
DIA: 2,6-diisopropylaniline
DCMA: dicyclohexylmethylamine
TOA: Trioctylamine
LCB: Lithocolic acid t-butyl ester
W-1: Megafax F176 (manufactured by Dainippon Ink and Chemicals, Inc.) (fluorine-base)
W-2: Megafac R08 (manufactured by Dainippon Ink and Chemicals, Inc.) (fluorine— and silicon-base)
W-3: Polysiloxane Polymer KP-341 (manufactured by Shin-Etsu Chemical Industry Co., Ltd.) (silicon-base)
W-4: Troysol S-366 (manufactured by Troy Chemical Industries Co., Ltd.)
A1: propylene glycol monomethyl ether acetate
A2: 2-heptanone
A3: ethyl ethoxypropionate
A4: γ-butyrolactone
A5: cyclohexanone
B1: propylene glycol monomethyl ether
B2: ethyl lactate Evaluation of Image On a silicon substrate subjected to treatment with hexamethyldisilazane was uniformly coated a anti-reflecting coating (DUV-42 manufactured by Brewer Science, Inc.) at a thickness of 600 angstroms by a spin coater and dried on a hot plate at 100° C. for 90 seconds and further dried by heating at 190° C. for 240 seconds. Then, each of the photosensitive compositions described above was coated thereon by a spin coater and dried at 120° C. for 90 seconds to form a resist layer having a thickness of 0.50 μm. The resist film was subjected to exposure using ArF excimer laser stepper (manufacture by ISI Co., Ltd.; NA=0.6) through a mask and heated on a hot plate at 120° C. for 90 seconds immediately after the exposure. Then the resist film was developed with a 2.38% aqueous tetramethylammonium hydroxide solution at 23° C. for 60 seconds, rinsed with pure water for 30 seconds and dried to form a resist pattern.

The pattern formed on silicon wafer was observed by Critical Dimension scanning electron microscope (CD—SEM) and the resist characteristics, i.e., pitch dependency and exposure margin were evaluated. The results obtained are shown in Tables 10 to 13 below.

Pitch Dependency

A size of pattern formed by exposure of a mask pattern having a mask size of a line (L)/space (S)=1:5 of 0.17 μm in an exposure amount necessary for reproducing a mask pattern having a mask size of a L/S=1:1.5 of 0.17 μm was measured and a difference in the length between the size of pattern formed and 0.17 μm was determined to evaluate the pitch dependency.

Exposure Margin

An optimum exposure amount necessary for reproducing a mask pattern having a mask size of a L/S=1:1 of 0.15 μm was determined, and a range of exposure amount in which a size of pattern formed after development was in a range of 150 nm±10% was determined. A numerical value obtained by dividing the range of exposure amount by the optimum exposure amount was used to evaluate the exposure magin.

TABLE 10

| Example | Pitch Dependency (nm) | Exposure Margin (%) |
| --- | --- | --- |
| 1 | 9 | 14 |
| 2 | 10 | 13 |
| 3 | 10 | 15 |
| 4 | 11 | 14 |
| 5 | 9 | 15 |
| 6 | 11 | 13 |
| 7 | 12 | 16 |
| 8 | 7 | 17 |
| 9 | 11 | 15 |
| 10 | 9 | 15 |
| 11 | 9 | 14 |
| 12 | 10 | 15 |
| 13 | 9 | 15 |
| 14 | 12 | 14 |
| 15 | 8 | 16 |
| 16 | 7 | 17 |
| 17 | 9 | 18 |
| 18 | 8 | 16 |
| 19 | 8 | 18 |
| 20 | 7 | 17 |
| Comparative Example 1 | 25 | 7 |
| Comparative Example 2 | 28 | 6 |
| Comparative Example 3 | 30 | 8 |

TABLE 11

| Example | Pitch Dependency (nm) | Exposure Margin (%) |
| --- | --- | --- |
| 21 | 7 | 18 |
| 22 | 8 | 17 |
| 23 | 11 | 15 |
| 24 | 9 | 17 |
| 25 | 10 | 14 |
| 26 | 6 | 19 |
| 27 | 8 | 17 |
| 28 | 7 | 20 |
| 29 | 5 | 18 |
| 30 | 10 | 13 |
| 31 | 8 | 15 |
| 32 | 11 | 14 |
| 33 | 7 | 18 |
| 34 | 8 | 17 |
| 35 | 7 | 18 |
| 36 | 12 | 15 |
| 37 | 9 | 16 |
| 38 | 10 | 12 |
| 39 | 8 | 19 |
| 40 | 9 | 18 |
| 41 | 6 | 20 |
| 42 | 7 | 19 |
| 43 | 7 | 19 |
| 44 | 8 | 18 |
| 45 | 5 | 19 |

TABLE 12

| Example | Pitch Dependency (nm) | Exposure Margin (%) |
| --- | --- | --- |
| 46 | 9 | 16 |
| 47 | 7 | 15 |

TABLE 12-continued

| Example | Pitch Dependency (nm) | Exposure Margin (%) |
|---|---|---|
| 48 | 6 | 20 |
| 49 | 7 | 18 |
| 50 | 5 | 19 |
| 51 | 7 | 18 |
| 52 | 8 | 19 |
| 53 | 8 | 20 |
| 54 | 7 | 19 |
| 55 | 8 | 18 |
| 56 | 9 | 16 |
| 57 | 11 | 14 |
| 58 | 8 | 16 |
| 59 | 10 | 13 |
| 60 | 7 | 17 |
| 61 | 6 | 17 |
| 62 | 8 | 16 |
| 63 | 8 | 14 |
| 64 | 11 | 15 |
| 65 | 10 | 14 |
| 66 | 9 | 17 |
| 67 | 8 | 18 |
| 68 | 9 | 18 |
| 69 | 9 | 17 |
| 70 | 6 | 19 |

TABLE 13

| Example | Pitch Dependency (nm) | Exposure Margin (%) |
|---|---|---|
| 71 | 9 | 16 |
| 72 | 7 | 17 |
| 73 | 11 | 12 |
| 74 | 8 | 18 |
| 75 | 10 | 16 |
| 76 | 9 | 17 |
| 77 | 9 | 16 |
| 78 | 12 | 14 |
| 79 | 6 | 19 |
| 80 | 7 | 18 |
| 81 | 6 | 18 |
| 82 | 8 | 20 |
| 83 | 8 | 18 |
| 84 | 10 | 15 |
| 85 | 9 | 18 |
| 86 | 8 | 17 |

It can be seen from the results shown in Tables 10 to 13 that the positive photosensitive composition of Examples 1 to 86 according to the present invention exhibits the excellent pitch dependency and development margin.

The positive photosensitive composition according to the present invention is excellent in both the pitch dependency and the development margin.

While the invention has been described in detail and with reference to specific embodiments thereof, it will be Ad apparent to one skilled in the art that various changes and modifications can be made therein without departing from the spirit and scope thereof.

What is claimed is:

1. A positive photosensitive composition comprising:

(A) a compound generating an acid upon irradiation with one of an actinic ray and radiation;

(B) a resin containing a monocyclic or polycyclic alicyclic hydrocarbon structure and increasing the solubility to an alkali developer by the action of an acid; and (C) an onium salt of carboxylic acid.

2. The positive photosensitive composition as claimed in claim 1, which further comprises (D) a dissolution-inhibiting compound: having a molecular weight of 3,000 or less; having a group capable of being decomposed by an acid; and increasing the solubility to an alkali developer by the action of an acid.

3. The positive photosensitive composition as claimed in claim 1, wherein the resin (B) further contains a lactone structure.

4. The positive photosensitive composition as claimed in claim 1, wherein the resin (B) further contains a repeating unit represented by formula (IV'):

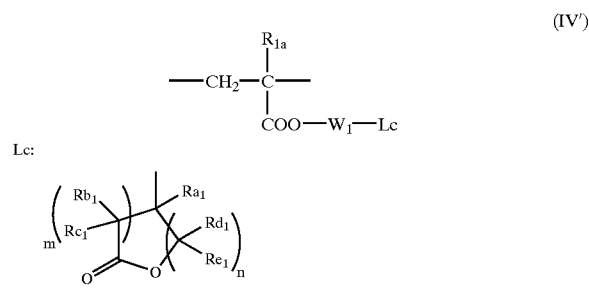

wherein $R_{1a}$ represents a hydrogen atom or a methyl group; $W_1$ represents a single bond, an alkylene group, an ether group, a thioether group, a carbonyl group, an ester group or a combination thereof; $R_{a1}$, $R_{b1}$, $R_{c1}$, $R_{d1}$ and $R_{e1}$, which are the same or different, each represents a hydrogen atom or an alkyl group having from 1 to 4 carbon atoms; and m and n, which are the same or different, each represents an integer of from 0 to 3, provided that the sum total of m and n is from 2 to 6.

5. The positive photosensitive composition as claimed in claim 1, wherein the resin (B) further contains a repeating unit having a group represented by one of formulae (V-1) to (V-4):

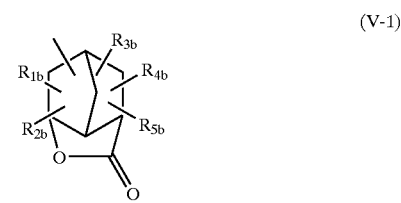

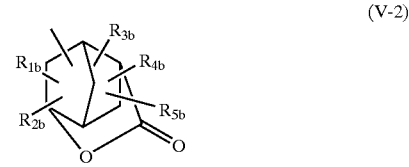

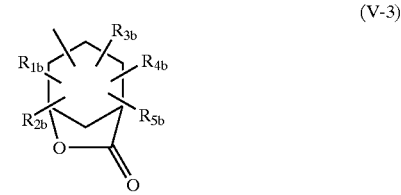

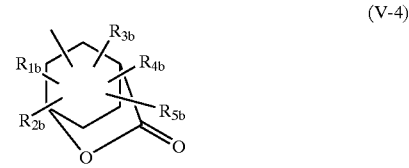

wherein $R_{1b}$ to $R_{5b}$ each independently represents a hydrogen atom, an alkyl group which may have a substituent, a cycloalkyl group which may have a substituent or an alkenyl group which may have a substituent, and two of $R_{1b}$ to $R_{5b}$ may be combined with each other to form a ring.

6. The positive photosensitive composition as claimed in claim 5, wherein the resin (B) contains the repeating unit having a group represented by one of formulae (V-1) to (V-4) in an amount of from 10 to 70 mol % based on the whole repeating units.

7. The positive photosensitive composition as claimed in claim 5, wherein the resin (B) contains the repeating unit having a group represented by one of formulae (V-1) to (V-4) in an amount of from 30 to 60 mol % based on the whole repeating units.

8. The positive photosensitive composition as claimed in claim 1, wherein the resin (B) further contains a repeating unit having a group represented by formula (VII):

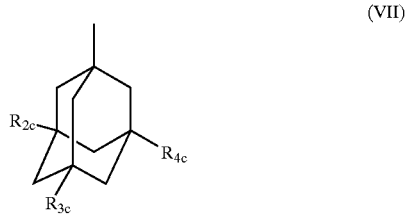

(VII)

wherein $R_{2c}$ to $R_{4c}$ each independently represents a hydrogen atom or a hydroxy group, and at least one of $R_{2c}$ to $R_{4c}$ represents a hydroxy group.

9. The positive photosensitive composition as claimed in claim 8, wherein the resin (B) contains the repeating unit having a group represented by formula (VII) in an amount of from 5 to 35 mol % based on the whole repeating units.

10. The positive photosensitive composition as claimed in claim 8, wherein the resin (B) contains the repeating unit having a group represented by formula (VII) in an amount of from 5 to 30 mol % based on the whole repeating units.

11. The positive photosensitive composition as claimed in claim 1, wherein the onium salt of carboxylic acid (C) is at least one of a sulfonium salt of carboxylic acid and an lodonium salt of carboxylic acid.

12. The positive photosensitive composition as claimed in claim 1, wherein a carboxylate residue of the onium salt of carboxylic acid (C) contains neither an aromatic group nor a C=C double bond.

13. The positive photosensitive composition as claimed in claim 1, wherein a carboxylate residue of the onium salt of carboxylic acid (C) is a straight-chain, branched or cyclic alkylcarboxylic acid anion which is substituted by at least one fluorine atom.

14. The positive photosensitive composition as claimed in claim 1, which is for exposure using a deep ultraviolet ray having a wavelength of 220 nm or less.

15. The positive photosensitive composition as claimed in claim 1, which further comprises (F) a nitrogen-containing basic compound.

16. The positive photosensitive composition as claimed in claim 1, which further comprises (G) a surfactant containing at least one of a fluorine atom and silicon atom.

17. The positive photosensitive composition as claimed as claim 1, which comprises the onium salt of carboxylic acid (C) in amount of from 0.1 to 20% by weight based on the solid content of the composition.

18. A positive photosensitive composition comprising:

(A) a compound generating an acid upon irradiation with one of an actinic ray and radiation;

(C) an onium salt of carboxylic acid;

(D) a dissolution-inhibiting compound: having a molecular weight of 3,000 or less; having a group capable of being decomposed by an acid; and increasing the solubility to an alkali developer by the action of an acid; and (E) a resin being insoluble in water but soluble in an alkali developer and containing a monocyclic or polycyclic alicyclic hydrocarbon structure.

19. The positive photosensitive composition as claimed in claim 18, wherein the onium salt of carboxylic acid (C) is at least one of a sulfonium salt of carboxylic acid and an iodonium salt of carboxylic acid.

20. The positive photosensitive composition as claimed in claim 18, wherein a carboxylate residue of the onium salt of carboxylic acid (C) contains neither an aromatic group nor a C=C double bond.

* * * * *